US012765045B2

(12) United States Patent
Osawa

(10) Patent No.: US 12,765,045 B2
(45) Date of Patent: Oct. 13, 2026

(54) SEMICONDUCTOR DEVICE INCLUDING TEMPERATURE SENSING DIODE

(71) Applicant: ROHM CO., LTD., Kyoto (JP)

(72) Inventor: Takayuki Osawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 408 days.

(21) Appl. No.: 18/465,997

(22) Filed: Sep. 13, 2023

(65) Prior Publication Data

US 2023/0420454 A1 Dec. 28, 2023

Related U.S. Application Data

(63) Continuation of application No. PCT/JP2022/011083, filed on Mar. 11, 2022.

(30) Foreign Application Priority Data

Mar. 17, 2021 (JP) ................................ 2021-043962

(51) Int. Cl.
*H10D 84/00* (2025.01)
*H10D 8/00* (2025.01)
(Continued)

(52) U.S. Cl.
CPC ........... *H10D 84/617* (2025.01); *H10D 8/411* (2025.01); *H10D 12/441* (2025.01); *H10D 62/124* (2025.01); *H10D 84/143* (2025.01)

(58) Field of Classification Search
CPC .. H10D 84/143; H10D 84/811; H10D 62/124; H10D 62/125; H10D 62/126; H10D 62/127; H10D 8/00
See application file for complete search history.

(56) References Cited

U.S. PATENT DOCUMENTS

2012/0248988 A1* 10/2012 Kmetec .................. H05B 45/22 315/149
2016/0241018 A1 8/2016 Nakano
(Continued)

FOREIGN PATENT DOCUMENTS

DE 102014222214 A1 5/2016
DE 112019002769 T5 2/2021
(Continued)

OTHER PUBLICATIONS

International Search Report and Written Opinion mailed on Jun. 7, 2022, received for PCT Application PCT/JP2022/011083, filed on Mar. 11, 2022, 15 pages including English Translation.
(Continued)

*Primary Examiner* — Reema Patel
(74) *Attorney, Agent, or Firm* — XSENSUS LLP

(57) ABSTRACT

This semiconductor device is provided with: a semiconductor layer; an insulating film which is formed on the surface of the semiconductor layer; a main cell region which comprises a main cell, while being provided in the semiconductor layer; and a temperature-sensing diode for sensing the temperature, the diode being provided in a region other than the main cell region. The temperature-sensing diode comprises a diode cell which is composed of: a first semiconductor region of a first conductivity type; and a second semiconductor region of a second conductivity type. The second semiconductor region is formed into a ring shape so as to surround the first semiconductor region. The inner lateral surface of the second semiconductor region is joined with the first semiconductor region.

20 Claims, 25 Drawing Sheets

(51) Int. Cl.

| | |
|---|---|
| ***H10D 12/00*** | (2025.01) |
| ***H10D 62/10*** | (2025.01) |
| ***H10D 84/60*** | (2025.01) |

(56) References Cited

U.S. PATENT DOCUMENTS

| | | | |
|---|---|---|---|
| 2019/0123044 | A1 | 4/2019 | Nakano |
| 2021/0210485 | A1 | 7/2021 | Umeki |
| 2022/0130821 | A1 | 4/2022 | Nakano |
| 2022/0231011 | A1 | 7/2022 | Takaoka |
| 2023/0025858 | A1 | 1/2023 | Nakano |
| 2023/0335548 | A1 | 10/2023 | Umeki |
| 2024/0379662 | A1 | 11/2024 | Umeki |

FOREIGN PATENT DOCUMENTS

| | | | | | |
|---|---|---|---|---|---|
| JP | 2016-149502 | A | | 8/2016 | |
| JP | 2017-103272 | A | | 6/2017 | |
| JP | 2017-535079 | A | | 11/2017 | |
| WO | WO-2016066329 | A1 | * | 5/2016 | ........... H10D 89/611 |
| WO | 2019/230851 | A1 | | 12/2019 | |
| WO | 2020255617 | A1 | | 12/2020 | |

OTHER PUBLICATIONS

Office Action dated Mar. 6, 2025 in corresponding German patent application No. 11 2022 000 962.4 (16 pages; with English machine translation).

Office Action dated July 1 0, 2025 in corresponding German patent application No. 112022000962.4 (10 pages; with English machine translation).

Office Action mailed Feb. 3, 2026, issued in corresponding Japanese Patent Application No. 2023-507071 (12 pages; with English translation).

* cited by examiner

SEMICONDUCTOR DEVICE INCLUDING TEMPERATURE SENSING DIODE

CROSS-REFERENCE TO RELATED APPLICATIONS

This application is a continuation of International Application No. PCT/JP2022/011083, filed Mar. 11, 2022, which claims priority to JP 2021-043962, filed Mar. 17, 2021, the entire contents of each are incorporated herein by reference.

BACKGROUND

The present disclosure relates to a semiconductor device.

An example of a switching element is an insulated gate bipolar transistor (IGBT) used in an in-vehicle inverter. Such a switching element switches between the supply of current and the interruption of the supply at a high speed and thus tends to generate heat. In this regard, a temperature sensing diode configured to detect the temperature of the switching element may be mounted on the switching element so that the temperature of the switching element is maintained within an operation ensured range (for example, refer to JP 2017-103272 A).

DETAILED DESCRIPTION

Embodiments of a semiconductor device will be described below with reference to the drawings. The embodiments described below exemplify configurations and methods for embodying a technical concept and are not intended to limit the material, shape, structure, layout, dimensions, and the like of each component to those described below.

First Embodiment

A first embodiment of a semiconductor device 10 will now be described with reference to FIGS. 1 to 11.

Figure 1:
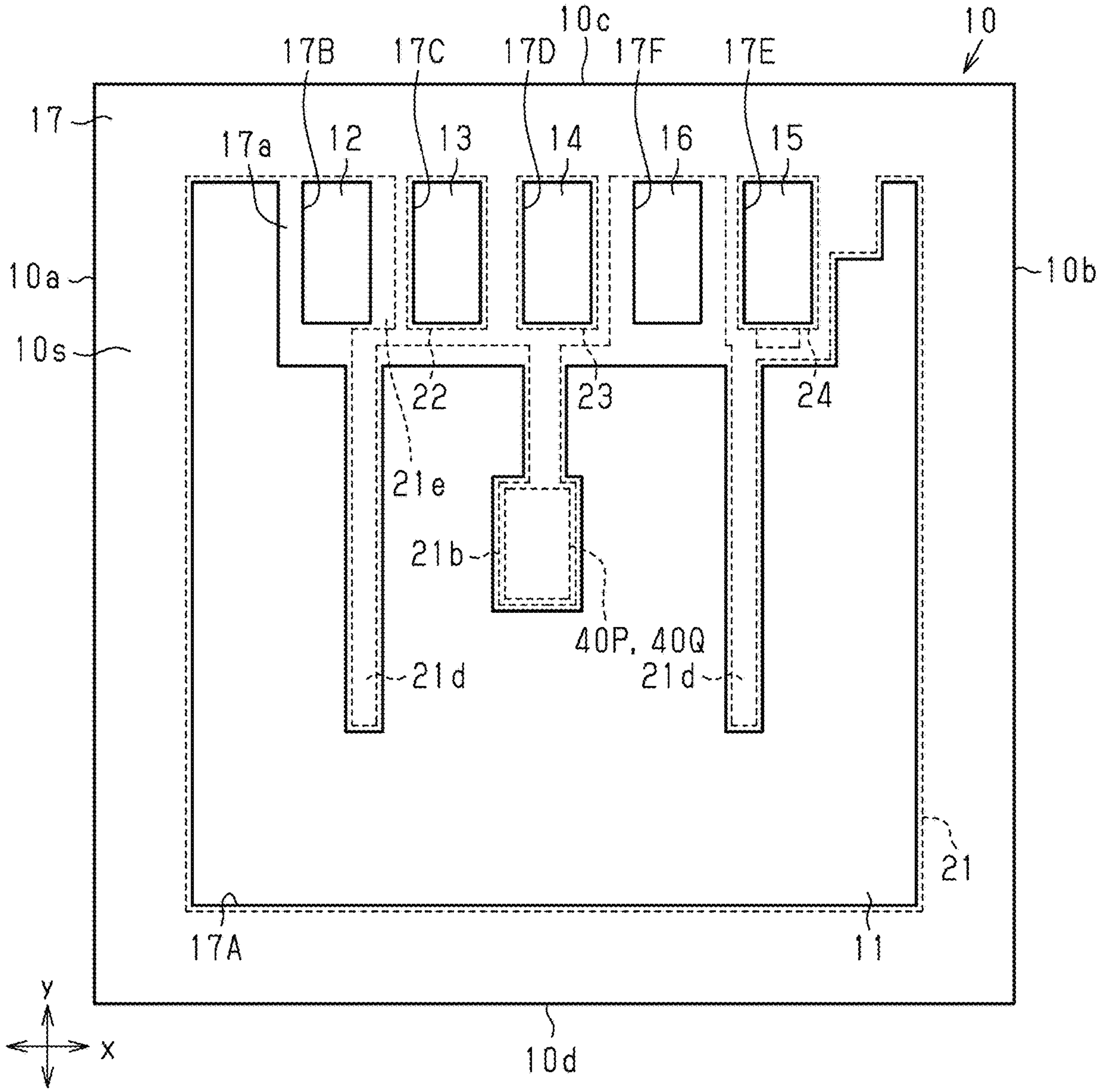
FIG. 1 is a plan view showing a first embodiment of a semiconductor device.

As shown in FIG. 1, the semiconductor device 10 is a trench gate insulated gate bipolar transistor (IGBT) that includes a temperature sensing diode 40P configured to detect the temperature of the semiconductor device 10. In an example, the semiconductor device 10 is used as a switching element mounted on an in-vehicle inverter. In this case, the semiconductor device 10 receives a current of, for example, greater than or equal to 5 A and less than or equal to 1000 A.

The semiconductor device 10 is, for example, rectangular and flat. The semiconductor device 10 includes a device main surface 10*s*, a device back surface 10*r* opposite to the device main surface 10*s* (refer to FIG. 5), and four device side surfaces 10*a* to 10*d* formed between the device main surface 10*s* and the device back surface 10*r*. In an example, the device side surfaces 10*a* to 10*d* join the device main surface 10*s* and the device back surface 10*r* and are orthogonal to both the device main surface 10*s* and the device back surface 10*r*. In an example, the device main surface 10*s* is square. In the present embodiment, each side of the device main surface 10*s* has a length of approximately 11 mm. That is, in the present embodiment, the chip size of the semiconductor device 10 is 11 mm by 11 mm.

In the following description, a direction in which the device main surface 10*s* and the device back surface 10*r* face is referred to as a "z-direction". The z-direction may also be referred to as a height-wise direction of the semiconductor device 10. Two directions that are orthogonal to each other and orthogonal to the z-direction are referred to as an x-direction and a y-direction. In the present embodiment, the device side surfaces 10*a* and 10*b* define opposite end surfaces of the semiconductor device 10 in the x-direction. The device side surfaces 10*c* and 10*d* define opposite end surfaces of the semiconductor device 10 in the y-direction.

Figure 2:
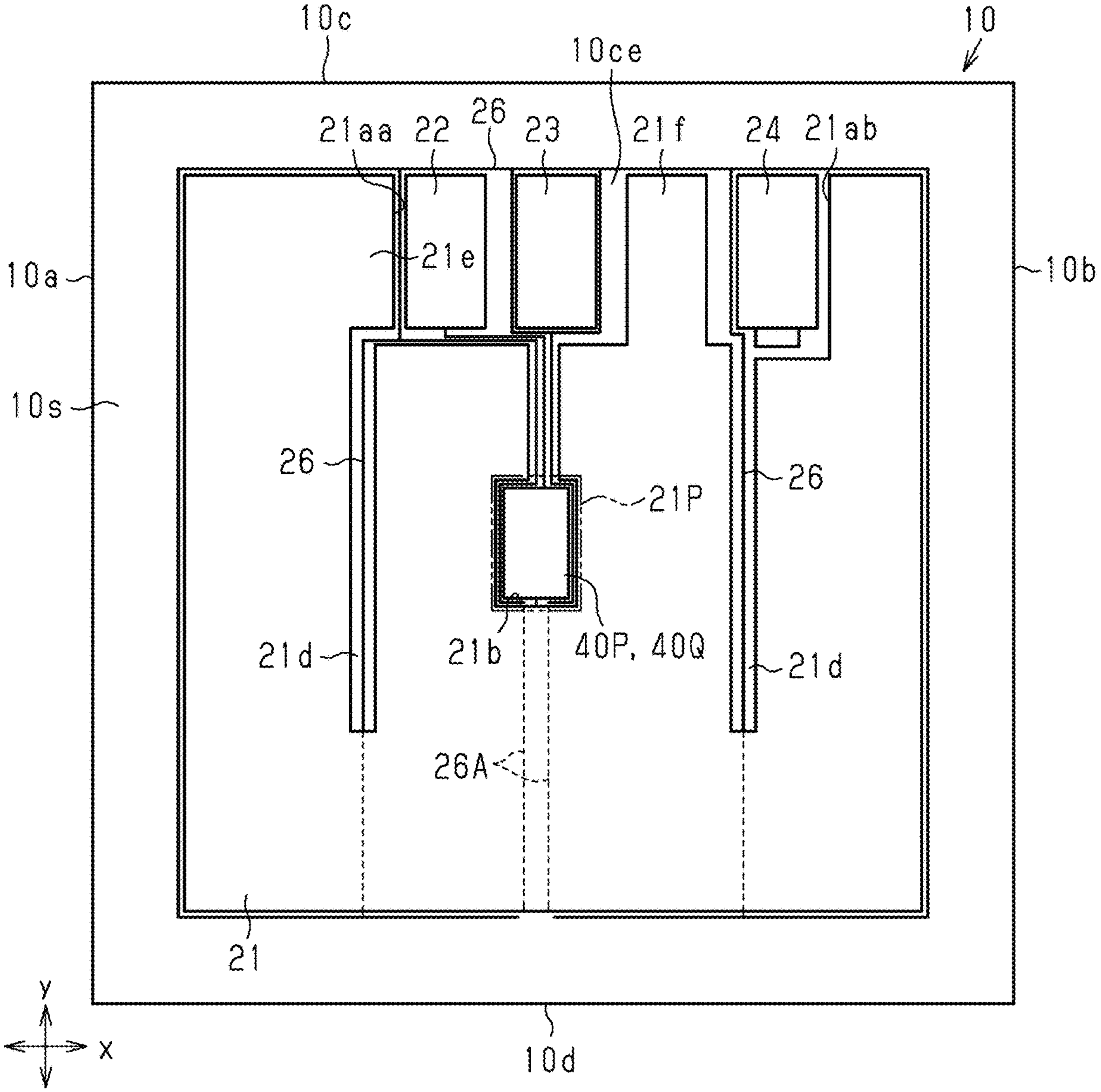
FIG. 2 is a plan view of the semiconductor device shown in FIG. 1 with a protective insulation film removed.

FIG. 2 shows an electrode configuration of the semiconductor device 10.

As shown in FIG. 2, the semiconductor device 10 includes an emitter electrode 21, an anode electrode 22, a gate electrode 23, and a current sensing electrode 24. The emitter electrode 21 corresponds to a "main electrode portion". The anode electrode 22 corresponds to a "diode connection electrode".

Figure 7:
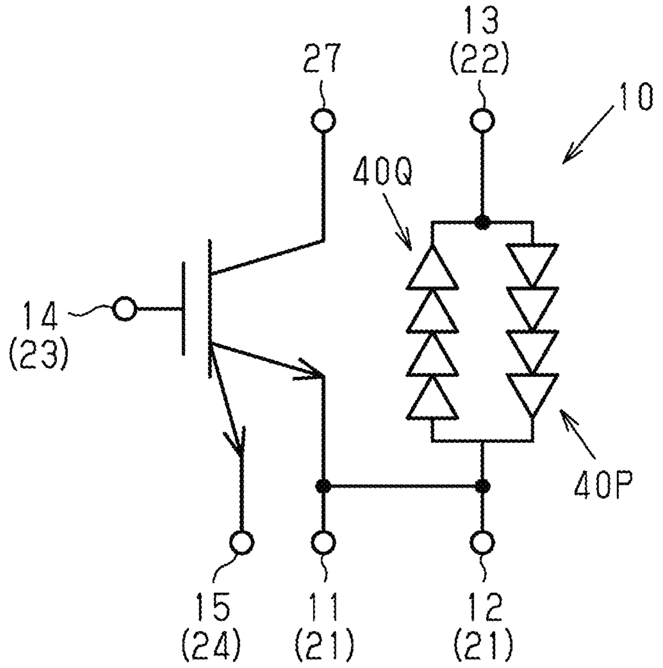
FIG. 7 is a schematic circuit diagram of the semiconductor device in the first embodiment.

The semiconductor device 10 further includes a gate finger 26 electrically connected to the gate electrode 23. When current is supplied to the gate electrode 23, the gate finger 26 is configured to quickly supply the current also to the main cell located in a portion of the emitter electrode 21 distant from the gate electrode 23. As shown in FIGS. 5 and 7, the semiconductor device 10 includes a collector electrode 27. In the present embodiment, the collector electrode 27 is formed on the entire device back surface 10*r*. For the sake of convenience, the gate finger 26 is not shown in FIGS. 1, 3, and 4.

As viewed in the z-direction, the emitter electrode 21 is formed on a large portion of the device main surface 10*s*. The anode electrode 22, the gate electrode 23, and the current sensing electrode 24 are disposed in an electrode mount region 10*ce* disposed closer to the device side surface 10*c*, which is located at one of the opposite ends of the device main surface 10*s* in the y-direction. The electrodes 22 to 24 are aligned with each other in the y-direction and spaced apart from each other in the x-direction.

The emitter electrode 21 includes electrode receptacles 21*aa* and 21*ab*, a diode mount 21*b*, and two gate finger receptacles 21*d*.

The electrode receptacles 21*aa* and 21*ab* are disposed at one of the opposite ends of the emitter electrode 21 in the y-direction located closer to the device side surface 10*c*. The electrode receptacle 21*aa* is recessed and accommodates the anode electrode 22 and the gate electrode 23. The electrode receptacle 21*ab* is recessed to accommodate the current sensing electrode 24. The electrode receptacle 21*aa* is disposed closer to the device side surface 10*a* than the electrode receptacle 21*ab* is in the x-direction.

The anode electrode 22, the gate electrode 23, and the current sensing electrode 24, which are accommodated in the electrode receptacles 21*aa* and 21*ab*, are aligned with each other in the y-direction and spaced apart from each other in the x-direction. In the present embodiment, the anode electrode 22, the gate electrode 23, and the current sensing electrode 24 are arranged in this order from the device side surface 10*a* toward the device side surface 10*b* in the x-direction.

The emitter electrode 21 includes a projection 21*e* projecting toward the anode electrode 22 from a portion of the recess defining the electrode receptacle 21*aa* located closer to the device side surface 10*a*, in other words, a portion of the emitter electrode 21 adjacent to the anode electrode 22 in the x-direction.

The portion of the emitter electrode 21 between the electrode receptacle 21*aa* and the electrode receptacle 21*ab* in the x-direction defines an emitter sense region 21*f* including an emitter sensing electrode pad 16, which will be described later. The emitter sense region 21*f* includes a part of the electrode receptacle 21*aa* and a part of the electrode receptacle 21*ab*.

The diode mount 21*b* includes a portion where the temperature sensing diode 40P is mounted, and is connected to the electrode receptacle 21*aa*. The portion of the diode mount 21*b* where the temperature sensing diode 40P is mounted is located substantially at the center of the emitter electrode 21 in the x-direction and the y-direction. Thus, the temperature sensing diode 40P is disposed substantially at the center of the emitter electrode 21 in the x-direction and the y-direction. In other words, as shown in FIG. 2, the temperature sensing diode 40P is disposed substantially at the center of the device main surface 10*s* in the x-direction and the y-direction.

The emitter electrode 21 is not formed on the diode mount 21*b*. The portion of the diode mount 21*b* where the temperature sensing diode 40P is mounted is rectangular as viewed in the z-direction. The emitter electrode 21 is formed to surround the temperature sensing diode 40P to define the diode mount 21*b*. Thus, the emitter electrode 21 includes an adjacent region 21P (the region of the emitter electrode 21 surrounded by double-dashed line in FIG. 2) located adjacent to the temperature sensing diode 40P. The adjacent region 21P is a region around the diode mount 21*b*. In the present embodiment, the adjacent region 21P is formed to surround the entire surface of the temperature sensing diode 40P at the device side surfaces 10*a*, 10*b*, and 10*d* and a part of the temperature sensing diode 40P at the device side surface 10*c*. In other words, the adjacent region 21P includes a portion located adjacent to the entire surface of the temperature sensing diode 40P at the device side surfaces 10*a*, 10*b*, 10*d* and a part of the temperature sensing diode 40P at the device side surface 10*c*.

The diode mount 21*b* extends in the y-direction from a portion of the diode mount 21*b* where the temperature sensing diode 40P is mounted to the electrode receptacle 21*aa* and thus is connected to the electrode receptacle 21*aa*.

The two gate finger receptacles 21*d* are separately disposed at opposite sides of the diode mount 21*b* in the x-direction. One of the gate finger receptacles 21*d* extends from the electrode receptacle 21*aa* in the y-direction. The other gate finger receptacle 21*d* extends from the electrode receptacle 21*ab* in the y-direction. The gate finger 26 is partially disposed in each of the gate finger receptacles 21*d*.

The gate finger receptacles 21*d* respectively extend from the electrode receptacles 21*aa* and 21*ab* of the emitter electrode 21 in the y-direction. Each of the gate finger receptacles 21*d* includes a distal end disposed closer to the electrode receptacles 21*aa* and 21*ab* than one of the opposite ends of the emitter electrode 21 in the y-direction located closer to the device side surface 10*d*.

The gate finger 26 surrounds the emitter electrode 21 and extends into the two gate finger receptacles 21*d* and the diode mount 21*b*. The gate finger 26 located in the diode mount 21*b* surrounds the temperature sensing diode 40P and the protection diode 40Q. The gate finger 26 includes an outer interconnect and an inner interconnect connected to the outer interconnect. The outer interconnect includes, for example, a metal material. The inner interconnect includes, for example, polysilicon. The outer interconnect is formed from a material containing, for example, AlCu (an alloy of aluminum and copper) and is located at the same position as the emitter electrode 21 and the electrodes 22 to 24 in the z-direction. The inner interconnect is disposed closer to the device back surface 10*r* than the outer interconnect in the z-direction.

A gate finger 26A is disposed on a location surrounded by the diode mount 21*b*, each of the two gate finger receptacles 21*d*, and one of the opposite ends of the emitter electrode 21 in the y-direction located closer to the device side surface 10*d*. Each gate finger 26A includes an inner interconnect connected to the inner interconnect of the gate finger 26. However, the gate finger 26A does not include an outer interconnect. Thus, the gate finger 26A is located closer to the device back surface 10*r* than the emitter electrode 21 at a position where the gate finger 26A overlaps the emitter electrode 21 as viewed in the z-direction.

As shown in FIG. 1, a protective insulation film 17 is disposed on the device main surface 10*s* to cover the electrodes 21 to 24. The protective insulation film 17 is an organic protective film that protects the semiconductor device 10 and is formed from a material including, for example, polyimide (PI).

The protective insulation film 17 includes first to sixth openings 17A to 17F exposing the electrodes 21 to 24, respectively. The electrodes 21 to 24 exposed by the first to sixth openings 17A to 17F include pads configured to be bonded to a conductive member from the outside of the semiconductor device 10. Such pads include an emitter electrode pad 11, a cathode electrode pad 12, an anode electrode pad 13, a gate electrode pad 14, a current sensing electrode pad 15, and an emitter sensing electrode pad 16.

As viewed in the z-direction, the first to sixth openings 17A to 17F are separated from each other in the protective insulation film 17.

The emitter electrode pad 11 is a portion of the emitter electrode 21 exposed from the first opening 17A and includes the emitter of the IGBT. As shown in FIG. 1, the first opening 17A is open to a large portion of the emitter electrode 21. The first opening 17A is open to a portion of the emitter electrode 21 located closer to the device side surface 10*d* than the electrode receptacles 21*aa* and 21*ab*. More specifically, the protective insulation film 17 is disposed at a position overlapping the two gate finger receptacles 21*d*, the diode mount 21*b*, and a position overlapping the gate fingers 26A as viewed in the z-direction.

Figure 4:
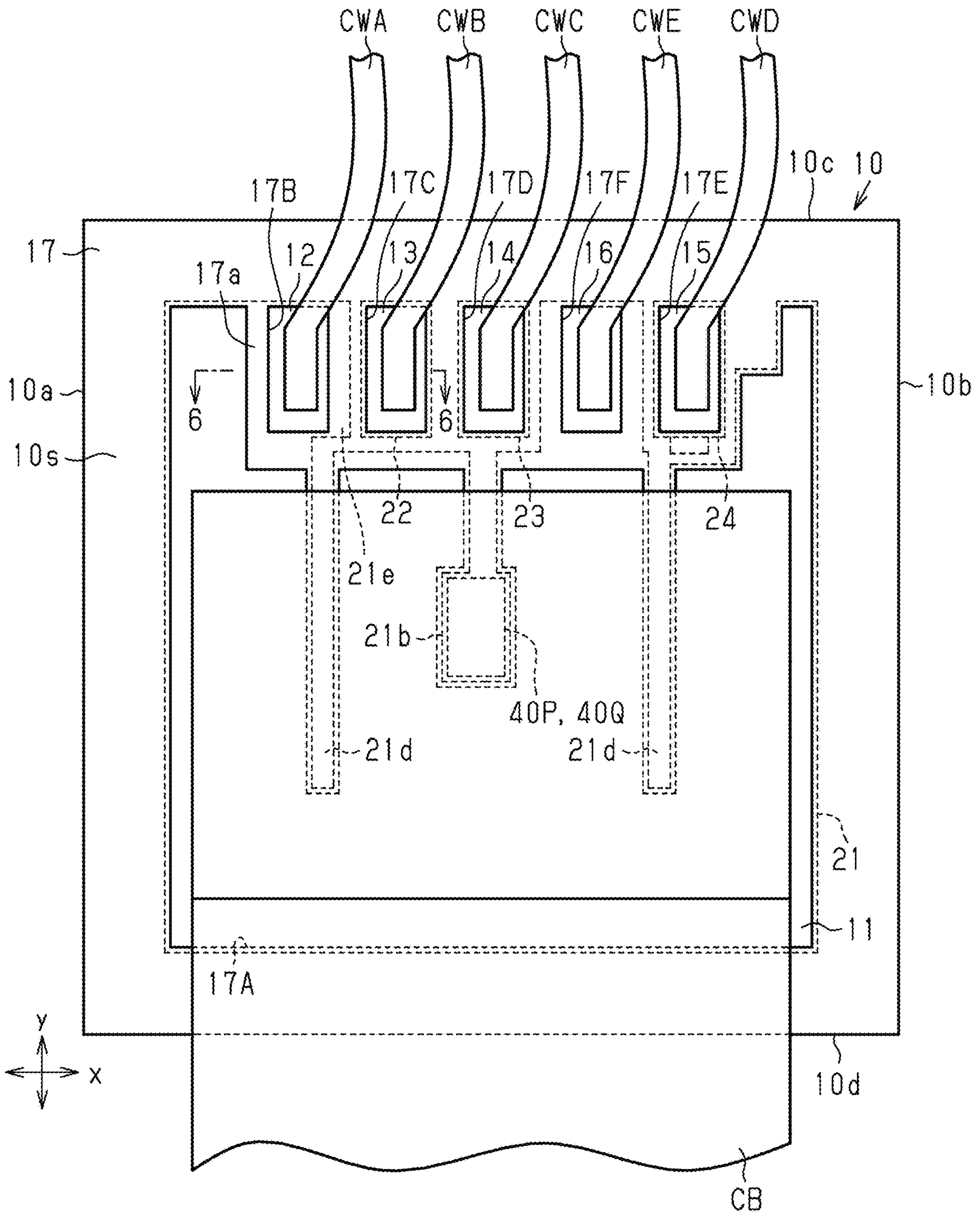
FIG. 4 is a plan view of the semiconductor device shown in FIG. 1 to which conductive members are bonded.
Figure 5:
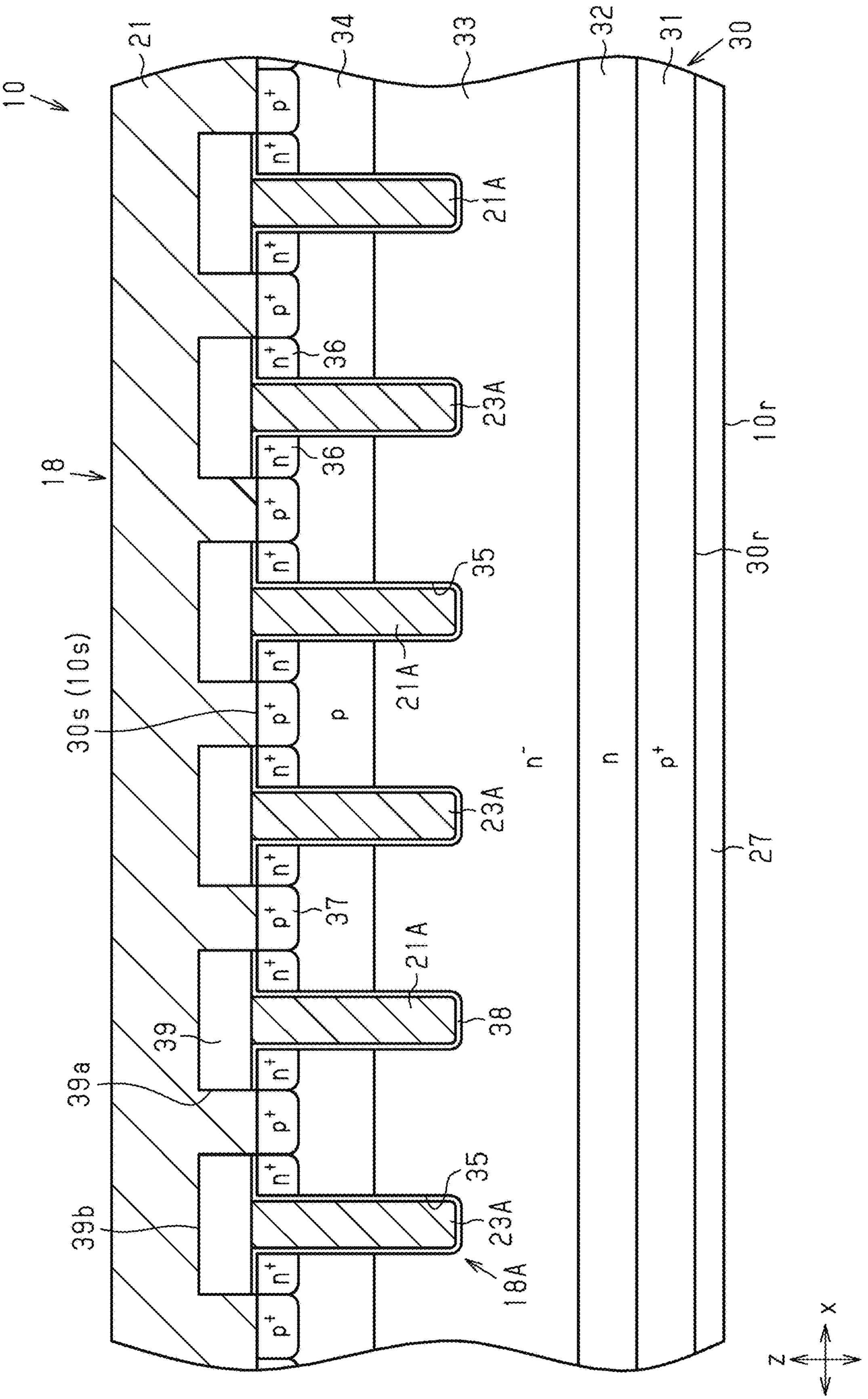
FIG. 5 is a schematic cross-sectional view showing a partial cross-sectional structure of the main cell region.

As shown in FIG. 4, a first conductive member CB is bonded to the emitter electrode pad 11 by a conductive bonding material such as solder. The first conductive member CB is, for example, a clip. A flat metal plate is pressed to form the first conductive member CB. The metal material forming the first conductive member CB is, for example, copper (Cu) or aluminum (Al). Thus, in the present embodiment, the emitter electrode pad 11 corresponds to a “first bonding region”. The first bonding region includes a large portion of the emitter electrode 21 and is a portion of the emitter electrode 21 located closer to the device side surface 10*d* than the electrode receptacles 21*aa* and 21*ab*. The emitter electrode pad 11 includes the diode mount 21*b*. In other words, the first bonding region used as the emitter electrode pad 11 includes the adjacent region 21P.

As shown in FIG. 1, the cathode electrode pad 12 is a portion of the emitter electrode 21 exposed from the second opening 17B and includes the cathode of the temperature sensing diode 40P. As shown in FIG. 2, the second opening 17B is open to an end of the emitter electrode 21 located toward the device side surface 10*a* and the device side surface 10*c*. The second opening 17B is open to a portion of the projection 21*e* of the emitter electrode 21. In other words, the second opening 17B is open to a portion of the emitter electrode 21 spaced apart from and adjacent to the anode electrode 22 in the x-direction. The second opening 17B is separated from and adjacent to the first opening 17A in the y-direction. That is, the cathode electrode pad 12 is spaced apart from and adjacent to the emitter electrode pad 11 in the y-direction.

The cathode electrode pad 12 is disposed closer to the device side surface 10*c* than the center of the device main surface 10*s* in the y-direction. The cathode electrode pad 12 is adjacent to the anode electrode 22 in the x-direction. The cathode electrode pad 12 and the anode electrode 22 are arranged next to each other along the device side surface 10*c* as viewed in the z-direction.

As shown in FIG. 4, the second conductive member CWA is bonded to the cathode electrode pad 12. The second conductive member CWA is, for example, a bonding wire formed by a wire bonding machine. The second conductive member CWA is formed from, for example, Al, Cu, gold (Au), or the like. Thus, in the present embodiment, the cathode electrode pad 12 corresponds to a “second bonding region”. Since the cathode electrode pad 12 and the emitter electrode pad 11 are disposed in different regions, the second bonding region and the first bonding region are disposed in different regions. Thus, the emitter electrode 21 includes both the first bonding region and the second bonding region.

As shown in FIG. 1, since the first opening 17A and the second opening 17B of the protective insulation film 17 are separated from each other, the protective insulation film 17 is present between the first opening 17A and the second opening 17B. In other words, the protective insulation film 17 includes a partition region 17*a* that separates the first opening 17A from the second opening 17B. In the present embodiment, the partition region 17*a* includes a first wall that separates the first opening 17A and the second opening 17B in the x-direction and a second wall that separates the first opening 17A and the second opening 17B in the y-direction. Also, since the third openings 17C to 17F are separated from the first opening 17A, the protective insulation film 17 is present between each of the third openings 17C to 17F and the first opening 17A.

In the semiconductor device 10 having the above structure, as shown in FIG. 7, when the first conductive member CB is bonded to the emitter electrode pad 11 and the second conductive member CWA is bonded to the cathode electrode pad 12, the partition region 17*a* limits entrance of a conductive bonding material that bonds the first conductive member CB to the emitter electrode pad 11 such as solder into the cathode electrode pad 12. In the same manner, entrance of the conductive bonding material into the anode electrode pad 13, the gate electrode pad 14, the current sensing electrode pad 15, and the emitter sensing electrode pad 16 is limited.

As shown in FIG. 1, the anode electrode pad 13 is a portion of the anode electrode 22 exposed from the third opening 17C and includes the anode of the temperature sensing diode 40P. The third opening 17C is rectangular and is slightly smaller than the anode electrode 22 as viewed in the z-direction. The third conductive member CWB is bonded to the anode electrode pad 13.

The gate electrode pad 14 is a portion of the gate electrode 23 exposed from the fourth opening 17D and includes the gate of the IGBT. The fourth opening 17D is rectangular and is slightly smaller than the gate electrode 23 as viewed in the z-direction. A fourth conductive member CWC is bonded to the gate electrode pad 14.

The current sensing electrode pad 15 is a portion of the current sensing electrode 24 exposed from the fifth opening 17E and includes a terminal for outputting information used to detect the current flowing through the IGBT. The fifth opening 17E is rectangular and is slightly smaller than the current sensing electrode 24 as viewed in the z-direction. A fifth conductive member CWD is bonded to the current sensing electrode pad 15.

The emitter sensing electrode pad 16 is a portion of the emitter electrode 21 exposed from the sixth opening 17F. The sixth opening 17F is rectangular and is slightly smaller than the emitter sense region 21*f* as viewed in the z-direction. A sixth conductive member CWE is bonded to the emitter sensing electrode pad 16.

The third to sixth conductive members CWB, CWC, CWD, and CWE are formed from the same material as that of the second conductive member CWA and are, for example, bonding wires formed by a wire bonding machine.

The gate finger 26 extends from the gate electrode 23 toward the device side surface 10*a* and the device side surface 10*d*. A portion of the gate finger 26 extends from the gate electrode 23 through a position closer to the device side surface 10*c* than the anode electrode 22 and then in the y-direction toward the gate finger receptacle 21*d*. Another portion of the gate finger 26 extends from the gate electrode 23 toward the device side surface 10*b* and the device side surface 10*d*. More specifically, the portion of the gate finger 26 extends from the gate electrode 23 through a position closer to the device side surface 10*c* than the emitter sense region 21*f* and then in the y-direction toward the gate finger receptacle 21*d*.

Figure 3:
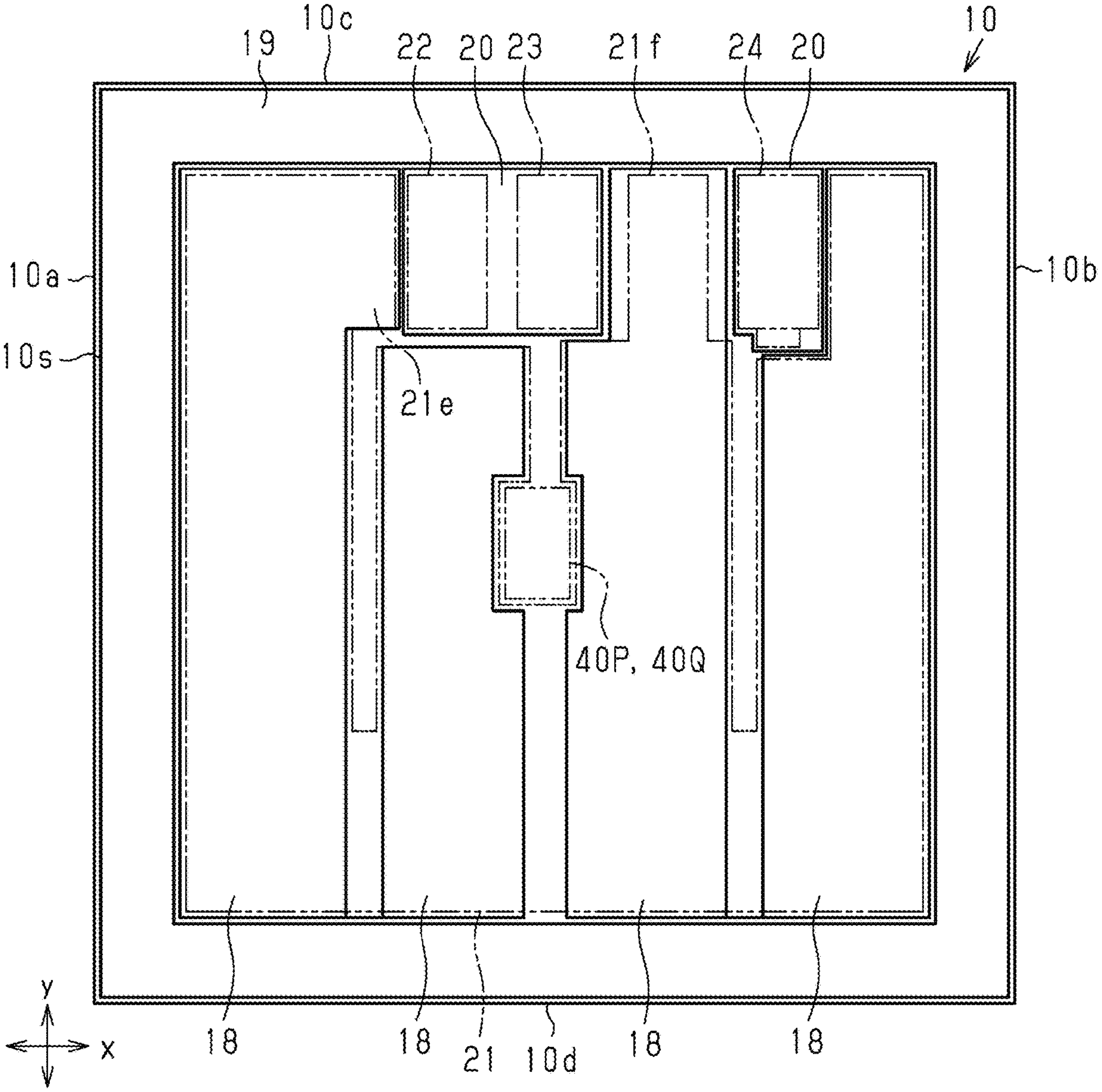
FIG. 3 is a schematic plan view showing a main cell region, a peripheral region, and an intermediate region of the semiconductor device shown in FIG. 2.

As shown in FIG. 3, as viewed in the z-direction, the semiconductor device 10 includes a main cell region 18 in which the main cell 18A (refer to FIG. 6) is formed, a peripheral region 19 surrounding the main cell region 18, and an intermediate region 20 surrounded by the main cell region 18 and the peripheral region 19.

The main cell region 18 is formed on a large portion of the device main surface 10*s*. In the present embodiment, the main cell region 18 is formed in a region overlapping the emitter electrode 21 as viewed in the z-direction. In other words, the main cell region 18 is formed in a region overlapping with the emitter electrode pad 11 and the cathode electrode pad 12 (refer to FIG. 1). However, the main cell region 18 is excluded from a region overlapping with the emitter electrode 21 and the gate fingers 26A (refer to FIG. 2) in the z-direction. That is, the main cell region 18 is divided into four regions by the gate fingers 26A. The four main cell regions 18 are separated from each other in the x-direction. Of the four main cell regions 18, the main cell region 18 located closer to the device side surface 10*a* includes a region that overlaps with the emitter electrode pad 11 and the cathode electrode pad 12.

The peripheral region 19 includes a termination structure that improves the dielectric strength of the semiconductor device 10. An example of the termination structure includes a guard ring surrounding the main cell region 18. The main cell 18A (refer to FIG. 5) is excluded from the peripheral region 19.

The intermediate region 20 overlaps the anode electrode 22, the gate electrode 23, and the current sensing electrode 24 as viewed in the z-direction. The intermediate region 20 is located outside the main cell region 18. In other words, the main cell 18A is not formed in the intermediate region 20.

FIG. 5 is a diagram showing an example of a cross-sectional structure of the semiconductor device 10 in the main cell region 18.

As shown in FIG. 5, the semiconductor device 10 includes a semiconductor substrate 30. The semiconductor substrate 30 is formed from, for example, a material containing $n^-$ type silicon (Si). The semiconductor substrate 30 has a thickness that is, for example, greater than or equal to 50 μm and less than or equal to 200 μm.

The semiconductor substrate 30 includes a substrate front surface 30*s* and a substrate back surface 30*r* that face opposite directions in the z-direction. Thus, the z-direction is also referred to as the thickness-wise direction of the semiconductor substrate 30. In the present embodiment, the semiconductor substrate 30 corresponds to a "semiconductor layer". The z-direction corresponds to the thickness-wise direction of the semiconductor layer. Hence, "viewed in the z-direction" has the same meaning as "viewed in the thickness-wise direction of the semiconductor layer".

The semiconductor substrate 30 has a structure in which a $p^+$ type collector layer 31, an n type buffer layer 32, and an $n^-$ type drift layer 33 are stacked in this order from the substrate back surface 30*r* toward the substrate front surface 30*s*. The collector electrode 27 is formed on the substrate back surface 30*r*. The collector electrode 27 is formed on substantially the entirety of the substrate back surface 30*r*. The surface of the collector electrode 27 opposite to the collector layer 31 defines the device back surface 10*r* of the semiconductor device 10.

In an example, boron (B), aluminum (Al), or the like is used as the p-type dopant in the collector layer 31. The concentration of the dopant in the collector layer 31 is, for example, greater than or equal to $1\times10^{15}$ $cm^{-3}$ and less than or equal to $2\times10^{19}$ $cm^{-3}$.

In an example, nitrogen (N), phosphorus (P), arsenic (As), or the like is used as the n-type dopant in the buffer layer 32 and drift layer 33. The concentration of the dopant in the buffer layer 32 is, for example, greater than or equal to $1\times10^{15}$ $cm^{-3}$ and less than or equal to $5\times10^{17}$ $cm^{-3}$. The concentration of the dopant in the drift layer 33 is lower than that of the buffer layer 32 and is, for example, greater than or equal to $1\times10^{13}$ $cm^{-3}$ and less than or equal to $5\times10^{14}$ $cm^{-3}$.

A p-type base region 34 is formed on the surface of the drift layer 33, that is, on the substrate front surface 30*s*. The base region 34 is formed on substantially the entirety of the substrate front surface 30*s*. The concentration of the dopant in the base region 34 is, for example, greater than or equal to $1\times10^{16}$ $cm^{-3}$ and less than or equal to $1\times10^{18}$ $cm^{-3}$. The depth of the base region 34 from the substrate front surface 30*s* is, for example, greater than or equal to 1.0 μm and less than or equal to 3.0 μm.

Multiple trenches 35 are arranged next to each other on the surface of the base region 34 (substrate front surface 30*s*) in the main cell region 18. In an example, the trenches 35 extend in the y-direction and are spaced apart from each other in the x-direction. This forms stripes of the main cells 18A. The interval of the trenches 35 located adjacent to each other in the x-direction (center-to-center distance between the trenches 35) is, for example, greater than or equal to 1.5 μm and less than or equal to 7.0 μm. The width of each trench 35 (the dimension of the trench 35 in the x-direction) is, for example, greater than or equal to 0.5 μm and less than or equal to 3.0 μm. Each trench 35 extends through the base region 34 in the z-direction to an intermediate portion of the drift layer 33. The trenches 35 may have the form of a grid to separate the main cells 18A arranged in a matrix.

$N^+$ type emitter regions 36 are formed on the surface of the base region 34 (substrate front surface 30*s*) in the main cell region 18. The emitter regions 36 are disposed at opposite sides of the trench 35 in the x-direction. In other words, the emitter regions 36 are disposed in the base region 34 at opposite sides of each trench 35 in the arrangement direction of the trenches 35. Thus, two emitter regions 36 are spaced apart from each other in the x-direction and disposed between the trenches 35 located adjacent to each other in the x-direction. The depth of each emitter region 36 is, for example, greater than or equal to 0.2 μm and less than or equal to 0.6 μm. The concentration of the dopant in the emitter regions 36 is higher than that of the base region 34 and is, for example, greater than or equal to $1\times10^{19}$ $cm^{-3}$ and less than or equal to $5\times10^{20}$ $cm^{-3}$.

$P^+$ type base contact regions 37 are formed on the surface of the base region 34 (substrate front surface 30*s*) in the main cell region 18. Each base contact region 37 is disposed at a position adjacent to the emitter regions 36 in the x-direction. That is, the base contact region 37 is disposed, in the x-direction, between the two emitter regions 36 disposed between the trenches 35 located adjacent to each other in the x-direction. Each base contact region 37 may be formed to be deeper than the emitter region 36. The depth of the base contact region 37 is, for example, greater than or equal to 0.2 μm and less than or equal to 1.6 μm. The concentration of the dopant in the base contact region 37 is higher than that of the base region 34 and, for example, greater than or equal to $5\times10^{18}$ $cm^{-3}$ and less than or equal to $1\times10^{20}$ $cm^{-3}$.

An insulation film 38 is integrally formed on the inner surface of each trench 35 and the substrate front surface 30*s*. The insulation film 38 includes, for example, silicon oxide ($SiO_2$). The thickness of the insulation film 38 is, for example, greater than or equal to 1100 angstroms and less than or equal to 1300 angstroms.

An electrode material including, for example, polysilicon is embedded in each trench 35 with the insulation film 38. The electrode material embedded in each trench 35 is electrically connected to one of the gate electrode 23 (gate finger 26) and the emitter electrode 21. In other words, the conductive material embedded in the trench 35 forms the gate trench 23A or the emitter trench 21A. In the present embodiment, the gate trenches 23A and the emitter trenches 21A are alternately arranged in the arrangement direction of the trenches 35. In the present embodiment, each of the gate trenches 23A and the emitter trenches 21A fills the trench 35 to the opening end of the trench 35.

An intermediate insulation film 39 is formed on the insulation film 38 disposed on the substrate front surface 30*s*. The intermediate insulation film 39 includes, for example, $SiO_2$. The emitter electrode 21 is formed on the intermediate insulation film 39. Thus, the intermediate insulation film 39 is an interlayer insulation film that fills the space between the emitter electrode 21 and the gate trench 23A. In other words, the intermediate insulation film 39 is an interlayer insulation film that fills the space between the emitter electrode 21 and the emitter trench 21A. The thickness of the intermediate insulation film 39 is greater than or equal to 3000 angstroms and less than or equal to 15000 angstroms. In the present embodiment, the insulation film 38 and the intermediate insulation film 39 correspond to an "insulation film".

The insulation film 38 and the intermediate insulation film 39 include multiple contact holes 39*a* extending through the insulation film 38 and the intermediate insulation film 39 in the z-direction. The contact hole 39*a* is disposed to overlap the base contact region 37 as viewed in the z-direction. The emitter electrode 21 is connected to the base contact region 37 via the contact hole 39*a*.

Figure 6:
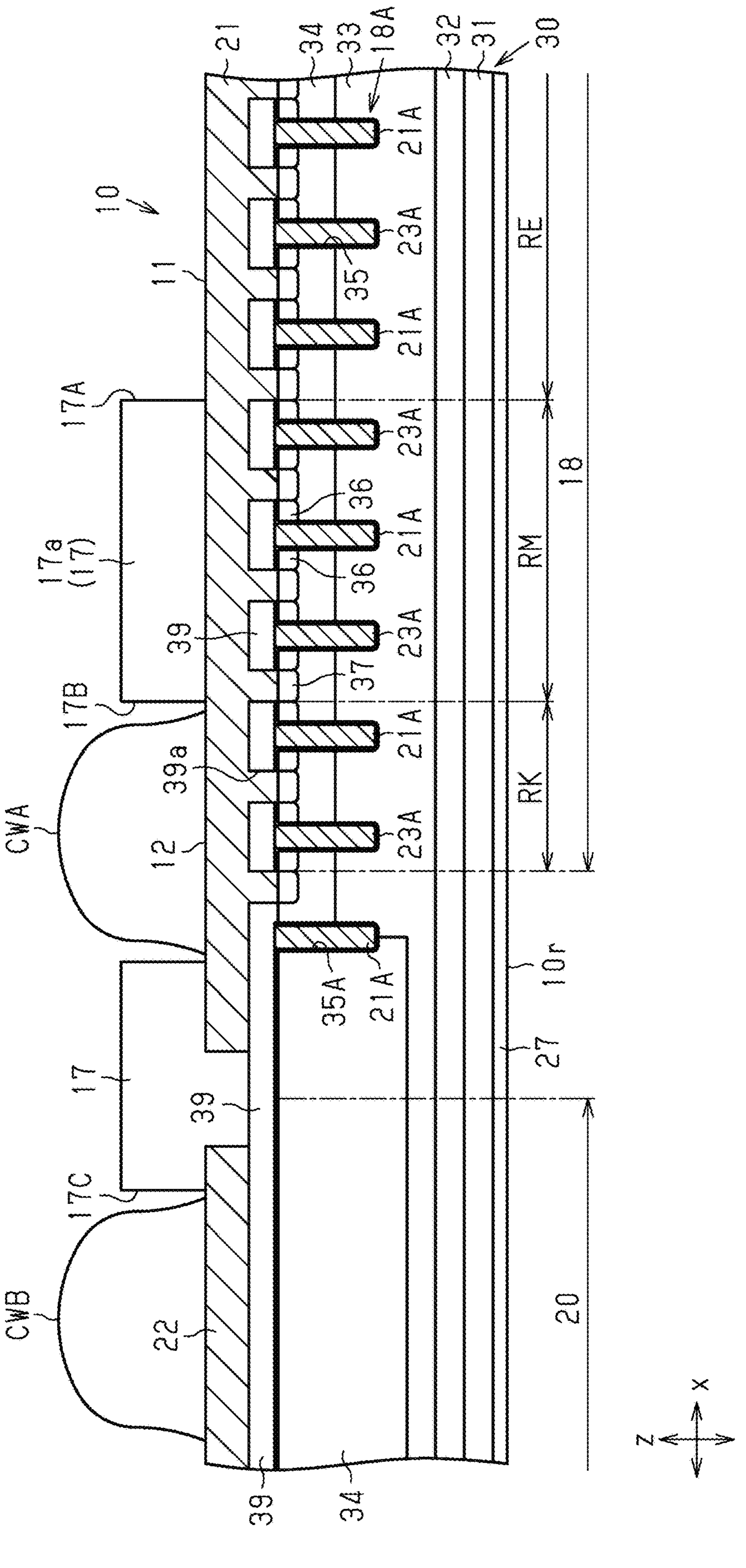
FIG. 6 is a schematic cross-sectional view showing a partial cross-sectional structure of the main cell region and the intermediate region.

FIG. 6 is a cross-sectional structure of the semiconductor device 10 showing a portion of the emitter electrode pad 11 and the cathode electrode pad 12 in the main cell region 18 and the anode electrode 22 in the intermediate region 20.

As shown in FIG. 6, since the emitter electrode 21 includes the cathode electrode pad 12, a region RK of the semiconductor substrate 30 immediately below the cathode electrode pad 12 may be used as the main cell region 18. In addition, a region RM of the semiconductor substrate 30 immediately below a position between the first opening 17A and the second opening 17B may be used as the main cell region 18. Therefore, as shown in FIG. 6, the main cell 18A is disposed in the region RK and the region RM. That is, as viewed in the z-direction, in the semiconductor substrate 30, the main cell 18A is disposed in each of a region RE overlapping the emitter electrode pad 11, the region RK overlapping the cathode electrode pad 12, and the region RM overlapping a portion between the first opening 17A and the second opening 17B. The region RE corresponds to a "first semiconductor region". The region RK corresponds to a "second semiconductor region".

The emitter region 36 is not formed at opposite sides of the trench 35A, in the x-direction, located adjacent to the intermediate region 20 in the region RK. In an example, the trench 35A includes the emitter trench 21A.

Since the intermediate region 20 is located outside the main cell region 18, the main cell 18A is not formed in the intermediate region 20. The base region 34 is formed immediately below the intermediate region 20. The depth of the base region 34 in the intermediate region 20 is greater than that of the base region 34 in the main cell region 18. More specifically, the depth of the base region 34 in the intermediate region 20 is greater than of the trench 35A (35).

FIG. 7 is a circuit configuration of the semiconductor device 10 described above.

In the semiconductor device 10, the emitter electrode 21 serves as the cathode electrode. Thus, as shown in FIG. 7, the cathode of the temperature sensing diode 40P is electrically connected to the emitter of the IGBT in the semiconductor device 10.

As shown in FIG. 7, in the present embodiment, the semiconductor device 10 includes the protection diode 40Q connected in antiparallel to the temperature sensing diode 40P. The protection diode 40Q is configured to protect the temperature sensing diode 40P. The anode of the protection diode 40Q is electrically connected to the emitter of the IGBT and the cathode of the temperature sensing diode 40P in the semiconductor device 10.

Structure of Temperature Sensing Diode and Protection Diode

An example of a detailed structure of the temperature sensing diode 40P and the protection diode 40Q will be described with reference to FIGS. 8 to 13.

Figure 8:
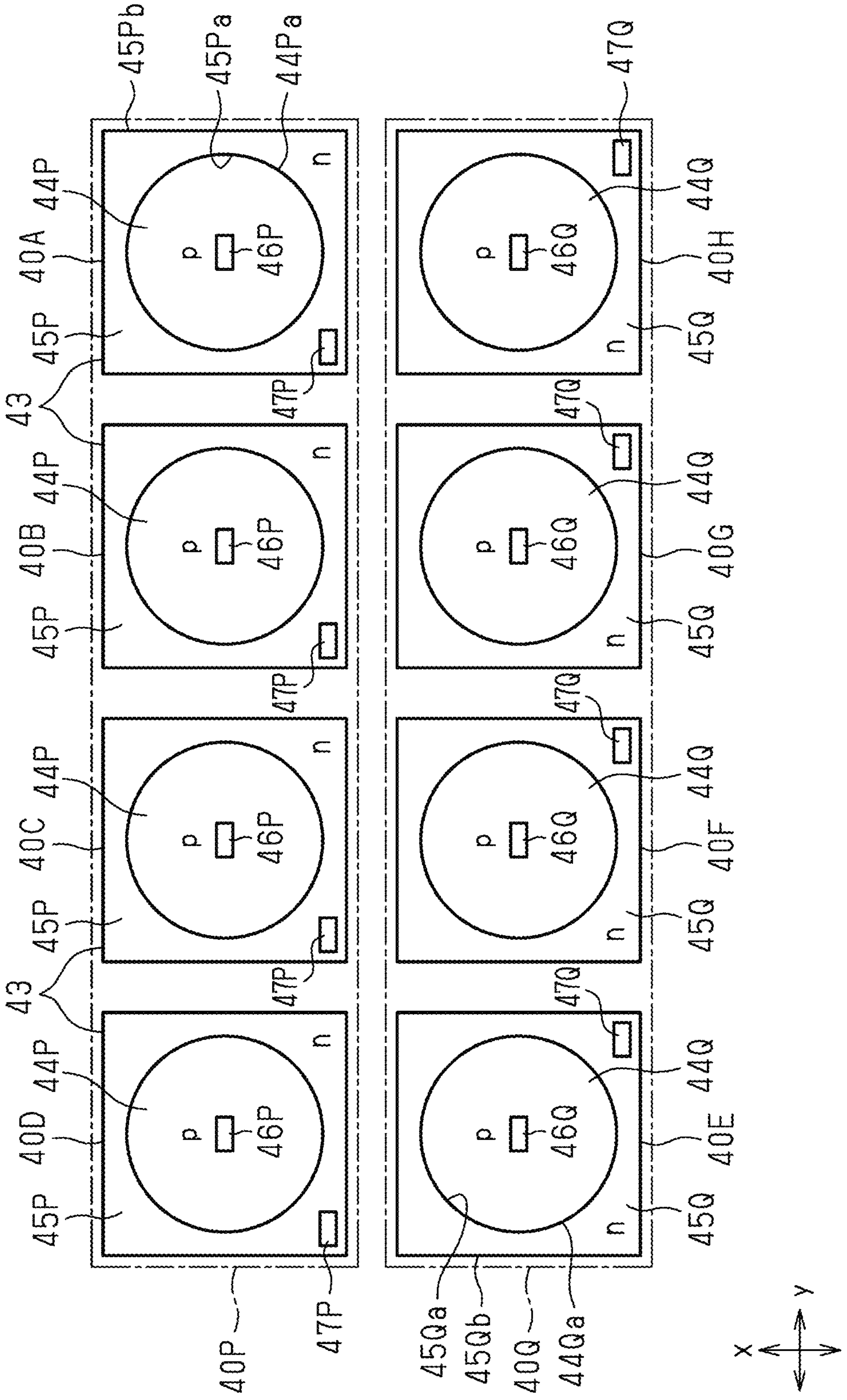
FIG. 8 is a schematic plan view of a temperature sensing diode and a protection diode mounted on the semiconductor device.
Figure 9:
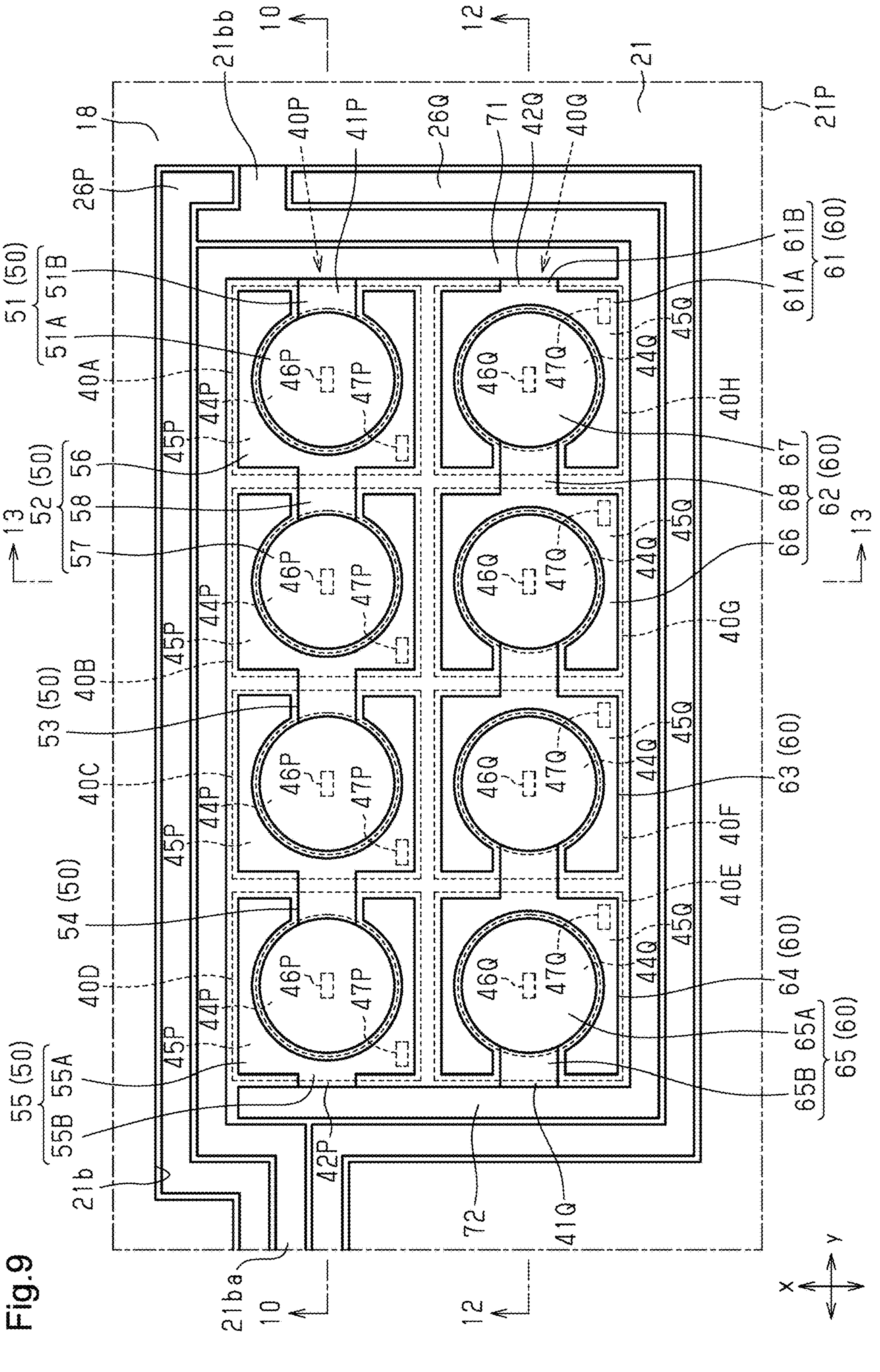
FIG. 9 is a schematic plan view of the temperature sensing diode and the protection diode shown in FIG. 8 connected to interconnects.
Figure 10:
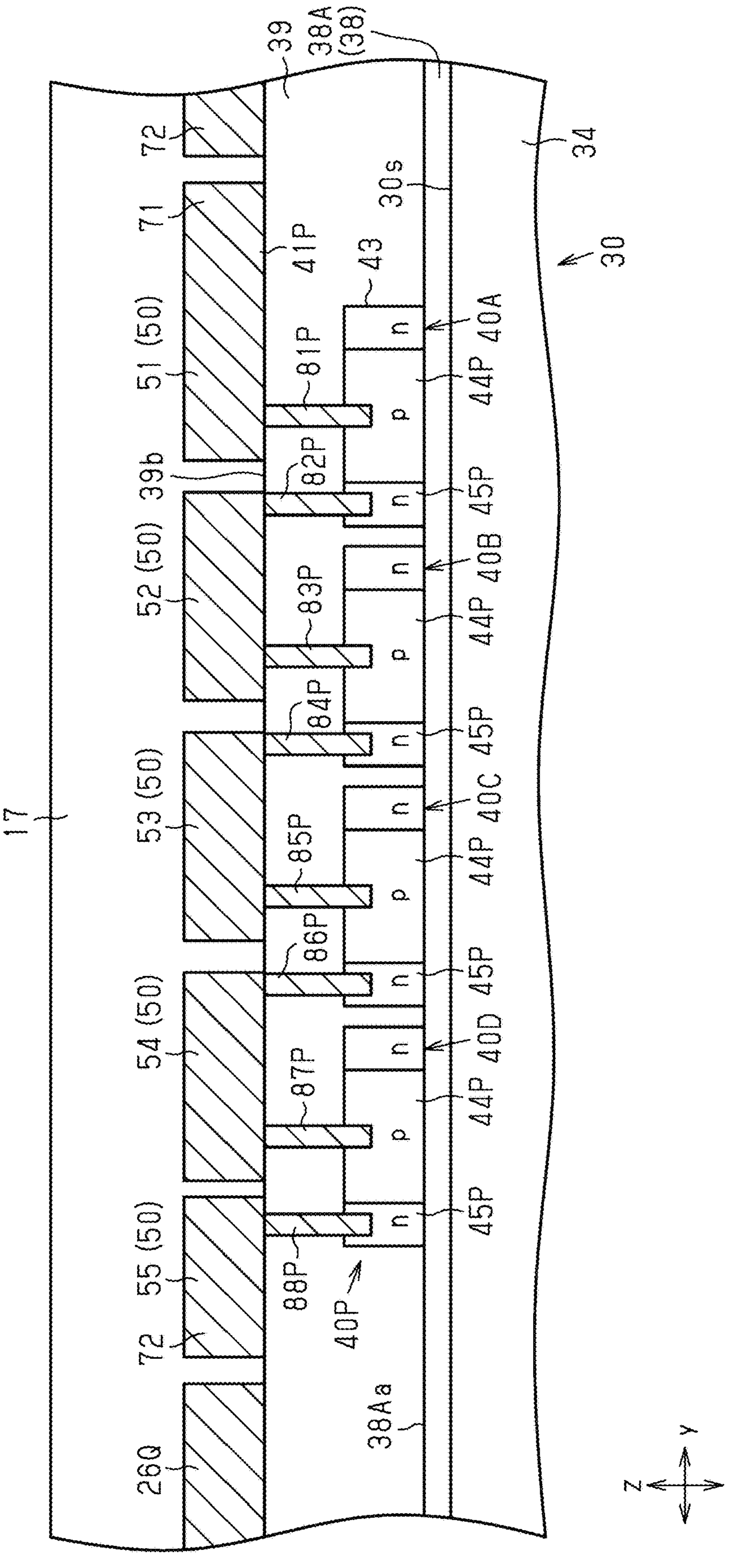
FIG. 10 is a cross-sectional view of the temperature sensing diode taken along line 10-10 in FIG. 9.
Figure 11:
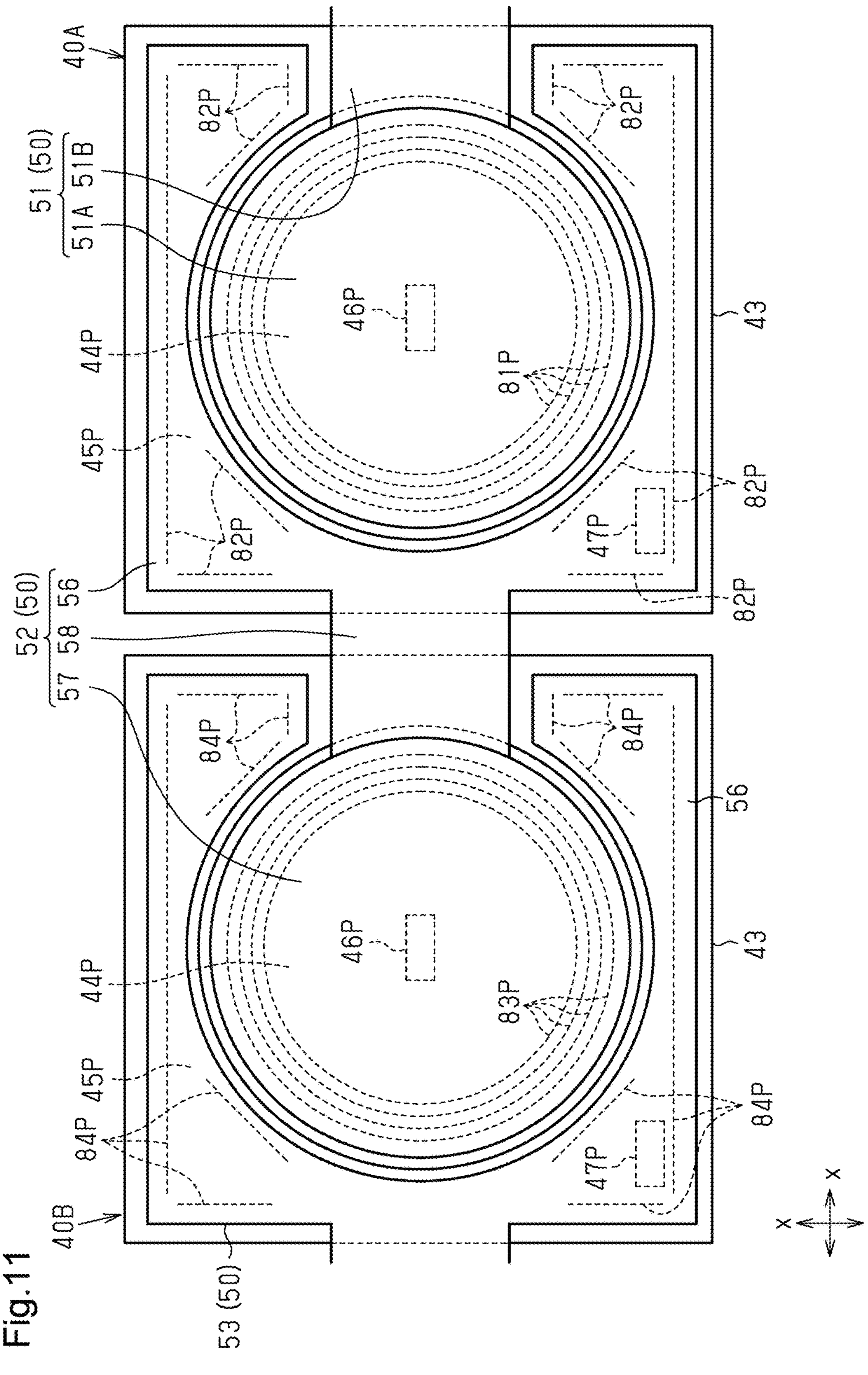
FIG. 11 is a schematic plan view showing a positional relationship between the temperature sensing diode and a through interconnect, which is included in the interconnects connected to the temperature sensing diode shown in FIG. 9.
Figure 12:
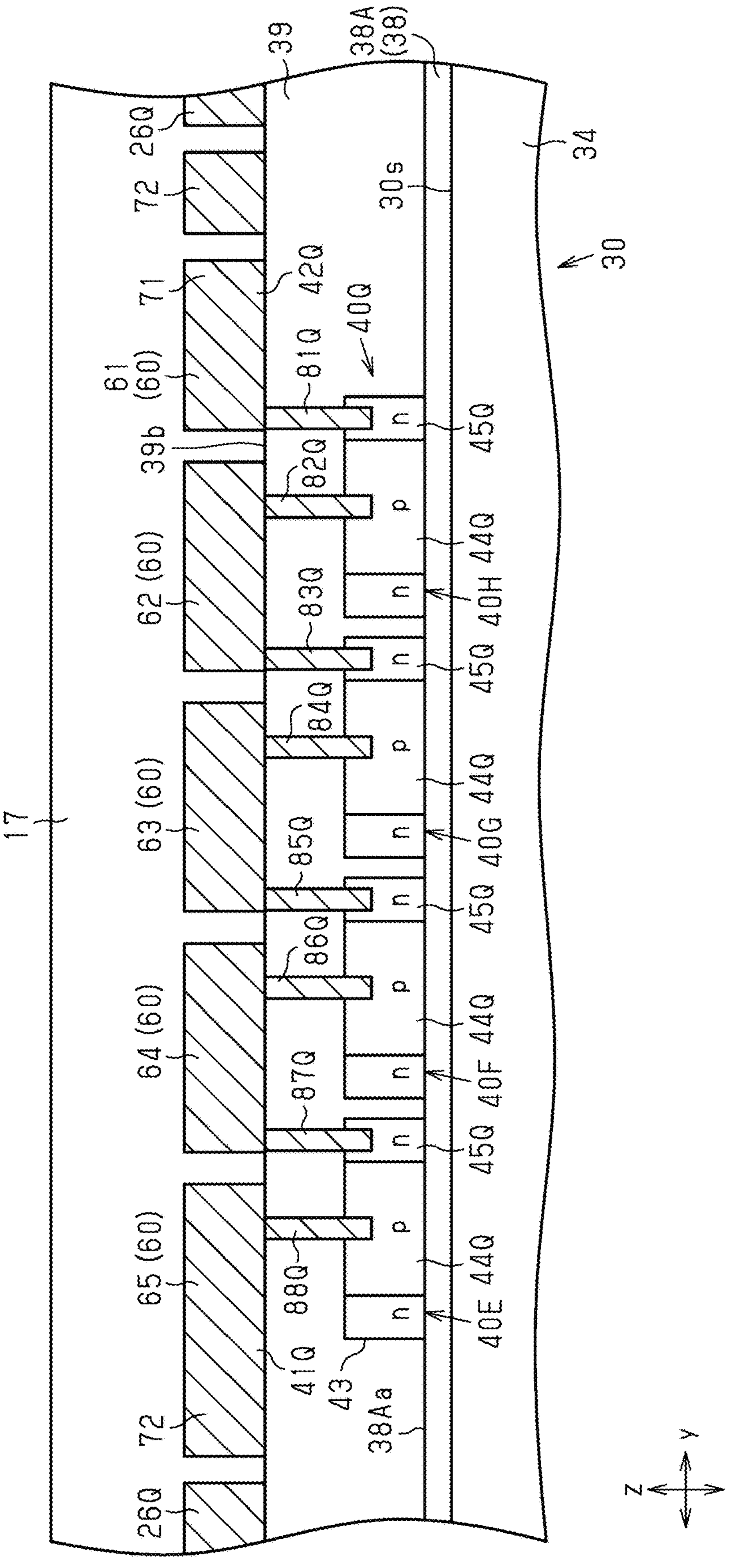
FIG. 12 is a cross-sectional view of the protection diode taken along line 12-12 shown in FIG. 9.
Figure 13:
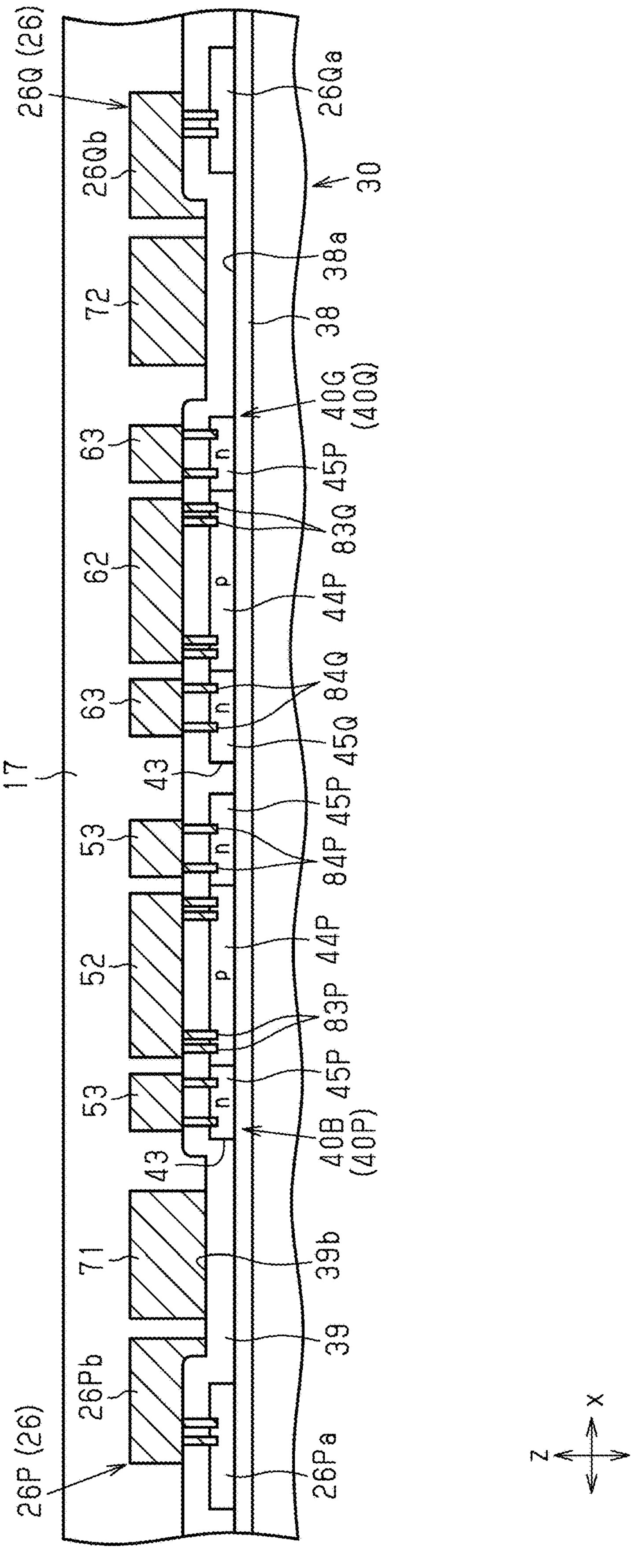
FIG. 13 is a cross-sectional view of the protection diode taken along line 13-13 shown in FIG. 9.

FIG. 8 shows a schematic planar structure of the temperature sensing diode 40P and the protection diode 40Q. FIG. 9 shows a structure of interconnects connected to the temperature sensing diode 40P and the protection diode 40Q shown in FIG. 8. FIG. 10 shows a schematic cross-sectional structure of the temperature sensing diode 40P. FIG. 12 shows a schematic cross-sectional structure of the protection diode 40Q. FIG. 13 shows schematic cross-sectional structures of the temperature sensing diode 40P, the protection diode 40Q, and the gate finger 26. FIG. 11 is a diagram showing an example of the arrangement of through interconnects that connect the interconnects described above to the temperature sensing diode 40P.

As shown in FIGS. 10 and 12, the semiconductor device 10 includes a thin-film diode semiconductor layer 43 on which the temperature sensing diode 40P and the protection diode 40Q are disposed. The diode semiconductor layer 43 includes, for example, polysilicon. The diode semiconductor layer 43 is rectangular as viewed in the z-direction. In the present embodiment, the diode semiconductor layer 43 is square as viewed in the z-direction.

The diode semiconductor layer 43 is formed on a surface 38Aa of the insulation film 38A formed on the substrate front surface 30*s*. The insulation film 38A is formed integrally with the insulation film 38. That is, the insulation film 38A forms a part of the insulation film 38. The insulation film 38A differs from the insulation film 38 in that the insulation film 38A functions to insulate the diode semiconductor layer 43 and the semiconductor substrate 30. Therefore, the insulation film 38 and the insulation film 38A may be formed separately.

As shown in FIG. 8, the temperature sensing diode 40P includes multiple (in the present embodiment, four) diode cells. For the sake of convenience, the multiple diode cells are referred to as a "first diode cell 40A", a "second diode cell 40B", a "third diode cell 40C", and a "fourth diode cell 40D". The first to fourth diode cells 40A to 40D are formed of the diode semiconductor layer 43. In the present embodiment, the first to fourth diode cells 40A to 40D are arranged in a line as viewed in the z-direction. In the present embodiment, the first to fourth diode cells 40A to 40D are arranged in a line in the y-direction. More specifically, the first to fourth diode cells 40A to 40D are aligned with each other in the x-direction and are spaced apart from each other in the y-direction. The first to fourth diode cells 40A to 40D are arranged in the order of the first diode cell 40A, the second diode cell the third diode cell 40C, and the fourth diode cell 40D in the y-direction extending from the device side surface 10*d* toward the device side surface 10*c* (refer to FIG. 2). In other words, the first to fourth diode cells 40A to 40D are arranged in the order of the first diode cell 40A, the second diode cell 40B, the third diode cell 40C, and the fourth diode cell 40D 40B in the y-direction extending from the temperature sensing diode 40P toward the electrode pads 12 to 16.

The first to fourth diode cells 40A to 40D are identical to each other in structure, shape, and size. Thus, the structure of the first diode cell 40A will be described in detail, and the structures of the second to fourth diode cells 40B to 40D will not be described.

The first diode cell 40A includes a first semiconductor region 44P of a first conductive type and a second semiconductor region 45P of a second conductive type. The first conductive type is, for example, p-type. The second conductive type is, for example, n-type. In an example, as viewed in the z-direction, the contour of the first diode cell 40A is quadrangular. In the present embodiment, as viewed in the z-direction, the contour of the first diode cell 40A is square. In the present embodiment, the first semiconductor region 44P corresponds to a "first diode semiconductor region". The second semiconductor region 45P corresponds to a "second diode semiconductor region".

The first semiconductor region 44P is disposed at the center of the first diode cell 40A in the x-direction and the y-direction. In the present embodiment, as viewed in the z-direction, the first semiconductor region 44P is circular. Therefore, the first semiconductor region 44P includes a circumferential surface 44Pa.

In an example, B, Al, or the like is used as the p-type dopant in the first semiconductor region 44P. The concentration of the dopant in the first semiconductor region 44P is, for example, greater than or equal to $1\times10^{18}$ cm$^{-3}$ and less than or equal to $1\times10^{20}$ cm$^{-3}$.

The first semiconductor region 44P includes a first length measuring pattern 46P for measuring the length of the first semiconductor region 44P (e.g., the diameter of the first semiconductor region 44P). The first length measuring pattern 46P is formed on the center of the first semiconductor region 44P. As viewed in the z-direction, the first length measuring pattern 46P is rectangular so that the long sides extend in the y-direction and the short sides extend in the x-direction.

The first length measuring pattern 46P has a pattern in which strips of straight lines are arranged parallel to each other. The concentration of the dopant in the region where the first length measuring pattern 46P is formed is lower than that in the remaining region of the first semiconductor region 44P. In the present embodiment, the first length measuring pattern 46P is a non-doped layer.

As viewed in the z-direction, the second semiconductor region 45P annularly surrounds the first semiconductor region 44P. The second semiconductor region 45P is joined to the first semiconductor region 44P. The second semiconductor region 45P includes an inner circumferential surface 45Pa joined to the circumferential surface 44Pa of the first semiconductor region 44P along the entire perimeter of the circumferential surface 44Pa of the first semiconductor region 44P.

The contour of the second semiconductor region 45P defines the contour of the first diode cell 40A. More specifically, as viewed in the z-direction, the contour of the second semiconductor region 45P is, for example, quadrangular and, in the present embodiment, is square. In other words, the second semiconductor region 45P includes an outer surface 45Pb that is quadrangular as viewed in the z-direction.

In an example, N, P, As, or the like is used as the n-type dopant in the second semiconductor region 45P. The concentration of the dopant in the second semiconductor region 45P is, for example, greater than or equal to $1\times10^{18}$ cm$^{-3}$ and less than or equal to $5\times10^{20}$ cm$^{-3}$.

The second semiconductor region 45P includes a second length measuring pattern 47P for measuring the length of the second semiconductor region 45P (e.g., the length of the outer shape of the second semiconductor region 45P in the x-direction or the y-direction). The second length measuring pattern 47P is formed at one of the four corners of the second semiconductor region 45P. As viewed in the z-direction, the second length measuring pattern 47P is rectangular so that the long sides extend in the y-direction and the short sides extend in the x-direction. In the present embodiment, the second length measuring pattern 47P is equal in size to the first length measuring pattern 46P.

The second length measuring pattern 47P has a pattern in which strips of straight lines are arranged parallel to each other. The concentration of the dopant in the region where the second length measuring pattern 47P is formed is lower than that in the remaining region of the second semiconductor region 45P. In the present embodiment, the second length measuring pattern 47P is a non-doped layer.

The protection diode 40Q includes multiple (in the present embodiment, four) protection diode cells. For the sake of convenience, the multiple protection diode cells are referred to as a "first protection diode cell 40E", a "second protection diode cell 40F", a "third protection diode cell 40G", and a "fourth protection diode cell 40H". The first to fourth protection diode cells 40E to 40H are formed of the diode semiconductor layer 43.

The first to fourth protection diode cells 40E to 40H are arranged in a line as viewed in the z-direction. In the present embodiment, the first to fourth protection diode cells 40E to 40H are arranged in a line in the y-direction. More specifically, the first to fourth protection diode cells 40E to 40H are aligned with each other in the x-direction and are spaced apart from each other in the y-direction. The first to fourth protection diode cells 40E to 40H are arranged in the order of the first protection diode cell 40E, the second protection diode cell 40F, the third protection diode cell 40G, and the fourth protection diode cell 40H in the y-direction extending from the device side surface 10*c* toward the device side surface 10*d*. In other words, the first to fourth protection diode cells 40E to 40H are arranged in the order of the first protection diode cell 40E, the second protection diode cell 40F, the third protection diode cell 40G, and the fourth protection diode cell 40H in the y-direction extending from the electrode pads 12 to 16 toward the protection diode 40Q.

The temperature sensing diode 40P and the protection diode 40Q are aligned in the y-direction and are spaced apart from each other in the x-direction. More specifically, the first diode cell 40A and the fourth protection diode cell 40H are opposed to each other in the x-direction. The second diode cell 40B and the third protection diode cell 40G are opposed to each other in the x-direction. The third diode cell 40C and the second protection diode cell 40F are opposed to each other in the x-direction. The fourth diode cell 40D and the first protection diode cell 40E are opposed to each other in the x-direction.

The protection diode 40Q is disposed closer to the device side surface 10*a* (refer to FIG. 2) with respect to the temperature sensing diode 40P. In other words, the temperature sensing diode 40P is disposed closer to the device side surface 10*b* (refer to FIG. 2) with respect to the protection diode 40Q.

The first to fourth protection diode cells 40E to 40H are identical to each other in structure, shape, and size and are also identical to the first diode cell 40A in structure, shape, and size. Thus, the general structure of the first protection diode cell 40E will be described in detail, and the structure of the second to fourth protection diode cells 40F to 40H will not be described.

The first protection diode cell 40E includes a first semiconductor region 44Q of the first conductive type (p-type) and a second semiconductor region 45Q of the second conductive type (n-type). The first semiconductor region 44Q includes a circumferential surface 44Qa. The second semiconductor region 45Q includes an inner circumferential surface 45Qa joined to the circumferential surface 44Qa of the first semiconductor region 44Q along the entire perimeter of the circumferential surface 44Qa of the first semiconductor region 44Q. The second semiconductor region 45Q has an outer surface 45Qb defining the contour of the first protection diode cell 40E. The outer surface 45Qb is quadrangular as viewed in the z-direction. The concentration of the p-type dopant in the first semiconductor region 44Q is the same as that of the first semiconductor region 44P of the first diode cell 40A. The concentration of the n-type dopant in the second semiconductor region 45Q is the same as that of the second semiconductor region 45P of the first diode cell 40A.

The first semiconductor region 44Q includes a first length measuring pattern 46Q for measuring the length of the first semiconductor region 44Q (e.g., the diameter of the first semiconductor region 44Q). The first length measuring pattern 46Q is formed on the center of the first semiconductor region 44Q. The contour, the pattern, and the dopant concentration of the first length measuring pattern 46P are the same as those of the first length measuring pattern 46P.

The second semiconductor region 45Q includes a second length measuring pattern 47Q for measuring the length of the second semiconductor region 45Q (e.g., the length of the contour of the second semiconductor region 45Q in the x-direction or the y-direction). The second length measuring pattern 47Q is formed on one of the four corners of the second semiconductor region 45Q. The contour, pattern, and dopant concentration of the second length measuring pattern 47Q are the same as those of the second length measuring pattern 47P.

As shown in FIG. 9, a first interconnect lead region 21*ba* and a second interconnect lead region 21*bb* are disposed on opposite end portions, in the y-direction, of the diode mount 21*b* that accommodates both the temperature sensing diode 40P and the protection diode 40Q.

The first interconnect lead region 21*ba* is formed on one of the end portions of the diode mount 21*b* located closer to the electrode receptacle 21*aa* in the y-direction. That is, the first interconnect lead region 21*ba* is a region of the diode mount 21*b* connected to the electrode receptacle 21*aa*. The second interconnect lead region 21*bb* is formed on one of the end portions of the diode mount 21*b* located farther from the electrode receptacle 21*aa* in the y-direction. The second interconnect lead region 21*bb* is adjacent to the adjacent region 21P in the y-direction.

The temperature sensing diode 40P and the protection diode 40Q are disposed between the first interconnect lead region 21*ba* and the second interconnect lead region 21*bb* in the y-direction. Thus, in other words, the fourth diode cell 40D is disposed closer to the first interconnect lead region 21*ba*, and the first diode cell 40A is disposed closer to the second interconnect lead region 21*bb*. In addition, the first protection diode cell 40E is disposed closer to the first interconnect lead region 21*ba*, and the fourth protection diode cell 40H is disposed closer to the second interconnect lead region 21*bb*.

As described above, in the present embodiment, the first interconnect lead region 21*ba* is a region of the diode mount 21*b* between the temperature sensing diode 40P and the protection diode 40Q and the electrode receptacle 21*aa* in the y-direction. The second interconnect lead region 21*bb* is a region of the diode mount 21*b* between the temperature sensing diode 40P and the protection diode 40Q and the adjacent region 21P in the y-direction.

As shown in FIGS. 10 and 12, the diode semiconductor layer 43 is covered by the intermediate insulation film 39. The intermediate insulation film 39 includes a surface 39*b* on which a temperature sensing diode interconnect 50, which is electrically connected to the temperature sensing diode 40P, and a protection diode interconnect 60, which is electrically connected to the protection diode 40Q, are disposed. The surface 39*b* of the intermediate insulation film 39 faces in the same direction as the substrate front surface 30*s* of the semiconductor substrate 30. In the present embodiment, the temperature sensing diode interconnect 50 corresponds to "an interconnect electrically connected to the first diode semiconductor region and the second diode semiconductor region".

As shown in FIG. 9, the first to fourth diode cells 40A to 40D are connected in series by the temperature sensing diode interconnect 50. The temperature sensing diode interconnect 50 includes first to fifth interconnects 51 to 55. The first to fifth interconnects 51 to 55 are aligned with each other in the x-direction and are spaced apart from each other in the y-direction. In other words, the first to fifth interconnects 51 to 55 are aligned with each other in the lateral direction of the temperature sensing diode 40P and are spaced apart from each other in the longitudinal direction of the temperature sensing diode 40P. The first interconnect 51 and the fifth interconnect 55 are separately disposed at opposite ends of the temperature sensing diode 40P in the longitudinal direction (y-direction). The second to fourth interconnects 52 to 54 are disposed between the first interconnect 51 and the fifth interconnect 55 in the y-direction. The second to fourth interconnects 52 to 54 are insulated from the first interconnect 51 and the fifth interconnect 55.

Thus, in the present embodiment, the first diode cell 40A corresponds to a "first end cell". The fourth diode cell 40D corresponds to a "second end cell". The first interconnect 51 corresponds to a "first end interconnect". The fifth interconnect 55 corresponds to a "second end interconnect".

The temperature sensing diode 40P includes a first electrode 41P serving as an anode electrode and a second electrode 42P serving as a cathode electrode. The first electrode 41P and the second electrode 42P are separately disposed at opposite ends of the temperature sensing diode 40P in the longitudinal direction (y-direction). As shown in FIG. 9, the first electrode 41P is disposed at one of the two ends of the temperature sensing diode 40P located closer to the second interconnect lead region 21*bb*. The second electrode 42P is disposed at one of the two ends of the temperature sensing diode 40P located closer to the first interconnect lead region 21*ba*. In other words, the first electrode 41P is disposed at one of the two ends of the temperature sensing diode 40P located farther from the electrode pads 12 to 16. The second electrode 42P is disposed at one of the two ends of the temperature sensing diode 40P located closer to the electrode pads 12 to 16.

The first interconnect 51 is electrically connected to the first semiconductor region 44P of the first diode cell 40A to supply current to the first diode cell 40A from the outside of the temperature sensing diode 40P. As viewed in the z-direction, the first interconnect 51 includes a first region connector 51A disposed to overlap the first semiconductor region 44P of the first diode cell 40A and a first extension 51B extending from the first region connector 51A to the outside of the first semiconductor region 44P of the first diode cell 40A. In the present embodiment, the first region connector 51A is integrated with the first extension 51B. The first extension 51B includes the first electrode 41P of the temperature sensing diode 40P. In the present embodiment, the first region connector 51A corresponds to a "first end connector". The first extension 51B corresponds to a "first end extension".

As viewed in the z-direction, the first region connector 51A is circular. In the present embodiment, the center of the first region connector 51A coincides with the center of the first semiconductor region 44P. The diameter of the first region connector 51A is slightly smaller than that of the first semiconductor region 44P. The diameter of the first region connector 51A may be changed in any manner and may be, for example, greater than or equal to that of the first semiconductor region 44P.

The first extension 51B extends from the first region connector 51A in a direction opposite to the second interconnect 52. Thus, as viewed in the z-direction, the first extension 51B overlaps the second semiconductor region 45P of the first diode cell 40A.

The second interconnect 52 is configured to connect the first diode cell 40A and the second diode cell 40B in series. The second interconnect 52 electrically connects the second semiconductor region 45P of the first diode cell 40A and the first semiconductor region 44P of the second diode cell 40B. The second interconnect 52 extends across the first diode cell 40A and the second diode cell 40B.

The second interconnect 52 includes a first part 56, a second part 57, and a connection part 58. In the present embodiment, the first part 56, the second part 57, and the connection part 58 are integrated with each other.

The first part 56 is disposed to overlap the second semiconductor region 45P of the first diode cell 40A as viewed in the z-direction and is electrically connected to the second semiconductor region 45P of the first diode cell 40A. As viewed in the z-direction, the first part 56 has an annular shape that surrounds the first semiconductor region 44P of the first diode cell 40A and has a gap at a portion of the first semiconductor region 44P of the first diode cell 40A in the circumferential direction. In other words, as viewed in the z-direction, the first part 56 has an annular shape that surrounds the first region connector 51A of the first interconnect 51 and has a gap to avoid contacting the first extension 51B.

The second part 57 is disposed to overlap the first semiconductor region 44P of the second diode cell 40B as viewed in the z-direction and is electrically connected to the first semiconductor region 44P of the second diode cell 40B. As viewed in the z-direction, the second part 57 is circular. In the present embodiment, the second part 57 has the same shape as the first region connector 51A.

The connection part 58 connects the first part 56 and the second part 57. The connection part 58 extends in the y-direction.

The third interconnect 53 is configured to connect the second diode cell 40B and the third diode cell 40C in series. The third interconnect 53 electrically connects the second semiconductor region 45P of the second diode cell 40B and the first semiconductor region 44P of the third diode cell 40C. The third interconnect 53 extends across the second diode cell 40B and the third diode cell 40B.

The third interconnect 53 has the same shape as the second interconnect 52. Thus, the shape of the third interconnect 53 will not be described in detail. The first part 56 of the third interconnect 53 is disposed to overlap the second semiconductor region 45P of the second diode cell 40B as viewed in the z-direction and is electrically connected to the second semiconductor region 45P of the second diode cell 40B. The second part 57 of the third interconnect 53 is disposed to overlap the first semiconductor region 44P of the third diode cell 40C as viewed in the z-direction and is electrically connected to the first semiconductor region 44P of the third diode cell 40C.

The fourth interconnect 54 is configured to connect the third diode cell 40C and the fourth diode cell 40D in series. The fourth interconnect 54 electrically connects the second semiconductor region 45P of the third diode cell 40C and the first semiconductor region 44P of the fourth diode cell 40D. The fourth interconnect 54 extends across the third diode cell 40C and the fourth diode cell 40D.

The fourth interconnect 54 has the same shape as the second interconnect 52. Thus, the shape of the fourth interconnect 54 will not be described in detail. The first part 56 of the fourth interconnect 54 is disposed to overlap the second semiconductor region 45P of the third diode cell 40C as viewed in the z-direction and is electrically connected to the second semiconductor region 45P of the third diode cell 40C. The second part 57 of the fourth interconnect 54 is disposed to overlap the first semiconductor region 44P of the fourth diode cell 40D as viewed in the z-direction and is electrically connected to the first semiconductor region 44P of the fourth diode cell 40D.

The fifth interconnect 55 is electrically connected to the second semiconductor region 45P of the fourth diode cell 40D to supply a current that flows through the temperature sensing diode 40P to the outside of the temperature sensing diode 40P. As viewed in the z-direction, the fifth interconnect 55 includes a fifth region connector 55A disposed to overlap the first semiconductor region 44P of the fourth diode cell 40D and a fifth extension 55B extending from the fifth region connector 55A to the outside of the first semiconductor region 44P of the fourth diode cell 40D. In the present embodiment, the fifth region connector 55A is integrated with the fifth extension 55B. The fifth extension 55B includes the second electrode 42P of the temperature sensing diode 40P. In the present embodiment, the fifth region connector 55A corresponds to a "second end connector". The fifth extension 55B corresponds to a "second end extension".

As viewed in the z-direction, the fifth region connector 55A annularly surrounds the first semiconductor region 44P of the fourth diode cell 40D and has a gap at a portion of the first semiconductor region 44P in the circumferential direction. In other words, as viewed in the z-direction, the fifth region connector 55A annularly surrounds the second part of the fourth interconnect 54, which is electrically connected to the first semiconductor region 44P, and has a gap to contact the connection part of the fourth interconnect 54. In the present embodiment, the fifth region connector 55A has the same shape as the first part 56 of the second interconnect 52.

The fifth extension 55B extends from the fifth region connector 55A in a direction opposite to the first interconnect 51. In the present embodiment, the fifth extension 55B is shorter than the first extension 51B.

As shown in FIG. 10, the semiconductor device 10 includes first to eighth through interconnects 81P to 88P, which are the through interconnects extending through the intermediate insulation film 39. The first to eighth through interconnects 81P to 88P are configured to separately connect the first to fifth interconnects 51 to 55 to the diode cells 40A to 40D. FIG. 10 is a schematic connection structure between the first to fifth interconnects 51 to 55 and the diode cells 40A to 40D by the first to eighth through interconnects 81P to 88P. The position and the number of the first to eighth through interconnects 81P to 88P are not limited to those of the first to eighth through interconnects 81P to 88P shown in FIG. 10.

The first through interconnect 81P is configured to connect the first semiconductor region 44P of the first diode cell 40A and the first interconnect 51. Thus, the first semiconductor region 44P of the first diode cell 40A is electrically connected to the first electrode 41P of the temperature sensing diode 40P. As viewed in the z-direction, the first through interconnect 81P is disposed to overlap with the first semiconductor region 44P of the first diode cell 40A and the first interconnect 51.

The second through interconnect 82P is configured to connect the second semiconductor region 45P of the first diode cell 40A and the second interconnect 52. As viewed in the z-direction, the second through interconnect 82P is disposed to overlap with the second semiconductor region 45P of the first diode cell 40A and the second interconnect 52.

The third through interconnect 83P is configured to connect the first semiconductor region 44P of the second diode cell 40B and the second interconnect 52. As viewed in the z-direction, the third through interconnect 83P is disposed to overlap with the first semiconductor region 44P of the second diode cell 40B and the second interconnect 52.

Thus, the second semiconductor region 45P of the first diode cell 40A and the first semiconductor region 44P of the second diode cell 40B are connected through the second through interconnect 82P, the second interconnect 52, and the third through interconnect 83P.

The fourth through interconnect 84P is configured to connect the second semiconductor region 45P of the second diode cell 40B and the third interconnect 53. As viewed in the z-direction, the fourth through interconnect 84P is disposed to overlap with the second semiconductor region 45P of the second diode cell 40B and the third interconnect 53.

The fifth through interconnect 85P is configured to connect the first semiconductor region 44P of the third diode cell 40C and the third interconnect 53. As viewed in the z-direction, the fifth through interconnect 85P is disposed to overlap with the first semiconductor region 44P of the third diode cell 40C and the third interconnect 53.

Thus, the second semiconductor region 45P of the second diode cell 40B and the first semiconductor region 44P of the third diode cell 40C are connected through the fourth through interconnect 84P, the third interconnect 53, and the fifth through interconnect 85P.

The sixth through interconnect 86P is configured to connect the second semiconductor region 45P of the third diode cell 40C and the fourth interconnect 54. As viewed in the z-direction, the sixth through interconnect 86P is disposed to overlap with the second semiconductor region 45P of the third diode cell 40C and the fourth interconnect 54.

The seventh through interconnect 87P is configured to connect the first semiconductor region 44P of the fourth diode cell 40D and the fourth interconnect 54. As viewed in the z-direction, the seventh through interconnect 87P is disposed to overlap with the first semiconductor region 44P of the fourth diode cell 40D and the fourth interconnect 54.

Thus, the second semiconductor region 45P of the third diode cell 40C and the first semiconductor region 44P of the fourth diode cell 40D are connected through the sixth through interconnect 86P, the fourth interconnect 54, and the seventh through interconnect 87P.

The eighth through interconnect 88P is configured to connect the second semiconductor region 45P of the fourth diode cell 40D and the fifth interconnect 55. Accordingly, the second semiconductor region 45P of the fourth diode cell 40D is electrically connected to the second electrode 42P of the temperature sensing diodes 40P. As viewed in the z-direction, the eighth through interconnect 88P is disposed to overlap with the second semiconductor region 45P of the fourth diode cell 40D and the fifth interconnect 55. Each of the first to eighth through interconnects 81P to 88P may include multiple through interconnects.

FIG. 11 is a diagram showing an example of arrangement formation of the first to fourth through interconnects 81P to 84P with respect to the diode cells 40A and 40B and the first to third wirings 51 to 53. The fifth to eighth through interconnects 85P to 88P are similar to the first to fourth through interconnects 81P to 84P.

As viewed in the z-direction, the first through interconnect 81P is disposed to overlap a peripheral portion of the first semiconductor region 44P of the first diode cell 40A. That is, as viewed in the z-direction, the first through interconnect 81P is disposed to overlap the peripheral portion of the first interconnect 51. Therefore, the first through interconnect 81P is disposed in the first diode cell 40A at a position different from that of the first length measuring pattern 46P. Multiple first through interconnects 81P are arranged. As viewed in the z-direction, each first through interconnect 81P is annular. The first through interconnects 81P are concentrically arranged. In the present embodiment, the first through interconnects 81P are arranged to be concentric with the first semiconductor region 44P (first interconnect 51).

The second through interconnect 82P is disposed to overlap a peripheral portion of the first part 56 of the second interconnect 52. The second through interconnect 82P is disposed in the first diode cell 40A at a position different from that of the second length measuring pattern 47P. Multiple second through interconnects 82P are arranged.

The third through interconnect 83P is disposed to overlap a peripheral portion of the first semiconductor region 44P of the second diode cell 40B. That is, the third through interconnect 83P is disposed to overlap a peripheral portion of the second part 57 of the second interconnect 52. The third through interconnect 83P is disposed in the second diode cell 40B at a position different from that of the first length measuring pattern 46P. Multiple third through interconnects 83P are arranged. The third through interconnects 83P are the same in shape and number as the first through interconnects 81P.

The fourth through interconnect 84P is disposed to overlap a peripheral portion of the first part 56 of the third interconnect 53. The fourth through interconnect 84P is disposed in the second diode cell 40B at a position different from that of the second length measuring pattern 47P. Multiple fourth through interconnects 84P are arranged. The fourth through interconnects 84P have the same shape as the second through interconnects 82P. The arrangement of the fourth through interconnects 84P with respect to the first part 56 of the third interconnect 53 is the same as the arrangement of the second through interconnects 82P with respect to the first part 56 of the second interconnect 52.

As shown in FIG. 9, the first to fourth protection diode cells 40E to 40H are connected in series by the protection diode interconnect 60. The protection diode interconnect 60 includes first to fifth interconnects 61 to 65. The first to fifth interconnects 61 to 65 are aligned with each other in the x-direction and are spaced apart from each other in the y-direction. In other words, the first to fifth interconnects 61 to 65 are aligned with each other in the lateral direction of the protection diode 40Q and are spaced apart from each other in the longitudinal direction of the protection diode 40Q. The first interconnect 61 and the fifth interconnect 65 are separately disposed at opposite ends of the protection diode 40Q in the longitudinal direction (y-direction). The second to fourth interconnects 62 to 64 are disposed between the first interconnect 61 and the fifth interconnect 65 in the y-direction. The second to fourth interconnects 62 to 64 are insulated from the first interconnect 61 and the fifth interconnect 65.

The protection diode 40Q includes a first electrode 41Q serving as an anode electrode and a second electrode 42Q serving as a cathode electrode. The first electrode 41Q and the second electrode 42Q are separately disposed at opposite ends of the temperature sensing diode 40P in the longitudinal direction (y-direction). As shown in FIG. 9, the first electrode 41Q is disposed at one of the two ends of the protection diode 40Q located closer to the first interconnect lead region 21*ba*. The second electrode 42Q is disposed at one of the two ends of the protection diode 40Q located closer to the second interconnect lead region 21*bb*. In other words, the first electrode 41Q is disposed at one of the two ends of the protection diode 40Q located closer to the electrode pads 12 to 16 (refer to FIG. 1). The second electrode 42Q is disposed at one of the two ends of the protection diode 40Q located farther from the electrode pads 12 to 16.

The first interconnect 61 is electrically connected to the second semiconductor region 45Q of the fourth protection diode cell 40H to supply current to the fourth protection diode cell 40H from the outside of the protection diode 40Q. As viewed in the z-direction, the first interconnect 61 includes a first region connector 61A disposed to overlap the second semiconductor region 45Q of the fourth protection diode cell 40H and a first extension 61B extending from the first region connector 61A to the outside of the second semiconductor region 45Q of the fourth protection diode cell 40H. In the present embodiment, the first region connector 61A is integrated with the first extension 61B. The first extension 61B includes the second electrode 42Q of the protection diode 40Q. As viewed in the x-direction, the first interconnect 61 is disposed to overlap the first interconnect 51. As viewed in the z-direction, the fifth region connector 55A annularly surrounds the first semiconductor region 44P of the fourth protection diode cell 40H and has a gap at a portion of the first semiconductor region 44P in the circumferential direction.

The first extension 61B extends from the first region connector 61A in a direction opposite to the second interconnect 62. As viewed in the z-direction, the first extension 61B overlaps the second semiconductor region 45Q of the fourth protection diode cell 40H.

The second interconnect 62 is configured to connect the fourth protection diode cell 40H and the third protection diode cell 40G in series. The second interconnect 62 electrically connects the second semiconductor region 45Q of the fourth protection diode cell 40H and the first semiconductor region 44Q of the third protection diode cell 40G. The second interconnect 62 extends across the fourth protection diode cell 40H and the third protection diode cell 40G.

The second interconnect 62 includes a first part 66, a second part 67, and a connection part 68. In the present embodiment, the first part 66, the second part 67, and the connection part 68 are integrated with each other. The second interconnect 62 is identical in shape to the second interconnect 52. The shape of the second interconnect 62 is obtained by 180 degrees of rotation of the second interconnect 52.

The first part 66 is disposed to overlap the second semiconductor region 45Q of the third protection diode cell 40G as viewed in the z-direction and is electrically connected to the second semiconductor region 45Q of the third protection diode cell 40G. As viewed in the z-direction, the first part 66 has an annular shape that surrounds the first semiconductor region 44Q of the third protection diode cell 40G and has a gap at a portion of the first semiconductor region 44Q of the third protection diode cell 40G in the circumferential direction. In the present embodiment, the first part 66 has the same shape as the first part 56 of the second interconnect 52.

The second part 67 is disposed to overlap the first semiconductor region 44Q of the fourth protection diode cell 40H as viewed in the z-direction and is electrically connected to the first semiconductor region 44Q of the fourth protection diode cell 40H. As viewed in the z-direction, the second part 67 is circular. In the present embodiment, the second part 67 has the same shape as the second part 57 of the second interconnect 52.

The connection part 68 connects the first part 66 and the second part 67. The connection part 68 extends in the y-direction. In the present embodiment, the connection part 68 has the same shape as the connection part 58 of the second interconnect 52.

The third interconnect 63 is configured to connect the third protection diode cell 40G and the second protection diode cell 40F in series. The third interconnect 63 electrically connects the first semiconductor region 44Q of the third protection diode cell 40G and the second semiconductor region 45Q of the second protection diode cell 40F. The third interconnect 63 extends across the third protection diode cell 40G and the second protection diode cell 40F.

The third interconnect 63 has the same shape as the second interconnect 62. Thus, the shape of the third interconnect 63 will not be described in detail. The first part 66 of the third interconnect 63 is disposed to overlap the second semiconductor region 45Q of the second protection diode cell 40F as viewed in the z-direction and is electrically connected to the second semiconductor region 45Q of the second protection diode cell 40F. The second part 67 of the third interconnect 63 is disposed to overlap the first semiconductor region 44Q of the third protection diode cell 40G as viewed in the z-direction and is electrically connected to the first semiconductor region 44Q of the third protection diode cell 40G.

The fourth interconnect 64 is configured to connect the second protection diode cell 40F and the first protection diode cell 40E in series. The fourth interconnect 64 electrically connects the first semiconductor region 44Q of the second protection diode cell 40F and the second semiconductor region 45Q of the first protection diode cell 40E. The fourth interconnect 64 extends across the second protection diode cell 40F and the first protection diode cell 40E.

The fourth interconnect 64 has the same shape as the second interconnect 62. Thus, the shape of the fourth interconnect 64 will not be described in detail. The first part 66 of the fourth interconnect 64 is disposed to overlap the second semiconductor region 45Q of the first protection diode cell 40E as viewed in the z-direction and is electrically connected to the second semiconductor region 45Q of the first protection diode cell 40E. The second part 67 of the fourth interconnect 64 is disposed to overlap the first semiconductor region 44Q of the second protection diode cell 40F as viewed in the z-direction and is electrically connected to the first semiconductor region 44Q of the second protection diode cell 40F.

The fifth interconnect 65 is electrically connected to the first semiconductor region 44Q of the first protection diode cell 40E to supply a current that flows through the protection diode 40Q to the outside of the protection diode 40Q. As viewed in the z-direction, the fifth interconnect 65 includes a fifth region connector 65A disposed to overlap the first semiconductor region 44Q of the first protection diode cell 40E and a fifth extension 65B extending from the fifth region connector 65A to the outside of the first semiconductor region 44Q of the first protection diode cell 40E. In the present embodiment, the fifth region connector 65A is integrated with the fifth extension 65B. The fifth extension 65B includes the first electrode 41Q of the protection diode 40Q. As viewed in the x-direction, the fifth interconnect 65 is disposed to overlap the fifth interconnect 55.

As viewed in the z-direction, the fifth region connector 65A is circular. In the present embodiment, the center of the fifth region connector 65A coincides with the center of the first semiconductor region 44Q of the first protection diode cell 40E. The diameter of the fifth region connector 65A is slightly smaller than that of the first semiconductor region 44Q. The diameter of the fifth region connector 65A may be changed in any manner and may be, for example, greater than or equal to that of the first semiconductor region 44Q.

The fifth extension 65B extends from the fifth region connector 65A in a direction opposite to the fourth interconnect 64. In the present embodiment, the fifth extension 65B is shorter than the first extension 61B.

As shown in FIGS. 9 and 12, the semiconductor device 10 includes first to eighth through interconnects 81Q to 88Q, which are the through interconnects extending through the intermediate insulation film 39. The first to eighth through interconnects 81Q to 88Q are configured to separately connect the first to fifth interconnects 61 to 65 and the protection diode cells 40E to 40H. FIG. 12 is a schematic connection structure of the first to fifth interconnects 61 to 65 and the protection diode cells 40E to 40H with the first to eighth through interconnects 81Q to 88Q. The position and the number of the first to eighth through interconnects 81Q to 88Q are not limited to those of the first to eighth through interconnects 81Q to 88Q shown in FIG. 12.

The first through interconnect 81Q is configured to connect the second semiconductor region 45Q of the fourth protection diode cell 40H and the first interconnect 61. Thus, the second semiconductor region 45Q of the fourth protection diode cell 40H is electrically connected to the second electrode 42Q of the protection diode 40Q. As viewed in the z-direction, the first through interconnect 81Q is disposed to overlap with the second semiconductor region 45Q of the fourth protection diode cell 40H and the first interconnect 61. Multiple first through interconnects 81Q may be arranged. More specifically, as viewed in the z-direction, the first through interconnects 81Q may be separated from each other and overlap the second semiconductor region 45Q of the fourth protection diode cell 40H and the first region connector 61A of the first interconnect 61.

The second through interconnect 82Q is configured to connect the first semiconductor region 44Q of the fourth protection diode cell 40H and the second interconnect 62. As viewed in the z-direction, the second through interconnect 82Q is disposed to overlap with the second semiconductor region 45Q of the fourth protection diode cell 40H and the second interconnect 62.

The third through interconnect 83Q is configured to connect the second semiconductor region 45Q of the third protection diode cell 40G and the second interconnect 62. As viewed in the z-direction, the third through interconnect 83Q is disposed to overlap with the second semiconductor region 45Q of the third protection diode cell 40G and the second interconnect 62.

Thus, the first semiconductor region 44Q of the fourth protection diode cell 40H and the second semiconductor region 45Q of the third protection diode cell 40G are connected through the second through interconnect 82Q, the second interconnect 62, and the third through interconnect 83Q.

The fourth through interconnect 84Q is configured to connect the first semiconductor region 44Q of the third protection diode cell 40G and the third interconnect 63. As viewed in the z-direction, the fourth through interconnect 84Q is disposed to overlap with the first semiconductor region 44Q of the third protection diode cell 40G and the third interconnect 63.

The fifth through interconnect 85Q is configured to connect the second semiconductor region 45Q of the second protection diode cell 40F and the third interconnect 63. As viewed in the z-direction, the fifth through interconnect 85Q is disposed to overlap with the second semiconductor region 45Q of the second protection diode cell 40F and the third interconnect 63.

Thus, the first semiconductor region 44Q of the third protection diode cell 40G and the second semiconductor region 45Q of the second protection diode cell 40F are connected through the fourth through interconnect 84Q, the third interconnect 63, and the fifth through interconnect 85Q.

The sixth through interconnect 86Q is configured to connect the first semiconductor region 44Q of the second protection diode cell 40F and the fourth interconnect 64. As viewed in the z-direction, the sixth through interconnect 86Q is disposed to overlap with the first semiconductor region 44Q of the second protection diode cell 40F and the fourth interconnect 64.

The seventh through interconnect 87Q is configured to connect the second semiconductor region 45Q of the first protection diode cell 40E and the fourth interconnect 64. As viewed in the z-direction, the seventh through interconnect 87Q is disposed to overlap with the second semiconductor region 45Q of the first protection diode cell 40E and the fourth interconnect 64.

Thus, the first semiconductor region 44Q of the second protection diode cell 40F and the second semiconductor region 45Q of the first protection diode cell 40E are connected through the sixth through interconnect 86Q, the fourth interconnect 64, and the seventh through interconnect 87Q.

The eighth through interconnect 88Q is configured to connect the first semiconductor region 44Q of the first protection diode cell 40E and the fifth interconnect 65. Thus, the first semiconductor region 44Q of the first protection diode cell 40E is electrically connected to the first electrode 41Q of the protection diode 40Q. As viewed in the z-direction, the eighth through interconnect 88Q is disposed to overlap with the first semiconductor region 44Q of the first protection diode cell 40E and the fifth interconnect 65. Each of the first to eighth through interconnects 81Q to 88Q may include multiple through interconnects. In this case, the first to eighth through interconnects 81Q to 88Q are arranged, for example, in the same manner as the first to fourth through interconnects 81P to 84P shown in FIG. 11.

As shown in FIG. 9, the semiconductor device 10 includes a first connection line 71 and a second connection line 72. The first connection line 71 is an interconnect that connects the first electrode 41P of the temperature sensing diode 40P and the second electrode 42Q of the protection diode 40Q to the anode electrode 22. The second connection line 72 is an interconnect that connects the second electrode 42P of the temperature sensing diode 40P and the first electrode 41Q of the protection diode 40Q to the emitter electrode 21. Therefore, the second connection line 72 corresponds to a "second electrode connection interconnect".

The first connection line 71 is connected to both the first interconnect 51 and the first interconnect 61. More specifically, the first connection line 71 is connected to the first extension 51B of the first interconnect 51 and the first extension 61B of the first interconnect 61. The first connection line 71 is connected to the anode electrode 22 through the first interconnect lead region 21*ba*. Therefore, the first connection line 71 corresponds to a "first electrode connection interconnect".

The second connection line 72 is connected to both the fifth interconnect 55 and the fifth interconnect 65. More specifically, the second connection line 72 is connected to both the fifth extension 55B of the fifth interconnect 55 and the fifth extension 65B of the fifth interconnect 65. The second connection line 72 is connected to the emitter electrode 21 through the second interconnect lead region 21*bb*.

FIG. 13 is a diagram schematically showing the arrangement relationship of the second diode cell 40B of the temperature sensing diode 40P, the third protection diode cell 40G of the protection diode 40Q, the second interconnects 52 and 62, the third interconnects 53 and 63, the third through interconnects 83P and 83Q, the fourth through interconnects 84P and 84Q, the two gate fingers 26, the first connection line 71, and the second connection line 72. The position and the number of the third through interconnects 83P and 83Q and the fourth through interconnects 84P and 84Q are not limited to those of the third through interconnects 83P and 83Q and the fourth through interconnects 84P and 84Q shown in FIG. 13.

As shown in FIGS. 9 and 13, gate fingers 26P and 26Q are disposed as the two gate fingers 26 in the diode mount 21*b* of the emitter electrode 21. As viewed in the z-direction, the gate fingers 26P and 26Q surround the outer sides of the temperature sensing diode 40P and the protection diode 40Q as a whole. The distal ends of the gate fingers 26P and 26Q are spaced apart by a gap in the x-direction and opposed to each other in the second interconnect lead region 21*bb*. The second connection line 72 extends in the y-direction through the gap between the distal ends of the gate fingers 26P and 26Q in the x-direction and is connected to the emitter electrode 21.

The gate finger 26P and the protection diode 40Q are disposed at opposite sides of the temperature sensing diode 40P. The first connection line 71 is disposed between the gate finger 26P and the temperature sensing diode 40P in the x-direction. As shown in FIG. 13, the gate finger 26P includes an inner interconnect 26Pa. The inner interconnect 26Pa and the diode semiconductor layer 43 of the temperature sensing diode 40P are formed on a surface 38*a* of the insulation film 38. That is, the inner interconnect 26Pa and the diode semiconductor layer 43 are located on the same position in the z-direction. The gate finger 26P includes an outer interconnect 26Pb. The first connection line 71, the outer interconnect 26Pb, the second interconnect 52, and the third interconnect 53 are formed on the surface 39*b* of the intermediate insulation film 39. That is, the first connection line 71, the outer interconnect 26Pb of the gate finger 26P, the second interconnect 52, and the third interconnect 53 are located on the same position in the z-direction. The first connection line 71, the outer interconnect 26Pb of the gate finger 26P, the second interconnect 52, and the third interconnect 53 are located at a position different from the positions of the inner interconnect 26Pa and the diode semiconductor layer 43 in the z-direction. In the present embodiment, the first connection line 71, the outer interconnect 26Pb of the gate finger 26P, the second interconnect 52, and the third interconnect 53 are each disposed at a position farther from the semiconductor substrate 30 than the inner interconnect 26Pa and the diode semiconductor layer 43 in the z-direction.

As shown in FIG. 9, the gate finger 26Q and the temperature sensing diode 40P are disposed at opposite sides of the protection diode 40Q. The second connection line 72 is disposed between the gate finger 26Q and the protection diode 40Q in the x-direction. As shown in FIG. 13, the gate finger 26Q includes an inner interconnect 26Qa. The inner interconnect 26Qa and the diode semiconductor layer 43 of the protection diode 40Q are formed on the surface 38*a* of the insulation film 38. That is, the inner interconnect 26Qa and the diode semiconductor layer 43 are located on the same position in the z-direction. The gate finger 26Q includes an outer interconnect 26Qb. The second connection line 72, the outer interconnect 26Qb, the second interconnect 62, and the third interconnect 63 are located on the same position in the z-direction. The second connection line 72, the outer interconnect 26Qb of the gate finger 26Q, the second interconnect 62, and the third interconnect 63 are located at a position different from the positions of the inner interconnect 26Qa and the diode semiconductor layer 43 in the z-direction. In the present embodiment, the second connection line 72, the outer interconnect 26Qb of the gate finger 26Q, the second interconnect 62, and the third interconnect 63 are each disposed at a position farther from the semiconductor substrate 30 than the inner interconnect 26Qa and the diode semiconductor layer 43 in the z-direction.

As shown in FIG. 2, in the present embodiment, the adjacent region 21P surrounds the temperature sensing diode 40P and the protection diode 40Q. The adjacent region 21P is a region of the emitter electrode 21 (the emitter electrode pad 11) that defines the diode mount 21*b* surrounding the temperature sensing diode 40P and the protection diode 40Q. Therefore, the adjacent region 21P includes a portion that is adjacent to the second interconnect lead region 21*bb* (refer to FIG. 9) in the y-direction.

As shown in FIG. 9, the second electrode 42P (cathode) of the temperature sensing diode 40P is connected to the adjacent region 21P by the second connection line 72. In other words, the second electrode 42P of the temperature sensing diode 40P is electrically connected to the emitter electrode 21. Thus, the emitter electrode 21 also serves as the cathode electrode of the temperature sensing diode 40P. In addition, the first electrode 41Q (anode) of the protection diode 40Q is connected to the adjacent region 21P by the second connection line 72. In other words, the first electrode 41Q of the protection diode 40Q is electrically connected to the emitter electrode 21. Thus, the emitter electrode 21 also serves as the anode electrode of the protection diode 40Q.

Operation of First Embodiment

Figure 14:
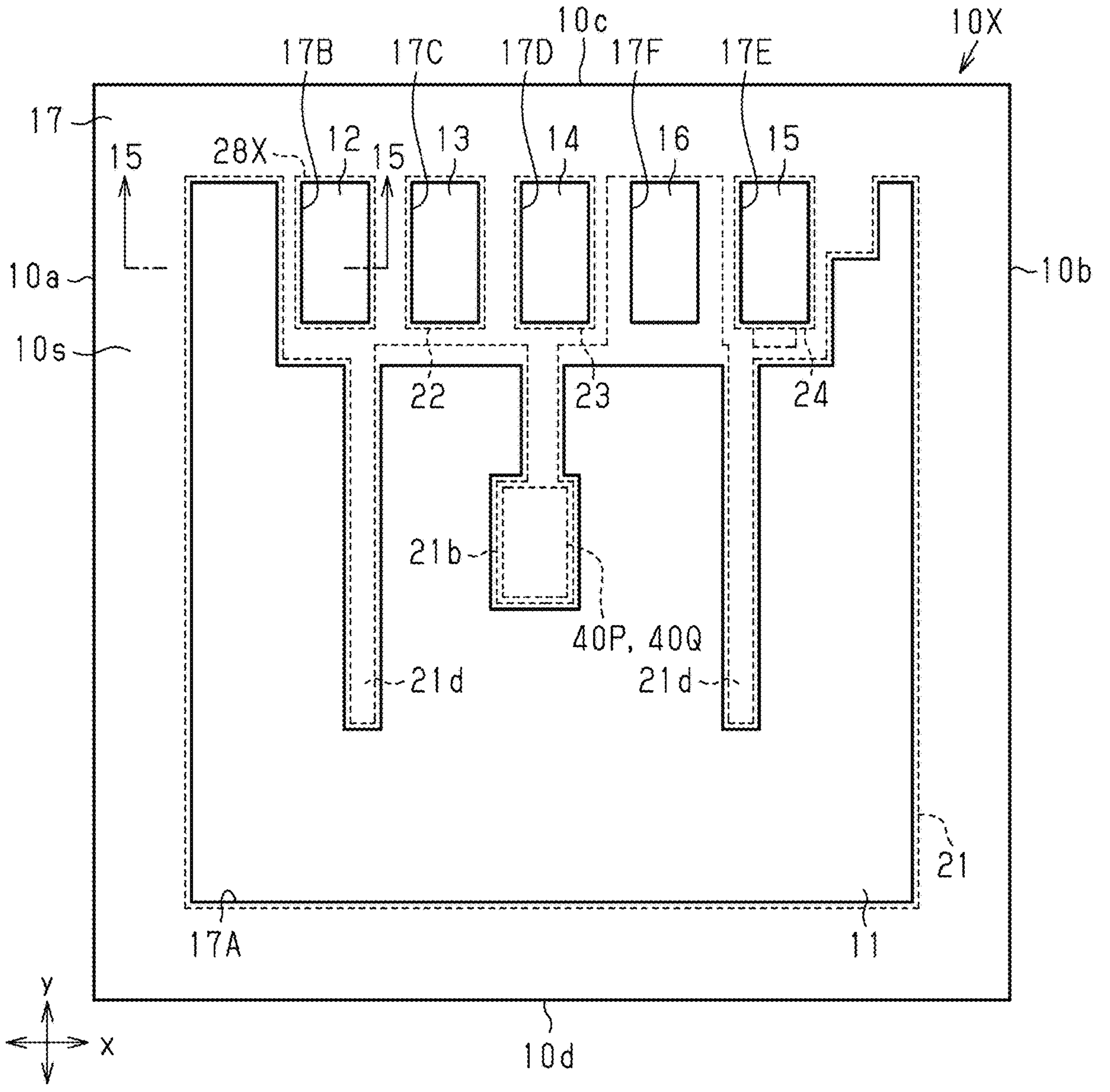
FIG. 14 is a plan view showing a comparative example of a semiconductor device.
Figure 15:
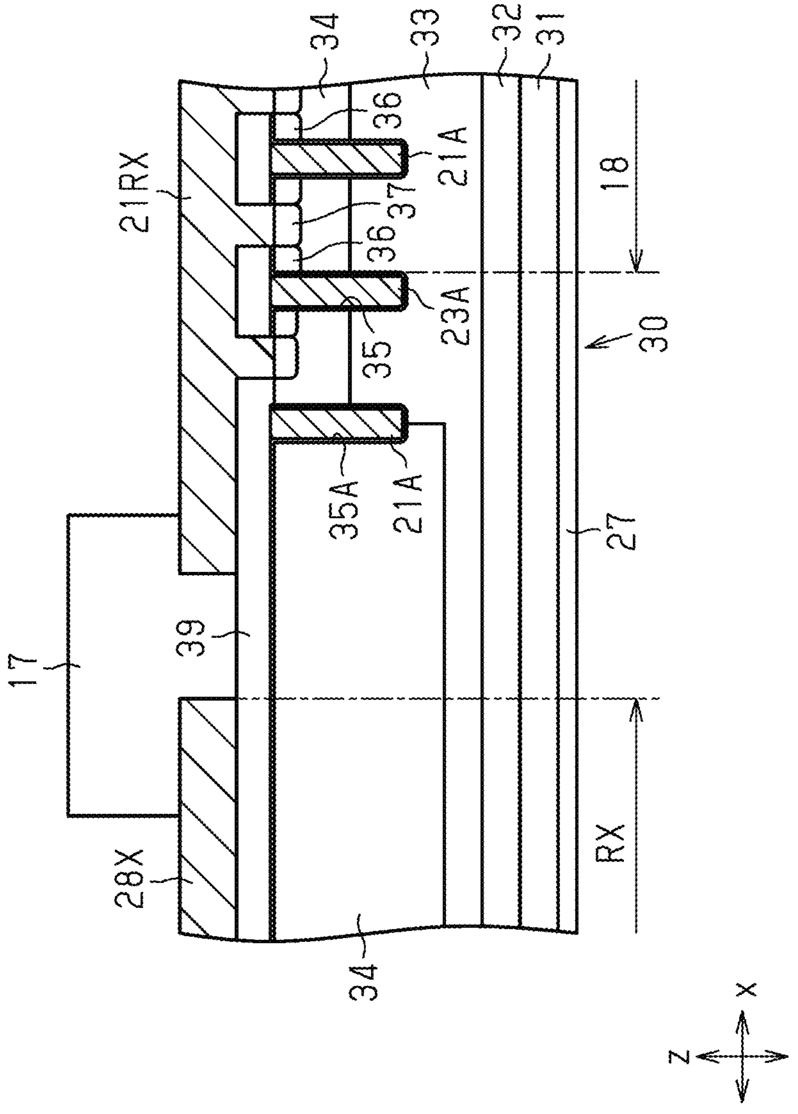
FIG. 15 is a cross-sectional view of the semiconductor device taken along line 15-15 in FIG. 14.

The operation of the semiconductor device 10 of the present embodiment will be described. FIG. 14 is a plan view of a comparative example of a semiconductor device 10X. FIG. 15 is a cross-sectional view of the semiconductor device 10X taken along line 15-15 in FIG. 14. In the semiconductor device 10X of the comparative example, the second electrode 42P of the temperature sensing diode 40P is not electrically connected to the emitter electrode 21.

As shown in FIG. 14, the semiconductor device 10X of the comparative example includes a cathode electrode 28X and an emitter electrode 21RX that are formed separately. The cathode electrode 28X is spaced apart from the emitter electrode 21RX. The cathode electrode 28X is disposed between the emitter electrode 21RX and the anode electrode 22 in the x-direction. Although not shown, the second electrode 42P of the temperature sensing diode 40P is electrically connected to the cathode electrode 28X.

As shown in FIG. 15, in the semiconductor device 10X of the comparative example, the cathode electrode 28X is insulated from the emitter electrode 21RX. Thus, as viewed in the z-direction, the semiconductor substrate 30 includes a region RX overlapping the cathode electrode 28X, and the region RX does not have a contact with the emitter electrode 21RX. Thus, the main cell cannot be formed in the region RX.

In the semiconductor device 10 of the present embodiment, the emitter electrode 21 is electrically connected to the second electrode 42P of the temperature sensing diode 40P. This allows the emitter electrode 21 to include the cathode electrode pad 12. Thus, the emitter electrode 21 serves as the cathode electrode 28X, which is used in the semiconductor device 10X of the comparative example. More specifically, in the present embodiment, the semiconductor device 10 includes the emitter electrode 21 in which the emitter electrode 21RX is integrated with the cathode electrode 28X. Thus, as shown in FIG. 6, the region RK of the semiconductor substrate 30 overlapping the cathode electrode pad 12 has a contact with the emitter electrode 21. This allows for formation of the main cell 18A in the region RK.

In a typical temperature sensing diode, as the area of the joint between the p-type first semiconductor region and the n-type second semiconductor region increases, the amount of current flowing from the first semiconductor region to the second semiconductor region increases. This increases the temperature detecting accuracy of the temperature sensing diode.

A typical diode has a structure in which, for example, as viewed in the z-direction, a first semiconductor region and a second semiconductor region are rectangular and disposed adjacent to each other and joined to each other. Thus, the joined surface is linear as viewed in the z-direction. Hence, the length of the joined surface of the first semiconductor region and the second semiconductor region as viewed in the z-direction is equal to the length of a side of the diode that is in a direction orthogonal to the arrangement direction of the first semiconductor region and the second semiconductor region as viewed in the z-direction.

In the present embodiment, as shown in FIG. 8, the temperature sensing diode 40P includes the p-type first semiconductor region 44P having the circular circumferential surface 44Pa and the n-type second semiconductor region 45P having the inner circumferential surface 45Pa joined to the circumferential surface 44Pa. In the present embodiment, the inner circumferential surface 45Pa is joined to the circumferential surface 44Pa along the entire perimeter of the circumferential surface 44Pa. That is, the joined surface of the first semiconductor region 44P and the second semiconductor region 45P is circular as viewed in the z-direction. Therefore, when the outer shape of the first semiconductor region 44P is increased, the length of the joined surface of the first semiconductor region 44P and the second semiconductor region 45P as viewed in the z-direction (the length of the circumferential surface 44Pa of the first semiconductor region 44P as viewed in the z-direction) becomes longer than the length of one side of the outer surface 45Pb of the second semiconductor region 45P. Thus, the area of the joint between the first semiconductor region 44P and the second semiconductor region 45P is increased as compared to a typical diode.

Advantages of First Embodiment

The semiconductor device 10 of the present embodiment has the following advantages.

(1-1) The semiconductor device 10 includes the semiconductor substrate 30, the main cell 18A disposed on the semiconductor substrate 30, the intermediate insulation film 39 covering the main cell 18A, the emitter electrode 21 stacked on the intermediate insulation film 39, the temperature sensing diode 40P configured to detect temperature and including the first electrode 41P and the second electrode 42P, and the anode electrode 22 configured to externally connect the first electrode 41P. The emitter electrode 21 includes the emitter electrode pad 11, serving as the first bonding region configured to be electrically connected to the second electrode 42P and bonded to the first conductive member CB configured to externally connect the emitter electrode 21, and the cathode electrode pad 12, serving as the second bonding region configured to be bonded to the second conductive member CWA configured to externally connect the second electrode 42P. As viewed in the z-direction, the main cell 18A is disposed in the region RE (first semiconductor region) overlapping the emitter electrode pad 11 and the region RK (second semiconductor region) overlapping the cathode electrode pad 12 in the semiconductor substrate 30.

This structure enlarges the region in which the main cell 18A is formed. Thus, while the size of the semiconductor device 10 remains the same, the number of main cells 18A in the semiconductor device 10 may be increased. This reduces the on-resistance of the semiconductor device 10. In addition, while maintaining the region in which the main cells 18A are formed, the region for formation of the cathode electrode 28X is eliminated. Thus, while limiting an increase in the on-resistance of the semiconductor device 10, the semiconductor device 10 may be reduced in size. This results in cost reduction of the semiconductor device 10.

(1-2) The emitter electrode pad 11 includes the adjacent region 21P surrounding the temperature sensing diode 40P. The temperature sensing diode 40P is disposed in the diode mount 21*b* surrounded by the adjacent region 21P. The second electrode 42P of the temperature sensing diode 40P is connected to the adjacent region 21P.

This structure shortens the interconnect that connects the second electrode 42P of the temperature sensing diode 40P and the adjacent region 21P. This reduces the effect of noise caused by the interconnect on the temperature sensing diode 40P.

(1-3) The cathode electrode pad 12 and the anode electrode pad 13 are arranged next to each other along the electrode mount region 10*ce* of the semiconductor substrate 30.

In this structure, the cathode electrode pad 12 and the anode electrode pad 13 are gathered. This facilitates the task for sequentially bonding the electrode pads 12 and 13 to the conductive member.

(1-4) The semiconductor device 10 includes the protective insulation film 17 covering the emitter electrode 21. The protective insulation film 17 includes the first opening 17A exposing the emitter electrode pad 11 and the second opening 17B exposing the cathode electrode pad 12. The protective insulation film 17 includes the partition region 17*a* separating the first opening 17B from the second opening 17A.

With the structure in which the protective insulation film 17 (partition region 17*a*) is present between the first opening 17A and the second opening 17B, for example, when the first conductive member CB is bonded to the emitter electrode pad 11 by a conductive bonding material such as solder, entrance of the conductive bonding material into the second opening 17B is hindered.

(1-5) The temperature sensing diode 40P includes the multiple diode cells 40A to 40D. The diode cells 40A to 40D are connected in series to each other.

This structure increases the temperature coefficient of the temperature sensing diode 40P. Thus, the temperature detecting accuracy of the temperature sensing diode 40P is increased.

(1-6) The semiconductor device 10 includes the protection diode 40Q connected in antiparallel to the temperature sensing diode 40P. This structure reduces the effect of surge on the temperature sensing diode 40P.

(1-7) The temperature sensing diode 40P includes the diode cells 40A to 40D, each including the first semiconductor region 44P of the first conductive type and the second semiconductor region 45P of the second conductive type that are formed on the surface 38*a* of the insulation film 38. The second semiconductor region 45P annularly surrounds the first semiconductor region 44P. The inner circumferential surface 45Pa of the second semiconductor region 45P is joined to the first semiconductor region 44P.

In this structure, the area of the joint between the first semiconductor region 44P and the second semiconductor region 45P is increased as compared with a structure in which the first region and the second region are joined to each other at one side. This increases the temperature coefficient of the temperature sensing diode 40P. Thus, the temperature detecting accuracy of the temperature sensing diode 40P is increased.

(1-8) As viewed in the z-direction, the first semiconductor region 44P is circular. The second semiconductor region 45P includes an inner circumferential surface 45Pa joined to the circumferential surface 44Pa of the first semiconductor region 44P along the entire perimeter of the circumferential surface 44Pa of the first semiconductor region 44P.

In this structure, the joined surface formed of the circumferential surface 44Pa of the first semiconductor region 44P and the inner circumferential surface 45Pa of the second semiconductor region 45P does not include a corner. This limits concentration of the density of current flowing from the first semiconductor region 44P to the second semiconductor region 45P.

(1-9) The first length measuring pattern 46P is disposed in the first semiconductor region 44P of the first diode cell 40A, and the second length measuring pattern 47P is disposed in the second semiconductor region 45P. With this structure, the dimensions of the first semiconductor region 44P are calculated by measuring the first length measuring pattern 46P, and the dimensions of the second semiconductor region 45P are calculated by measuring the second length measuring pattern 47P. Thus, the dimensions of the first semiconductor region 44P and the second semiconductor region 45P are obtained without directly measuring the dimensions of the first semiconductor region 44P and the second semiconductor region 45P, which are relatively large dimensions. The second to fourth diode cells 40B to 40D and the first to fourth protection diode cells 40E to 40H also have the same advantages.

(1-10) The first through interconnect 81P is connected to the first semiconductor region 44P of the first diode cell 40A at a position differing from that of the first length measuring pattern 46P. The second through interconnect 82P is connected to the second semiconductor region 45P of the first diode cell 40A at a position differing from that of the second length measuring pattern 47P.

In this structure, the first through interconnect 81P is connected to the first semiconductor region 44P at a position differing from that of the first length measuring pattern 46P, which is a non-doped layer. This limits increases in the resistance between the first through interconnect 81P and the first semiconductor region 44P. Also, the second through interconnect 82P is connected to the second semiconductor region 45P at a position differing from that of the second length measuring pattern 47P, which is a non-doped layer. This limits increases in the resistance between the second through interconnect 82P and the second semiconductor region 45P. The third to eighth through interconnects 83P to 88P and the first to eighth through interconnects 81Q to 88Q also have the same advantages.

Second Embodiment

A second embodiment of a semiconductor device 10 will now be described with reference to FIGS. 16 and 17. The semiconductor device 10 of the present embodiment differs from the semiconductor device 10 of the first embodiment in the structure of an electrode pad. In the following description, differences from the semiconductor device 10 of the first embodiment will be described in detail. Same reference characters are given to those components that are the same as the corresponding components of the semiconductor device 10 of the first embodiment. Such components will not be described in detail.

Figure 16:
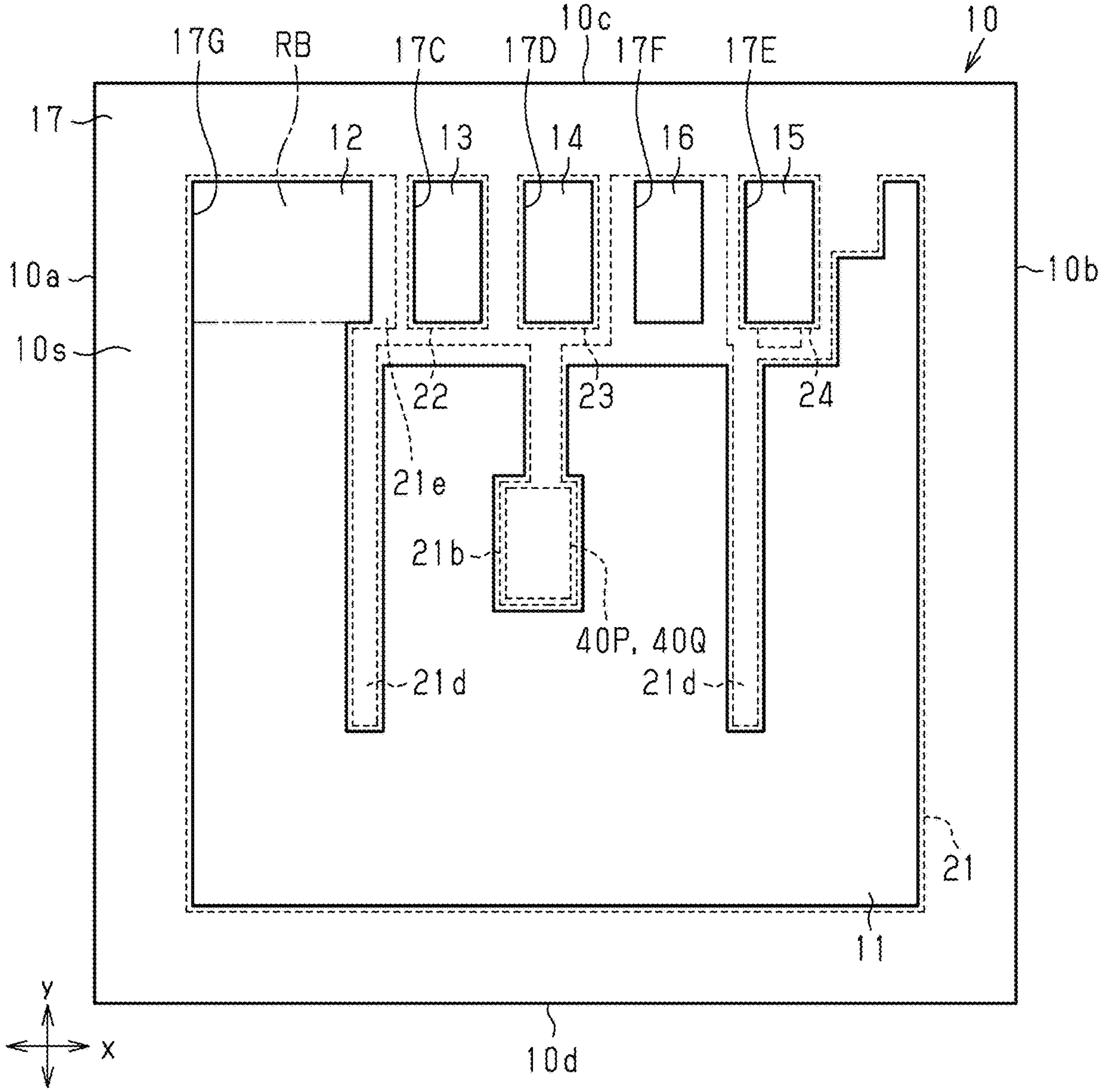
FIG. 16 is a plan view showing a second embodiment of a semiconductor device.

As shown in FIG. 16, the semiconductor device 10 of the present embodiment differs from the first embodiment in that the protective insulation film 17 includes an opening 17G instead of the first opening 17B and the second opening 17G (refer to FIG. 1). That is, the partition region 17*a* (refer to FIG. 1) is omitted from the protective insulation film 17. This integrates the first opening 17A and the second opening 17B to obtain the opening 17G. In other words, the opening 17G exposes the emitter electrode pad 11, the cathode electrode pad 12, and a region between the emitter electrode pad 11 and the cathode electrode pad 12. In the present embodiment, the portion of the emitter electrode 21 exposed by the opening 17G is divided into the first bonding region RA and the second bonding region RB.

The first bonding region RA is a portion of the emitter electrode 21 located closer to the device side surface 10*d* than the electrodes 22 to 24 and is configured to be bonded to the first conductive member CB, which is configured to externally connect the emitter electrode 21. The first bonding region RA is formed over a large portion of the emitter electrode 21, that is, a large portion of the emitter electrode 21 exposed by the opening 17G.

The second bonding region RB includes the cathode electrode pad 12 and defines one of the opposite ends of the opening 17G in the y-direction located closer to the device side surface 10*c*. The second bonding region RB is configured to be bonded to the second conductive member CWA, which is configured to externally connect the second electrode 42P of the temperature sensing diode 40P. The second bonding region RB is disposed adjacent to the anode electrode 22 in the x-direction.

Figure 17:
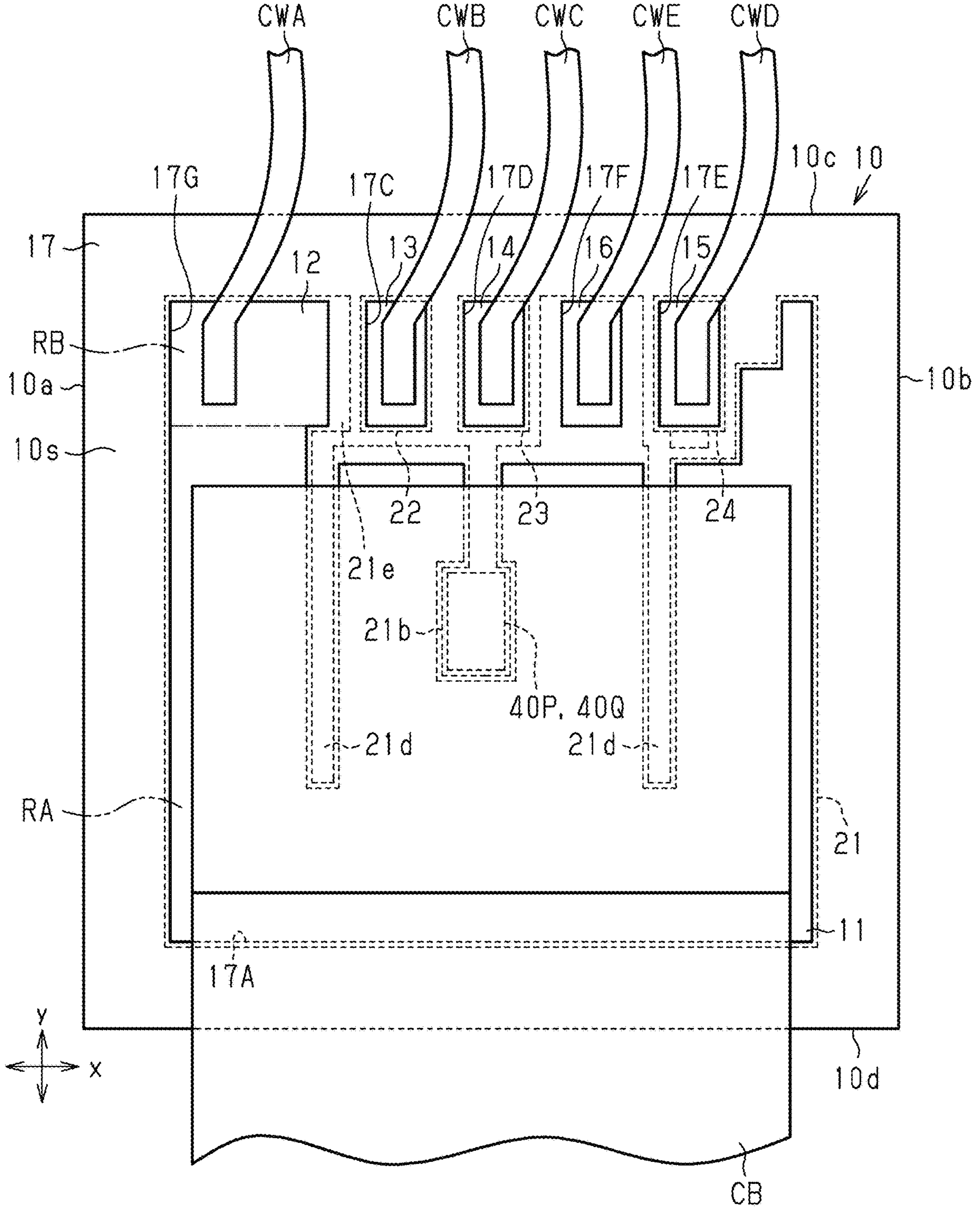
FIG. 17 is a plan view of the semiconductor device shown in FIG. 16 to which conductive members are bonded.

As shown in FIG. 17, the first conductive member CB is bonded to the first bonding region RA by a conductive bonding material such as solder. The second conductive member CWA is bonded to the second bonding region RB by a wire bonding machine.

Advantages of Second Embodiment

The semiconductor device 10 of the present embodiment has the following advantages in addition to the advantages (1-1) to (1-3) and (1-5) to (1-11) of the first embodiment.

(2-1) The protective insulation film 17 includes the opening 17G exposing the first bonding region RA and the second bonding region RB. This structure increases the area of the emitter electrode 21 exposed from the protective insulation film 17, thereby improving heat dissipation.

Third Embodiment

A third embodiment of a semiconductor device 10 will now be described with reference to FIGS. 18 to 21. The semiconductor device 10 of the present embodiment differs from the semiconductor device 10 of the first embodiment in the structure of the temperature sensing diode 40P. In the following description, differences from the semiconductor device 10 of the first embodiment will be described in detail. Same reference characters are given to those components that are the same as the corresponding components of the semiconductor device 10 of the first embodiment. Such components will not be described in detail.

Figure 18:
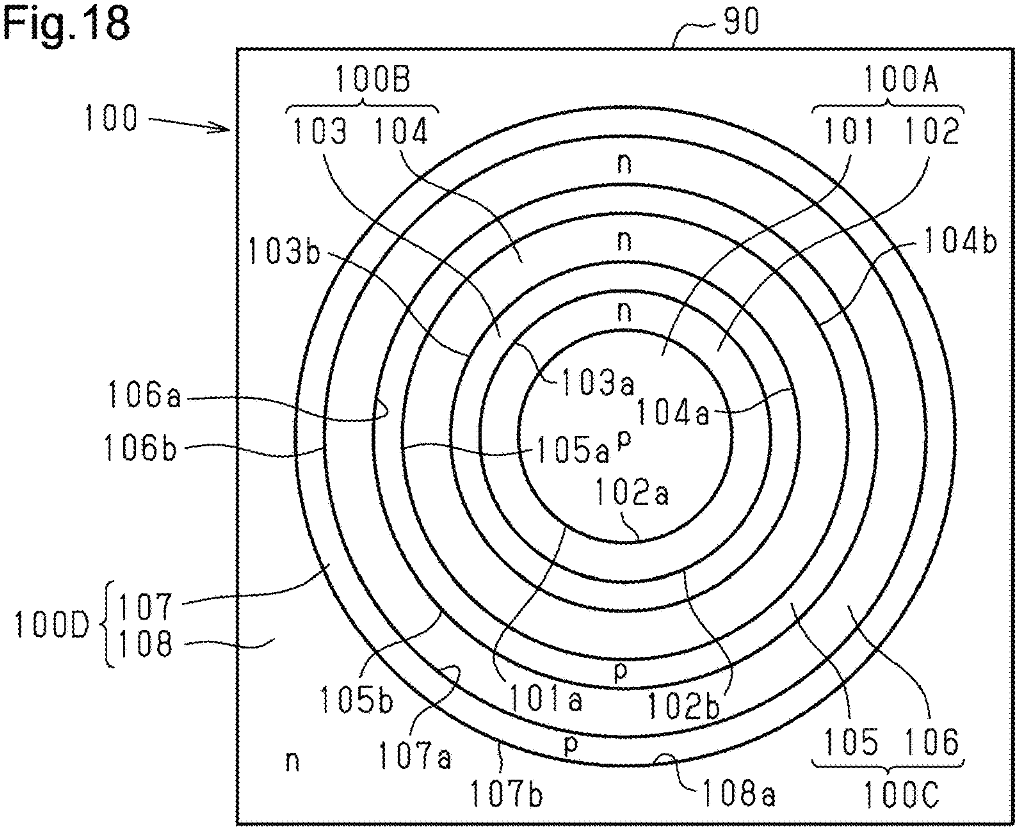
FIG. 18 is a schematic plan view of a temperature sensing diode and a protection diode mounted on a third embodiment of a semiconductor device.
Figure 18:
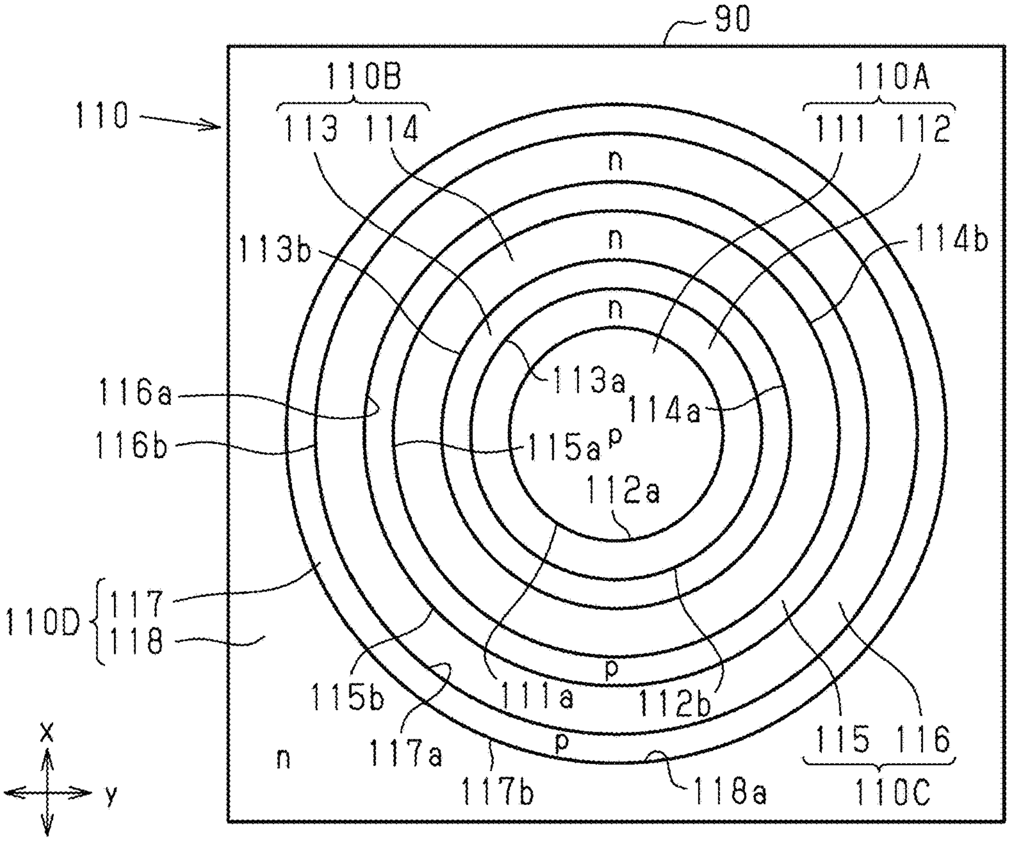
Figure 19:
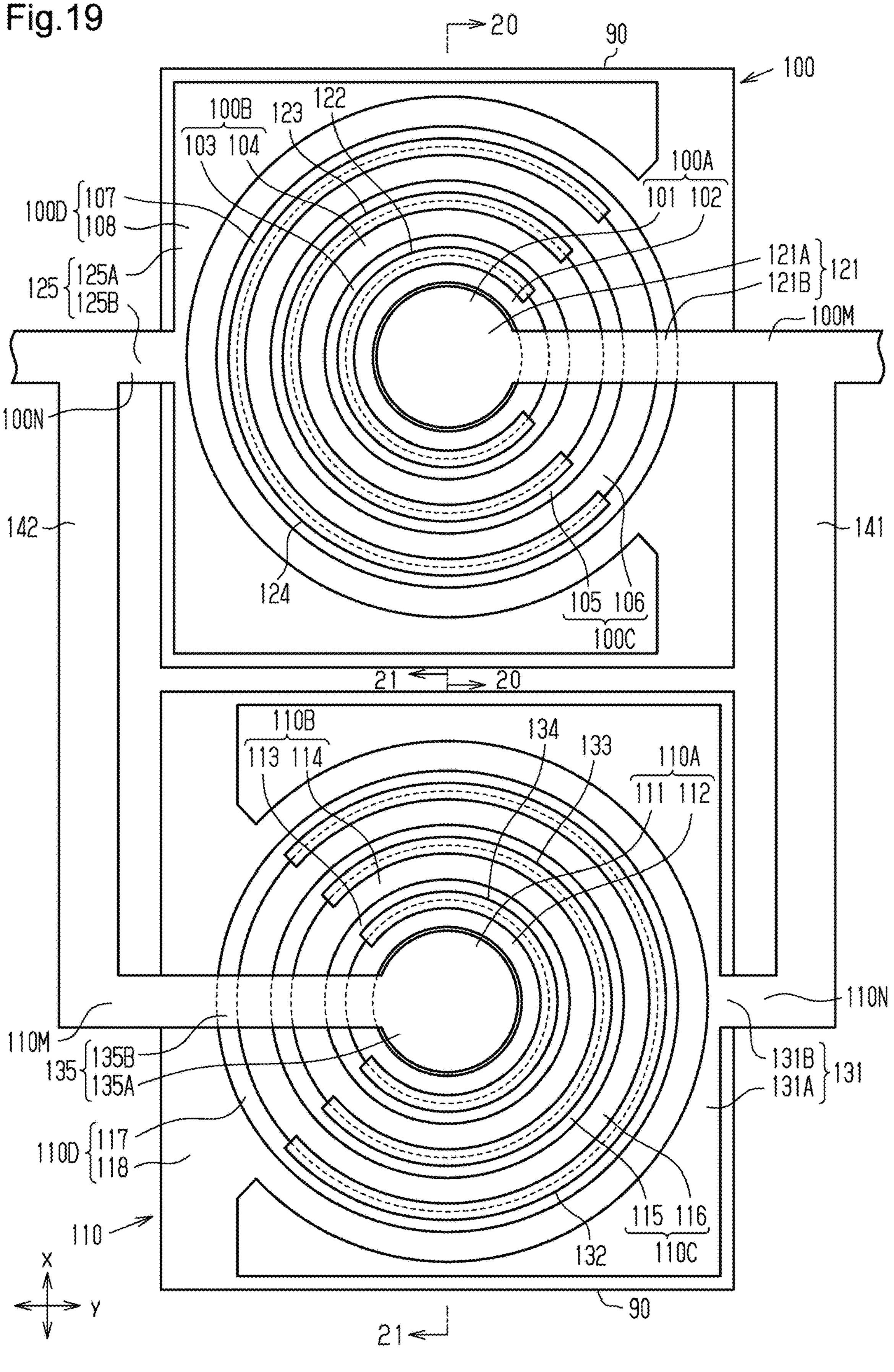
FIG. 19 is a schematic plan view of the temperature sensing diode and the protection diode shown in FIG. 18 connected to interconnects.
Figure 20:
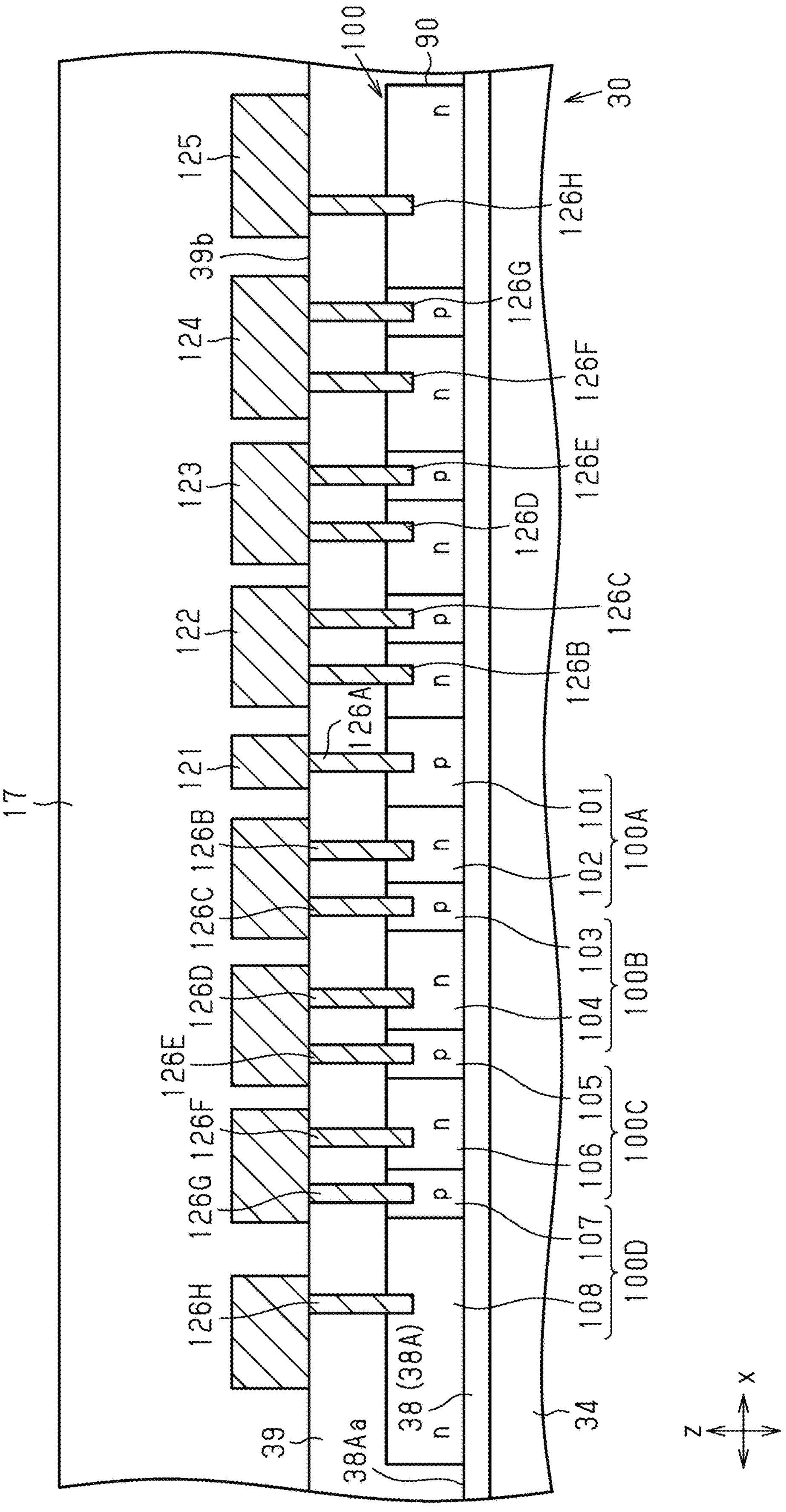
FIG. 20 is a cross-sectional view of the temperature sensing diode taken along line 20-20 in FIG. 19.
Figure 21:
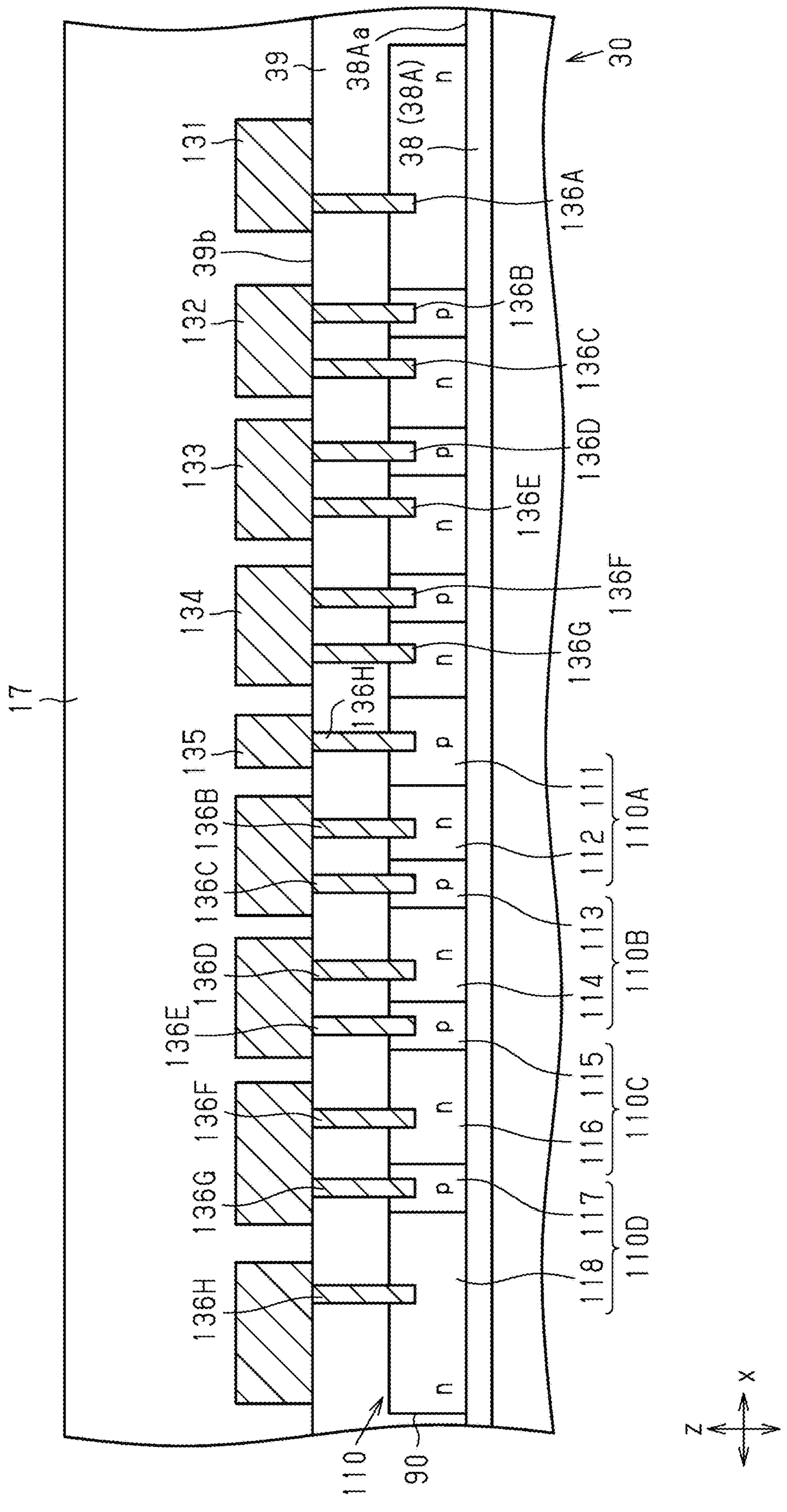
FIG. 21 is a cross-sectional view of the protection diode taken along line 21-21 shown in FIG. 19.

FIG. 18 is a schematic plan view showing the structure of the temperature sensing diodes 40P and the protection diode 40Q according to the third embodiment. FIG. 19 is a schematic plan view showing the interconnects for the temperature sensing diode 40P and the protection diode 40Q shown in FIG. 18. FIG. 20 is a cross-sectional view showing the structure of the temperature sensing diode 40P and the interconnects taken along line 20-20 in FIG. 19 and schematically showing a connection structure of the temperature sensing diode 40P and the interconnects. FIG. 21 is a cross-sectional view showing the structure of the protection diode 40Q and the interconnects taken along line 21-21 in FIG. 19 and schematically showing a connection structure between the protection diode 40Q and the interconnects.

As shown in FIG. 18, as in the first embodiment, the semiconductor device 10 includes the insulation film 38A formed on the substrate front surface 30*s* and the diode semiconductor layer 90 formed on the surface 38Aa of the insulation film 38A.

The semiconductor device 10 includes a temperature sensing diode 100 including multiple diode cells and a protection diode 110 including multiple protection diode cells. As in the first embodiment, the protection diode 110 is connected in antiparallel to the temperature sensing diode 100. The temperature sensing diode 100 and the protection diode 110 are arranged as separate diode semiconductor layers 90.

The temperature sensing diode 100 and the protection diode 110 are aligned with each other in the y-direction and are spaced apart from each other in the x-direction.

In the present embodiment, the temperature sensing diode 100 includes first to fourth diode cells 100A to 100D, which are four diode cells connected in series to each other. The diode cells 100A to 100D are formed on one diode semiconductor layer 90.

The first diode cell 100A includes a first semiconductor region 101 of the first conductive type and a second semiconductor region 102 of the second conductive type. In the present embodiment, the first conductive type is p-type, and the second conductive type is n-type. The second semiconductor region 102 annularly surrounds the first semiconductor region 101. In the present embodiment, as viewed in the z-direction, the first semiconductor region 101 is circular. The second semiconductor region 102 is annular and includes an inner circumferential surface 102*a* joined to a circumferential surface 101*a* of the first semiconductor region 101 along the entire perimeter of the circumferential surface 101*a* of the first semiconductor region 101.

The second diode cell 100B is arranged separately from the first diode cell 100A. The second diode cell 100B includes a third semiconductor region 103 of the first conductive type and a fourth semiconductor region 104 of the second conductive type.

The third semiconductor region 103 annularly surrounds the second semiconductor region 102. The third semiconductor region 103 is annular and includes an inner circumferential surface 103*a* joined to an outer circumferential surface 102*b* of the second semiconductor region 102 along the entire perimeter of the outer circumferential surface 102*b* of the second semiconductor region 102. The width of the third semiconductor region 103 (the radial dimension of the third semiconductor region 103 between the inner circumferential surface 103*a* and the outer circumferential surface 103*b*) is less than or equal to the width of the second semiconductor region 102 (the radial dimension of the second semiconductor region 102 between the inner circumferential surface 102*a* and the outer circumferential surface 102*b*). In the present embodiment, the width of the third semiconductor region 103 is less than the width of the second semiconductor region 102.

The fourth semiconductor region 104 annularly surrounds the third semiconductor region 103. The fourth semiconductor region 104 is annular and includes an inner circumferential surface 104*a* joined to an outer circumferential surface 103*b* of the third semiconductor region 103 along the entire perimeter of the outer circumferential surface 103*b* of the third semiconductor region 103. The width of the fourth semiconductor region 104 (the radial dimension between the inner circumferential surface 104*a* and the outer circumferential surface 104*b*) is greater than or equal to the width of the third semiconductor region 103. In the present embodiment, the width of the fourth semiconductor region 104 is greater than the width of the third semiconductor region 103 and is equal to the width of the second semiconductor region 102.

The third diode cell 100C is arranged separately from the first diode cell 100A and the second diode cell 100B. The third diode cell 100C includes a fifth semiconductor region 105 of the first conductive type and a sixth semiconductor region 106 of the second conductive type.

The fifth semiconductor region 105 annularly surrounds the fourth semiconductor region 104. The fifth semiconductor region 105 is annular and includes an inner circumferential surface 105*a* joined to an outer circumferential surface 104*b* of the fourth semiconductor region 104 along the entire perimeter of the outer circumferential surface 104*b* of the fourth semiconductor region 104. The width of the fifth semiconductor region 105 (the radial dimension of the fifth semiconductor region 105 between the inner circumferential surface 105*a* and the outer peripheral surface 105*b*) is less than or equal to the width of the fourth semiconductor region 104. In the present embodiment, the width of the fifth semiconductor region 105 is less than the width of the fourth semiconductor region 104 and is equal to the width of the third semiconductor region 103.

The sixth semiconductor region 106 annularly surrounds the fifth semiconductor region 105. The sixth semiconductor region 106 is annular and includes an inner circumferential surface 106*a* joined to an outer circumferential surface 105*b* of the fifth semiconductor region 105 along the entire perimeter of the outer circumferential surface 105*b* of the fifth semiconductor region 105. The width of the sixth semiconductor region 106 (the radial dimension of the sixth semiconductor region 106 between the inner circumferential surface 106*a* and the outer circumferential surface 106*b*) is greater than or equal to the width of the fifth semiconductor region 105. In the present embodiment, the width of the sixth semiconductor region 106 is greater than the width of the fifth semiconductor region 105 and is equal to the width of the fourth semiconductor region 104.

The fourth diode cell 100D is arranged separately from the first to third diode cells 100A to 100C. The fourth diode cell 100D includes a seventh semiconductor region 107 of the first conductive type and an eighth semiconductor region 108 of the second conductive type.

The seventh semiconductor region 107 annularly surrounds the sixth semiconductor region 106. The sixth semiconductor region 106 is annular and includes an inner circumferential surface 107*a* joined to an outer circumferential surface 105*b* of the fifth semiconductor region 105 along the entire perimeter of the outer circumferential surface 105*b* of the fifth semiconductor region 105. The width of the seventh semiconductor region 107 (the radial dimension of the seventh semiconductor region 107 between the inner circumferential surface 107*a* and the outer circumferential surface 107*b*) is less than or equal to the width of the sixth semiconductor region 106. In the present embodiment, the width of the seventh semiconductor region 107 is less than the width of the sixth semiconductor region 106 and is equal to the width of the fifth semiconductor region 105.

The eighth semiconductor region 108 annularly surrounds the seventh semiconductor region 107. The eighth semiconductor region 108 includes an inner circumferential surface 108*a* joined to the outer circumferential surface 107*b* of the seventh semiconductor region 107 along the entire perimeter of the outer circumferential surface 107*b* of the seventh semiconductor region 107. As viewed in the z-direction, the eighth semiconductor region 108 is quadrangular.

As shown in FIG. 18, as viewed in the z-direction, the first to eighth semiconductor regions 101 to 108 are concentrically arranged. In other words, the first to fourth diode cells 100A to 100D are concentrically arranged. As viewed in the z-direction, the temperature sensing diode 100 has a structure in which the first conductive type semiconductor regions and the second conductive type semiconductor regions are alternately arranged in the radial direction of the temperature sensing diode 100.

In the present embodiment, the protection diode 110 includes first to fourth protection diode cells 110A to 110D, which are four protection diode cells connected in series to each other. As shown in FIG. 18, the protection diode 110 and the temperature sensing diode 100 have the same structure.

The first protection diode cell 110A includes a first semiconductor region 111 of the first conductive type and a second semiconductor region 112 of the second conductive type. The second semiconductor region 112 annularly surrounds the first semiconductor region 111. As viewed in the z-direction, the first semiconductor region 111 is circular, and the second semiconductor region 112 is annular and includes an inner circumferential surface 112*a* joined to a circumferential surface 111*a* of the first semiconductor region 111 along the entire perimeter of the circumferential surface 111*a* of the first semiconductor region 111.

The second protection diode cell 110B includes a third semiconductor region 113 of the first conductive type and a fourth semiconductor region 114 of the second conductive type. The third semiconductor region 113 is annular and includes an inner circumferential surface 113*a* joined to an outer circumferential surface 112*b* of the second semiconductor region 112 along the entire perimeter of the outer circumferential surface 112*b* of the second semiconductor region 112. The fourth semiconductor region 114 is annular and includes an inner circumferential surface 114*a* joined to an outer circumferential surface 113*b* of the third semiconductor region 113 along the entire perimeter of the outer circumferential surface 113*b* of the third semiconductor region 113.

The third protection diode cell 110C includes a fifth semiconductor region 115 of the first conductive type and a sixth semiconductor region 116 of the second conductive type. The fifth semiconductor region 115 is annular and includes an inner circumferential surface 115*a* joined to an outer circumferential surface 114*b* of the fourth semiconductor region 114 along the entire perimeter of the outer circumferential surface 114*b* of the fourth semiconductor region 114. The sixth semiconductor region 116 is annular and includes an inner circumferential surface 116*a* joined to an outer circumferential surface 115*b* of the fifth semiconductor region 115 along the entire perimeter of the outer circumferential surface 115*b* of the fifth semiconductor region 115.

The fourth protection diode cell 110D includes a seventh semiconductor region 117 of the first conductive type and an eighth semiconductor region 118 of the second conductive type. The seventh semiconductor region 117 is annular and includes an inner circumferential surface 117*a* joined to an outer circumferential surface 116*b* of the sixth semiconductor region 116 along the entire perimeter of the outer circumferential surface 116*b* of the sixth semiconductor region 116. The eighth semiconductor region 118 is annular and includes an inner circumferential surface 118*a* joined to an outer circumferential surface 117*b* of the seventh semiconductor region 117 along the entire perimeter of the outer circumferential surface 117*b* of the seventh semiconductor region 117.

As shown in FIG. 20, the temperature sensing diode 100 and the protection diode 110 are covered by the intermediate insulation film 39 in the same manner as the first embodiment. First to fifth interconnects 121 to 125, which are electrically connected to the temperature sensing diode 100, and first to fifth interconnects 131 to 135, which are electrically connected to the protection diode 110, are disposed on the surface 39*b* of the intermediate insulation film 39. In addition, first to eighth through interconnects 126A to 126H extend through the intermediate insulation film 39 in the z-direction and are connected to the temperature sensing diode 100. First to eighth through interconnects 136A to 136H extend through the intermediate insulation film 39 in the z-direction and are connected to the protection diode 110. Thus, the semiconductor device 10 of the present embodiment includes the intermediate insulation film 39, the first to fifth interconnects 121 to 125 and 131 and to 135 formed on the surface 39*b* of the intermediate insulation film 39, and the first to eighth through interconnects 126A to 126H and 136A to 136H extending through the intermediate insulation film 39. The interconnects 121 to 125 are electrically connected to the temperature sensing diode 100 by the through interconnects 126A to 126H. The interconnects 131 to 135 are electrically connected to the protection diode 110 by the through interconnects 136A to 136H.

The structure of the interconnects in the temperature sensing diode 100 will now be described.

As shown in FIG. 19, the first to fifth interconnects 121 to 125 are spaced apart from each other in the y-direction. In other words, the first to fifth interconnects 121 to 125 are spaced apart from each other in the lateral direction of the temperature sensing diode 100. The second to fourth interconnects 122 to 124 are disposed between the first interconnect 121 and the fifth interconnect 125 in the lateral direction (y-direction) of the temperature sensing diode 100. The second to fourth interconnects 122 to 124 are arranged in the order of the second interconnect 122, the third interconnect 123, and the fourth interconnect 124 in a direction from the first interconnect 121 toward the fifth interconnect 125. The first to fifth interconnects 121 to 125 are insulated from each other.

The temperature sensing diode 100 includes a first electrode 100M serving as an anode electrode and a second electrode 100N serving as a cathode electrode. The first electrode 100M and the second electrode 100N are separately disposed at opposite ends of the temperature sensing diode 100 in the y-direction. The first electrode 100M is disposed at one of the two ends of the temperature sensing diode 100 located farther from the electrode pads 12 to 16 (refer to FIG. 1). The second electrode 100N is disposed at one of the two ends of the temperature sensing diode 100 located closer to the electrode pads 12 to 16.

The first interconnect 121 is electrically connected to the first semiconductor region 101 of the first diode cell 100A to supply current to the first diode cell 100A from the outside of the temperature sensing diode 100. The first interconnect 121 includes a first region connector 121A and a first extension 121B. In the present embodiment, the first region connector 121A is integrated with the first extension 121B.

The first region connector 121A is disposed to overlap the first semiconductor region 101 of the first diode cell 100A as viewed in the z-direction. The first region connector 121A is shaped in conformance with the shape of the first semiconductor region 101 as viewed in the z-direction. In the present embodiment, the first semiconductor region 101 is circular as viewed in the z-direction. Thus, the first region connector 121A is circular as viewed in the z-direction. In the present embodiment, the diameter of the first region connector 121A is slightly smaller than the diameter of the first semiconductor region 101. The diameter of the first region connector 121A may be changed in any manner and may be, for example, greater than or equal to the diameter of the first semiconductor region 101.

The first extension 121B extends from the first region connector 121A toward the outside of the first semiconductor region 101. The first extension 121B extends to the outside of the temperature sensing diode 100. In the present embodiment, the first extension 121B extends from the first region connector 121A in a direction opposite to the second interconnect 122. The first extension 121B includes the first electrode 100M of the temperature sensing diode 100.

As shown in FIG. 20, the first region connector 121A is connected to the first semiconductor region 101 by the first through interconnect 126A. That is, the first through interconnect 126A is configured to connect the first region connector 121A and the first semiconductor region 101. The first through interconnect 126A is disposed to overlap with the first region connector 121A and the first semiconductor region 101 as viewed in the z-direction.

As shown in FIG. 19, as viewed in the z-direction, the second interconnect 122 annularly surrounds the first region connector 121A and includes a gap to avoid contacting the first extension 121B. In the present embodiment, as viewed in the z-direction, the second interconnect 122 has the form of an arc that is open toward the first interconnect 121. As viewed in the z-direction, the second interconnect 122 is disposed to overlap with the second semiconductor region 102 of the first diode cell 100A and the third semiconductor region 103 of the second diode cell 100B. In other words, as viewed in the z-direction, the second interconnect 122 is disposed to extend over the joined surface of the second semiconductor region 102 and the third semiconductor region 103. The joined surface of the second semiconductor region 102 and the third semiconductor region 103 includes the outer circumferential surface 102*b* of the second semiconductor region 102 and the inner circumferential surface 103*a* of the third semiconductor region 103 shown in FIG. 18.

As shown in FIG. 20, the second interconnect 122 is connected to the second semiconductor region 102 of the first diode cell 100A by the second through interconnect 126B. That is, the second through interconnect 126B is configured to connect the second interconnect 122 and the second semiconductor region 102. As viewed in the z-direction, the second through interconnect 126B is disposed to overlap with the second interconnect 122 and the second semiconductor region 102.

The second interconnect 122 is also connected to the third semiconductor region 103 of the second diode cell 100B by the third through interconnect 126C. That is, the third through interconnect 126C is configured to connect the second interconnect 122 and the third semiconductor region 103. As viewed in the z-direction, the third through interconnect 126C is disposed to overlap with the second interconnect 122 and the third semiconductor region 103.

Thus, the second semiconductor region 102 of the first diode cell 100A and the third semiconductor region 103 of the second diode cell 100B are electrically connected by the second interconnect 122, the second through interconnect 126B, and the third through interconnect 126C. In other words, the second interconnect 122, the second through interconnect 126B, and the third through interconnect 126C are configured to connect the first diode cell 100A and the second diode cell 100B in series.

As shown in FIG. 19, as viewed in the z-direction, the third interconnect 123 annularly surrounds the second interconnect 122 and is partially open with a gap. In the present embodiment, as viewed in the z-direction, the third interconnect 123 has the form of an arc that is open toward the second interconnect 122. As viewed in the z-direction, the third interconnect 123 is disposed to overlap with the fourth semiconductor region 104 of the second diode cell 100B. In the present embodiment, the third interconnect 123 is disposed to overlap with the fourth semiconductor region 104 and the fifth semiconductor region 105 of the third diode cell 100C. The third interconnect 123 is disposed to extend over the joined surface of the fourth semiconductor region 104 and the fifth semiconductor region 105. The joined surface of the fourth semiconductor region 104 and the fifth semiconductor region 105 includes the outer circumferential surface 104*b* of the fourth semiconductor region 104 and the inner circumferential surface 105*a* of the fifth semiconductor region 105 shown in FIG. 18.

As shown in FIG. 20, the third interconnect 123 is connected to the fourth semiconductor region 104 of the second diode cell 100B by the fourth through interconnect 126D. That is, the fourth through interconnect 126D is configured to connect the third interconnect 123 and the fourth semiconductor region 104. As viewed in the z-direction, the fourth through interconnect 126D is disposed to overlap with the third interconnect 123 and the fourth semiconductor region 104.

The third interconnect 123 is also connected to the fifth semiconductor region 105 of the third diode cell 100C by the fifth through interconnect 126E. That is, the fifth through interconnect 126E is configured to connect the third interconnect 123 and the fifth semiconductor region 105. As viewed in the z-direction, the fifth through interconnect 126E is disposed to overlap with the third interconnect 123 and the fifth semiconductor region 105.

Thus, the fourth semiconductor region 104 of the second diode cell 100B and the fifth semiconductor region 105 of the third diode cell 100C are electrically connected by the third interconnect 123, the fourth through interconnect 126D, and the fifth through interconnect 126E. In other words, the third interconnect 123, the fourth through interconnect 126D, and the fifth through interconnect 126E are configured to connect the second diode cell 100B and the third diode cell 100C in series.

As shown in FIG. 19, as viewed in the z-direction, the fourth interconnect 124 annularly surrounds the third interconnect 123 and is partially open with a gap. In the present embodiment, as viewed in the z-direction, the fourth interconnect 124 has the form of an arc that is open toward the third interconnect 123. As viewed in the z-direction, the fourth interconnect 124 is disposed to overlap with the sixth semiconductor region 106 of the third diode cell 100C and the seventh semiconductor region 107 of the fourth diode cell 100D. As viewed in the z-direction, the fourth interconnect 124 is disposed to extend over the joined surface of the sixth semiconductor region 106 and the seventh semiconductor region 107. The joined surface of the sixth semiconductor region 106 and the seventh semiconductor region 107 includes the outer circumferential surface 106*b* of the sixth semiconductor region 106 and the inner circumferential surface 107*a* of the seventh semiconductor region 107 shown in FIG. 18.

As shown in FIG. 20, the fourth interconnect 124 is connected to the sixth semiconductor region 106 of the third diode cell 100C by the sixth through interconnect 126F. That is, the sixth through interconnect 126F is configured to connect the fourth interconnect 124 and the sixth semiconductor region 106. As viewed in the z-direction, the sixth through interconnect 126F is disposed to overlap with the fourth interconnect 124 and the sixth semiconductor region 106.

The fourth interconnect 124 is also connected to the seventh semiconductor region 107 of the fourth diode cell 100D by the seventh through interconnect 126G. That is, the seventh through interconnect 126G is configured to connect the fourth interconnect 124 and the seventh semiconductor region 107. As viewed in the z-direction, the seventh through interconnect 126G is disposed to overlap with the fourth interconnect 124 and the seventh semiconductor region 107.

Thus, the sixth semiconductor region 106 of the third diode cell 100C and the seventh semiconductor region 107 of the fourth diode cell 100D are electrically connected by the fourth interconnect 124, the sixth through interconnect 126F, and the seventh through interconnect 126G. In other words, the fourth interconnect 124, the sixth through interconnect 126F, and the seventh through interconnect 126G are configured to connect the third diode cell 100C and the fourth diode cell 100D in series.

As shown in FIG. 19, the fifth interconnect 125 is configured to be electrically connected to the eighth semiconductor region 108 of the fourth diode cell 100D. That is, the fifth interconnect 125 is electrically connected to the second electrode 100N of the temperature sensing diode 100 and the eighth semiconductor region 108 of the fourth diode cell 100D.

As viewed in the z-direction, the fifth interconnect 125 includes a fifth region connector 125A and a fifth extension 125B. In the present embodiment, the fifth region connector 125A is integrated with the fifth extension 125B.

The fifth region connector 125A is disposed to overlap the eighth semiconductor region 108 of the fourth diode cell 100D as viewed in the z-direction. As viewed in the z-direction, the fifth region connector 125A annularly surrounds the seventh semiconductor region 107 of the fourth diode cell 100D and is partially open with a gap.

The fifth extension 125B extends from the fifth region connector 125A toward the outside of the seventh semiconductor region 107. The fifth extension 125B extends to the outside of the temperature sensing diode 100. In the present embodiment, the fifth extension 125B extends from the fifth region connector 125A in a direction opposite to the first interconnect 121.

As shown in FIG. 20, the fifth region connector 125A is connected to the seventh semiconductor region 107 by the eighth through interconnect 126H. That is, the eighth through interconnect 126H is configured to connect the fifth region connector 125A and the seventh semiconductor region 107. As viewed in the z-direction, the eighth through interconnect 126H is disposed to overlap with the fifth region connector 125A and the seventh semiconductor region 107.

Each of the second to eighth through interconnects 126B to 126H may include multiple through interconnects. The multiple second through interconnects 126B are separated from each other. In an example, the second through interconnects 126B are separated from each other in the circumferential direction of the second semiconductor region 102. The multiple third through interconnects 126C are separated from each other. In an example, the third through interconnects 126C are separated from each other in the circumferential direction of the third semiconductor region 103. The multiple fourth through interconnects 126D are separated from each other. In an example, the fourth through interconnects 126D are separated from each other in the circumferential direction of the fourth semiconductor region 104. The multiple fifth through interconnects 126E are separated from each other. In an example, the fifth through interconnects 126E are separated from each other in the circumferential direction of the fifth semiconductor region 105. The multiple sixth through interconnects 126F are separated from each other. In an example, the sixth through interconnects 126F are separated from each other in the circumferential direction of the sixth semiconductor region 106. The multiple seventh through interconnects 126G are separated from each other. In an example, the seventh through interconnects 126G are separated from each other in the circumferential direction of the seventh semiconductor region 107. The multiple eighth through interconnects 126H are separated from each other. In an example, the eighth through interconnects 126H are separated from each other in the circumferential direction of the eighth semiconductor region 108.

The structure of the interconnects in the protection diode 110 will now be described.

The protection diode 110 includes a first electrode 110M serving as an anode electrode and a second electrode 110N serving as a cathode electrode. The first electrode 110M and the second electrode 110N are separately disposed at opposite ends of the protection diode 110 in the y-direction. The first electrode 110M is disposed at one of the two ends of the protection diode 110 located closer to the electrode pads 12 to 16 (refer to FIG. 1). The second electrode 110N is disposed at one of the two ends of the protection diode 110 located farther from the electrode pads 12 to 16.

As shown in FIG. 19, the structures of the first to fifth interconnects 131 to 135 and the through interconnects 136A to 136H are the same as the structures of the first to fifth interconnects 121 to 125 and the through interconnects 126A to 126H. Since the protection diode 110 is connected in antiparallel to the temperature sensing diode 100, arrangement of the first to fifth interconnects 131 to 135 with respect to the protection diode 110 corresponds to 180-degree rotation of arrangement of the first to fifth interconnects 121 to 125 with respect to the temperature sensing diode 100. The schematic structures of the first to fifth interconnects 131 to 135 and the through interconnects 136A to 136H will be described below.

As shown in FIG. 21, the first interconnect 131 is disposed to overlap the eighth semiconductor region 118 of the fourth protection diode cell 110D as viewed in the z-direction and is electrically connected to the eighth semiconductor region 118 by the first through interconnect 136A. Thus, the first through interconnect 136A is configured to connect the first interconnect 131 and the eighth semiconductor region 118 and is disposed to overlap with the first interconnect 131 and the eighth semiconductor region 118 as viewed in the z-direction. The first interconnect 131 includes a first region connector 131A and a first extension 131B. The first region connector 131A is disposed to overlap the eighth semiconductor region 118 as viewed in the z-direction and is connected to the first through interconnect 136A. The first extension 131B extends from the first region connector 131A in a direction opposite to the second interconnect 132. The first extension 131B includes the second electrode 110N of the protection diode 110.

As shown in FIG. 19, the second interconnect 132 is disposed to overlap with the seventh semiconductor region 117 of the fourth protection diode cell 110D and the sixth semiconductor region 116 of the third protection diode cell 110C as viewed in the z-direction. As shown in FIG. 21, the second interconnect 132 is electrically connected to the seventh semiconductor region 117 by the second through interconnect 136B and is electrically connected to the sixth semiconductor region 116 by the third through interconnect 136C. Thus, the second through interconnect 136B is configured to connect the second interconnect 132 and the seventh semiconductor region 117 and is disposed to overlap with the second interconnect 132 and the seventh semiconductor region 117 as viewed in the z-direction. The third through interconnect 136C is configured to connect the second interconnect 132 and the sixth semiconductor region 116 and is disposed to overlap with the second interconnect 132 and the sixth semiconductor region 116 as viewed in the z-direction. Thus, the first protection diode cell 110A and the second protection diode cell 110B are connected in series by the second interconnect 132, the second through interconnect 136B, and the third through interconnect 136C.

As shown in FIG. 19, the third interconnect 133 is disposed to overlap with the fifth semiconductor region 115 of the third protection diode cell 110C and the fourth semiconductor region 114 of the second protection diode cell 110B as viewed in the z-direction. As shown in FIG. 21, the third interconnect 133 is electrically connected to the fifth semiconductor region 115 by the fourth through interconnect 136D and is electrically connected to the fourth semiconductor region 114 by the fifth through interconnect 136E. Thus, the fourth through interconnect 136D is configured to connect the third interconnect 133 and the fifth semiconductor region 115 and is disposed to overlap with the third interconnect 133 and the fifth semiconductor region 115 as viewed in the z-direction. The fifth through interconnect 136E is configured to connect the third interconnect 133 and the fourth semiconductor region 114 and is disposed to overlap with the third interconnect 133 and the fourth semiconductor region 114 as viewed in the z-direction. Thus, the second protection diode cell 110B and the third protection diode cell 110C are connected in series by the third interconnect 133, the fourth through interconnect 136D, and the fifth through interconnect 136E.

As shown in FIG. 19, the fourth interconnect 134 is disposed to overlap with the third semiconductor region 113 of the second protection diode cell 110B and the second semiconductor region 112 of the first protection diode cell 110A as viewed in the z-direction. As shown in FIG. 21, the fourth interconnect 134 is electrically connected to the third semiconductor region 113 by the sixth through interconnect 136F and is electrically connected to the second semiconductor region 112 by the seventh through interconnect 136G. Thus, the sixth through interconnect 136F is configured to connect the fourth interconnect 134 and the third semiconductor region 113 and is disposed to overlap with the fourth interconnect 134 and the third semiconductor region 113 as viewed in the z-direction. The seventh through interconnect 136G is configured to connect the fourth interconnect 134 and the second semiconductor region 112 and is disposed to overlap with the fourth interconnect 134 and the second semiconductor region 112 as viewed in the z-direction. Thus, the first protection diode cell 110A and the second protection diode cell 110B are connected in series by the fourth interconnect 134, the sixth through interconnect 136F, and the seventh through interconnect 136G.

As shown in FIG. 21, the fifth interconnect 135 is disposed to overlap the first semiconductor region 111 of the first protection diode cell 110A as viewed in the z-direction and is electrically connected to the first semiconductor region 111 by the eighth through interconnect 136H. Thus, the eighth through interconnect 136H is configured to connect the fifth interconnect 135 and the first semiconductor region 111 and is disposed to overlap with the fifth interconnect 135 and the first semiconductor region 111 as viewed in the z-direction. As shown in FIG. 19, the fifth interconnect 135 includes a fifth region connector 135A and a fifth extension 135B. The fifth region connector 135A is disposed to overlap the first semiconductor region 111 as viewed in the z-direction and is connected to the eighth through interconnect 136H. The fifth extension 135B extends from the fifth region connector 135A in a direction opposite to the fourth interconnect 134. The fifth extension 135B includes the first electrode 110M of the protection diode 110. Each of second to eighth through interconnects 136B to 136H may include multiple through interconnects.

As shown in FIG. 19, the semiconductor device 10 includes a first connection line 141 and a second connection line 142. The first connection line 141 is an interconnect that connects the first electrode 100M of the temperature sensing diode 100 and the second electrode 110N of the protection diode 110 to the anode electrode 22. The second connection line 142 is an interconnect that connects the second electrode 100N of the temperature sensing diodes 100 and the first electrode 100M of the protection diode 110 to the emitter electrode 21.

The first connection line 141 is connected to the first interconnect 121 and the first interconnect 131. More specifically, the first connection line 141 is connected to the first extension 121B of the first interconnect 121 and the first extension 131B of the first interconnect 131. Although not shown, the first connection line 141 is connected to the anode electrode 22 through the first interconnect lead region 21*ba* in the same manner as the first connection line 71 of the first embodiment.

The second connection line 142 is connected to the fifth interconnect 125 and the fifth interconnect 135. More specifically, the second connection line 142 is connected to the fifth extension 125B of the fifth interconnect 125 and the fifth extension 135B of the fifth interconnect 135. Although not shown, the second connection line 142 is connected to the adjacent region 21P of the emitter electrode 21 through the second interconnect lead region 21*bb*.

Advantage of Third Embodiment

The semiconductor device 10 of the present embodiment has the following advantages in addition to the advantages of the first embodiment.

(3-1) The temperature sensing diode 100 includes the first diode cell 100A and the second diode cell 100B arranged separately from the first diode cell 100A. The first diode cell 100A includes the first semiconductor region 101 of the first conductive type and the second semiconductor region 102 of the second conductive type. The second diode cell 100B includes the third semiconductor region 103 of the first conductive type and the fourth semiconductor region 104 of the second conductive type. The second semiconductor region 102 annularly surrounds the first semiconductor region 101 and includes the inner circumferential surface 102*a* joined to the circumferential surface 101*a* of the first semiconductor region 101. The third semiconductor region 103 annularly surrounds the second semiconductor region 102 and includes the inner circumferential surface 103*a* joined to the outer circumferential surface 102*b* of the second semiconductor region 102. The fourth semiconductor region 104 annularly surrounds the third semiconductor region 103 and includes the inner circumferential surface 104*a* joined to the outer circumferential surface 103*b* of the third semiconductor region 103.

This structure allows for reduction in the space for the first diode cell 100A and the second diode cell 100B while increasing the area of adjacent ones of the first to fourth semiconductor regions 101 to 104 that are joined to each other. This increases the temperature detecting accuracy of the temperature sensing diode 100 and also allows for reduction in the size of the temperature sensing diode 100.

(3-2) The annular first to fourth semiconductor regions 101 to 104 are concentrically arranged. With this structure, the density of the current flowing from the first semiconductor region 101 toward the fourth semiconductor region 104 is likely to be uniform in the circumferential direction of the first semiconductor region 101.

Modified Examples

Each of the embodiments exemplifies, without any intention to limit, an applicable form of a semiconductor device according to the present disclosure. The semiconductor device according to the present disclosure may be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiments. Such components will not be described in detail.

In the first embodiment, the shape of the first semiconductor region 44P of each of the diode cells 40A to 40D in the temperature sensing diode 40P may be changed in any manner. The shape of the first semiconductor region 44P may be changed, for example, as shown in FIGS. 22 to 25. Also, the protection diode cells 40E to 40H of the protection diode 40Q may be changed in the same manner.

Figure 22:
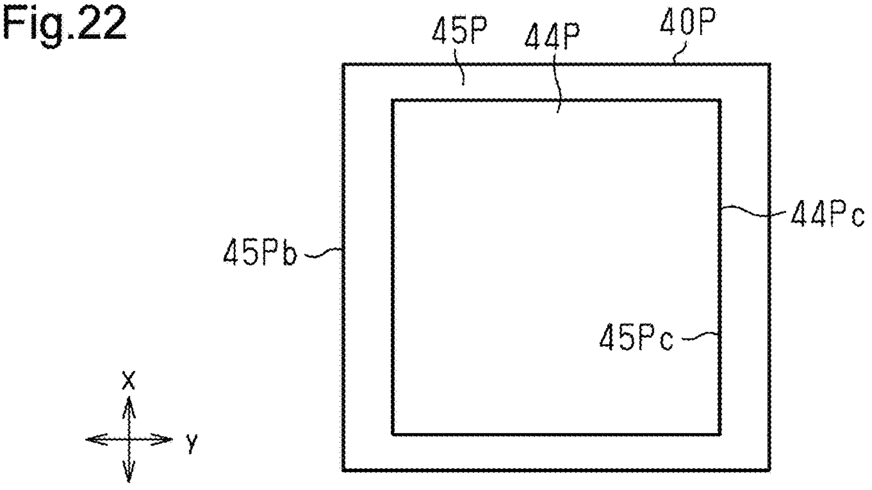
FIG. 22 is a schematic plan view of a diode cell in a modified example of a temperature sensing diode.

As shown in FIG. 22, as viewed in the z-direction, the first semiconductor region 44P is quadrangular. Thus, the first semiconductor region 44P has a quadrangular outer surface 44Pc as viewed in the z-direction. In this case, the second semiconductor region 45P includes an inner surface 45Pc joined to the outer surface 44Pc of the first semiconductor region 44P along the entire perimeter of the outer surface 44Pc of the first semiconductor region 44P. Also, in the same manner as the first embodiment, the second semiconductor region 45P includes an outer surface 45Pb that is quadrangular as viewed in the z-direction. In the example shown in FIG. 20, each side of the outer surface 44Pc in the first semiconductor region 44P is parallel to a side of the outer surface 45Pb in the second semiconductor region 45P corresponding to the side of the outer surface 44Pc.

Figure 23:
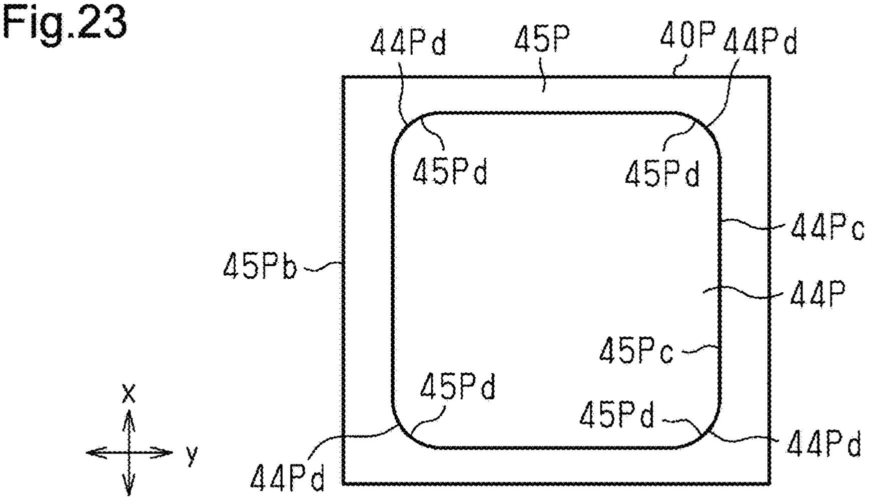
FIG. 23 is a schematic plan view of a diode cell in a modified example of a temperature sensing diode.

As shown in FIG. 23, as viewed in the z-direction, the first semiconductor region 44P is quadrangular and includes curved corners 44Pd. That is, the outer surface 44Pc of the first semiconductor region 44P includes curved corners 44Pd. In this case, the inner surface 45Pc of the second semiconductor region 45P includes corners 45Pd, each of which is curved in conformance with the corner 44Pd in the first semiconductor region 44P. Thus, the inner surface 45Pc of the second semiconductor region 45P is joined to the outer surface 44Pc of the first semiconductor region 44P along the entire perimeter of the outer surface 44Pc of the first semiconductor region 44P.

Figure 24:
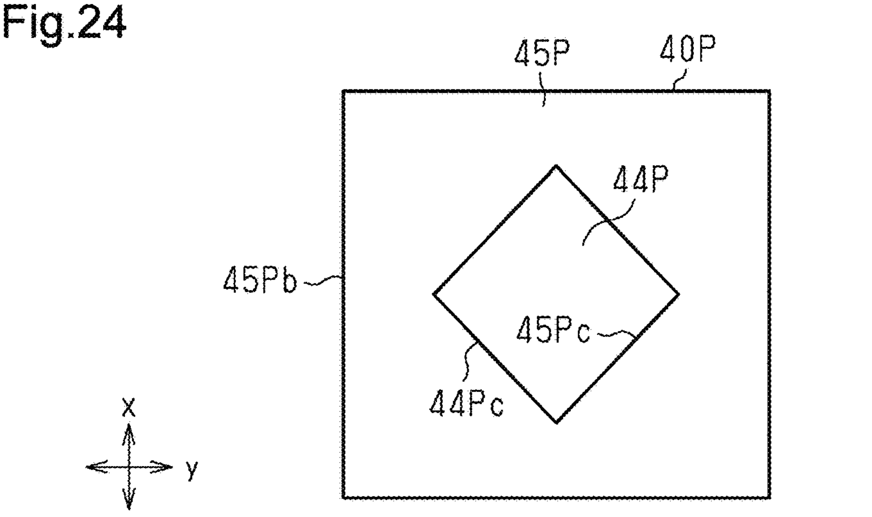
FIG. 24 is a schematic plan view of a diode cell in a modified example of a temperature sensing diode.

As shown in FIG. 24, as viewed in the z-direction, the first semiconductor region 44P is quadrangular. In addition, as viewed in the z-direction, each side of the outer surface 44Pc in the first semiconductor region 44P is oblique to each side of the outer surface 45Pb in the second semiconductor region 45P.

Figure 25:
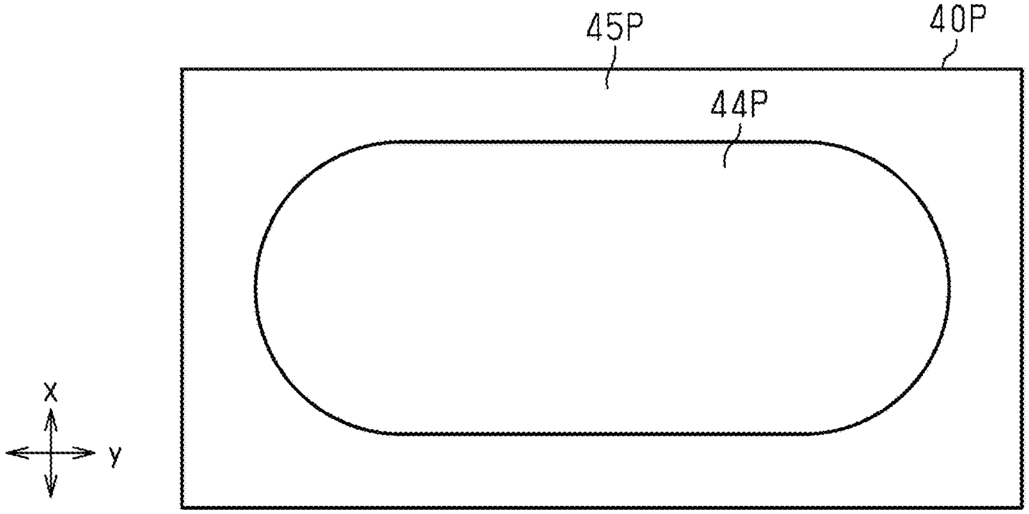
FIG. 25 is a schematic plan view of a diode cell in a modified example of a temperature sensing diode.

As shown in FIG. 25, the contour of the second semiconductor region 45P is not limited to a square and may be a rectangle. In this case, the shape of the first semiconductor region 44P may also be changed in any manner. In an example, as shown in FIG. 25, as viewed in the z-direction, the first semiconductor region 44P is elliptical.

Figure 26:
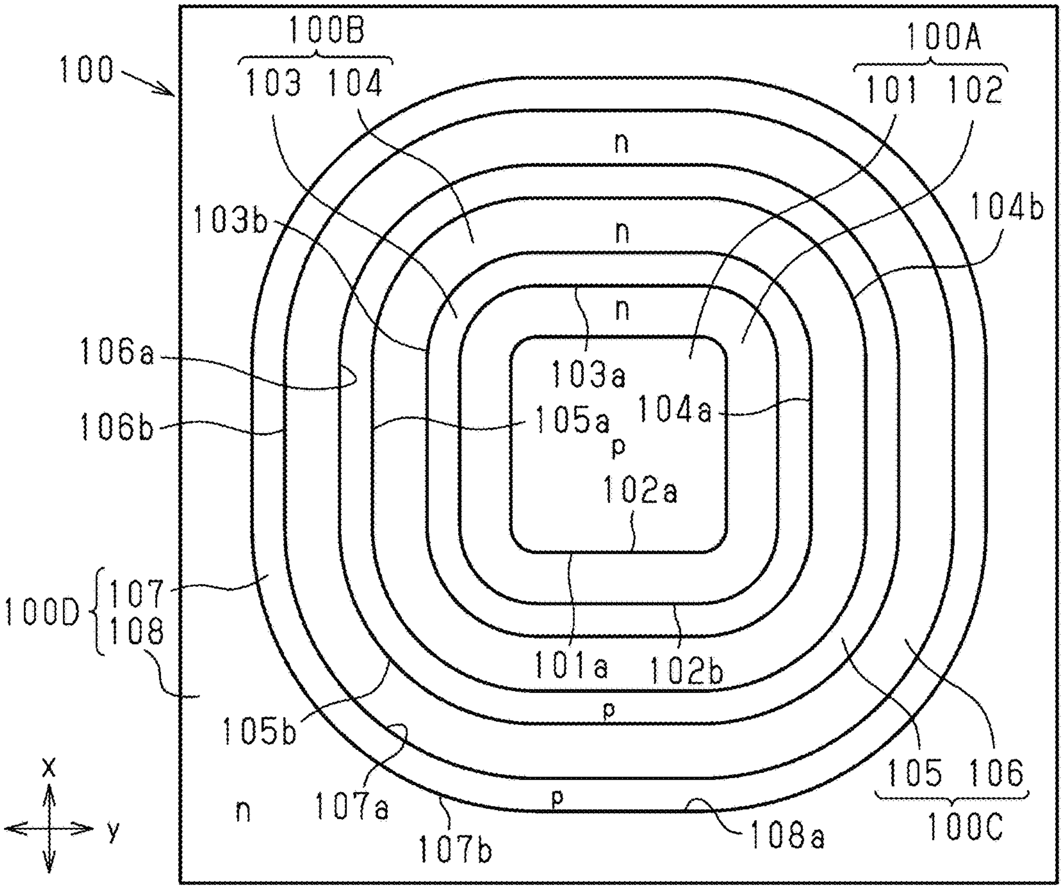
FIG. 26 is a schematic plan view of a diode cell in a modified example of a temperature sensing diode.

In the third embodiment, the shapes of the first to eighth semiconductor regions 101 to 108 of the diode cells 100A to 100D in the temperature sensing diode 100 may be changed in any manner. In an example, as shown in FIG. 26, each of the semiconductor regions 101 to 108 may be quadrangular as viewed in the z-direction, and each corner of the quadrangle may be curved.

Figure 27:
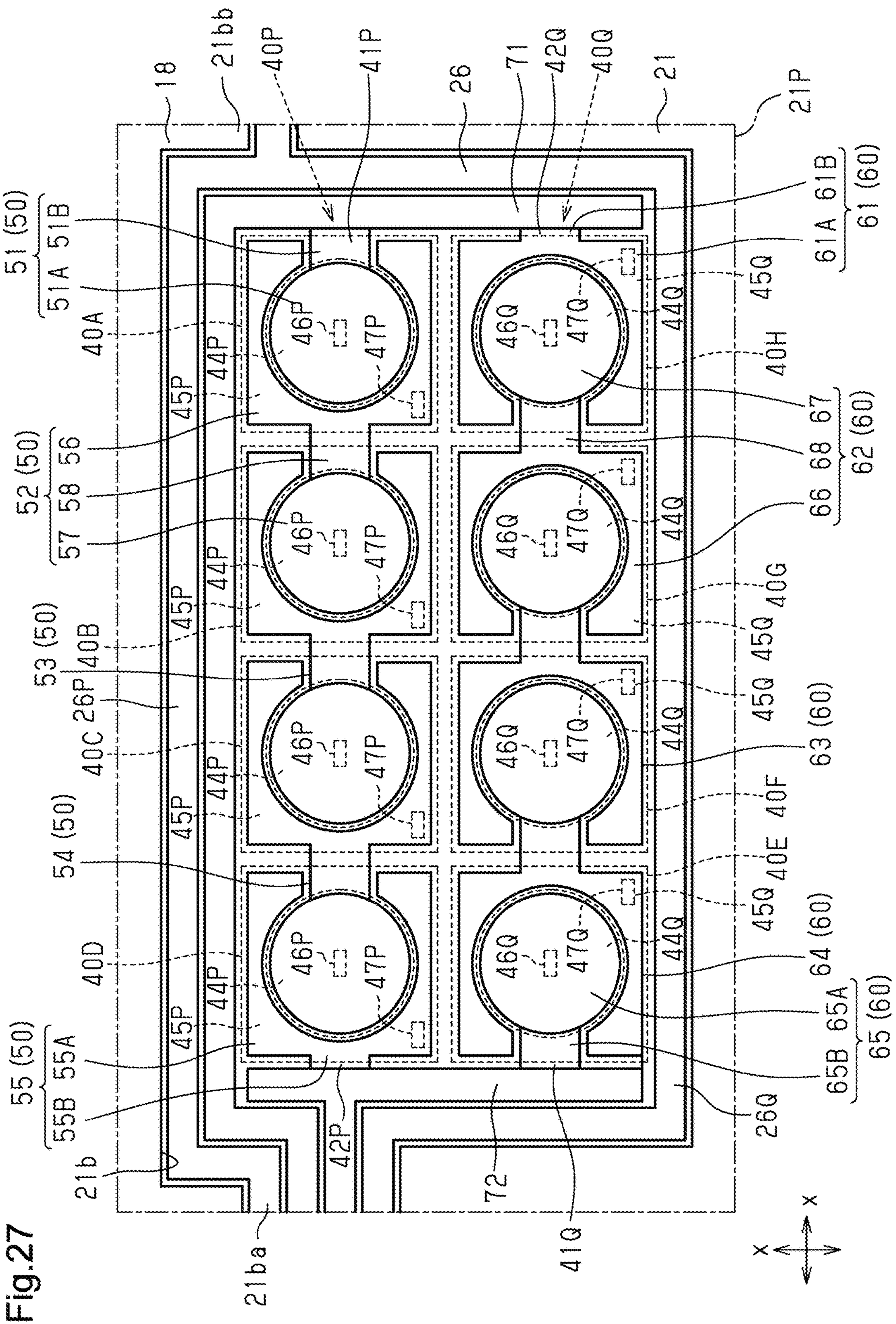
FIG. 27 is a schematic plan view showing a modified example of a temperature sensing diode and a protection diode connected to interconnects.

In the first and second embodiments, as shown in FIG. 27, the second connection line 72 may be configured to extend through the first interconnect lead region 21*ba* instead of the second interconnect lead region 21*bb*. In other words, both the first connection line 71 and the second connection line 72 may be configured to extend through the first interconnect lead region 21*ba*. In this case, for example, the second electrode 42P of the temperature sensing diode 40P may be disconnected from the adjacent region 21P of the emitter electrode 21.

In the first and second embodiments, the arrangement of the first to fourth diode cells 40A to 40D of the temperature sensing diode 40P may be changed in any manner. In an example, the first to fourth diode cells 40A to 40D may be arranged in a line in the x-direction. The first to fourth diode cells 40A to 40D may be arranged such that a set of the first and second diode cells 40A and 40B, which are adjacent to each other in the y-direction, and a set of the third and fourth diode cells 40C and 40D, which are adjacent to each other in the y-direction, are disposed adjacent to each other in the x-direction.

In the first and second embodiments, the arrangement of the first to fourth protection diode cells 40E to 40H of the protection diode 40Q may be changed in any manner. In an example, the first to fourth protection diode cells 40E to 40H may be arranged in a line in the x-direction. The first to fourth protection diode cells 40E to 40H may be arranged such that a set of the first and second protection diode cells 40E and 40F, which are adjacent to each other in the y-direction, and a set of the third and fourth protection diode cells 40G and 40H, which are adjacent to each other in the y-direction, are disposed adjacent to each other in the x-direction.

In each embodiment, the number of diode cells in the temperature sensing diode 40P, 100 may be changed in any manner. The number of diode cells in the temperature sensing diode 40P, 100 may be two, three, and five or more.

In each embodiment, the number of protection diode cells in the protection diodes 40Q and 110 may be changed in any manner. The number of protection diode cells in the protection diodes 40Q and 110 may be two, three, and five or more.

Figure 28:
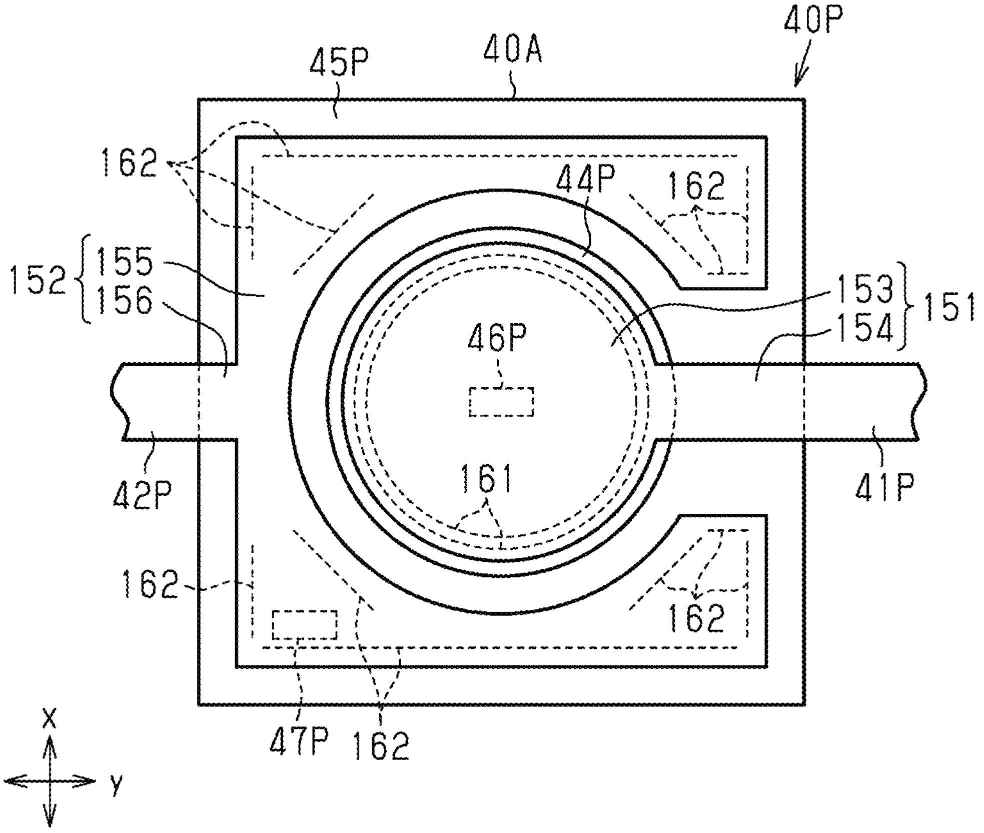
FIG. 28 is a plan view showing a modified example of a temperature sensing diode connected to interconnects.

In each embodiment, each of the temperature sensing diodes 40P and 100 may include one diode cell. In an example, as shown in FIG. 28, the temperature sensing diode 40P includes a first diode cell 40A. In this case, the semiconductor device 10 includes a first interconnect 151 and a second interconnect 152 formed on the surface 39*b* (refer to FIG. 10) of the intermediate insulation film 39, which covers the temperature sensing diode 40P, and a first through interconnect 161 and a second through interconnect 162 extending through the intermediate insulation film 39.

The first interconnect 151 is configured to be electrically connected to the first semiconductor region 44P of the first diode cell 40A by the first through interconnect 161. As viewed in the z-direction, the first interconnect 151 includes a first region connector 153 disposed to overlap the first semiconductor region 44P and a first extension 154 extending from the first region connector 153 toward the outside of the first semiconductor region 44P. The first region connector 153 is shaped in conformance with the shape of the first semiconductor region 44P as viewed in the z-direction. In the illustrated example, as viewed in the z-direction, the first region connector 153 is circular. The first extension 154 extends from the first region connector 153 in a direction opposite to the second interconnect 152. The first extension 154 includes the first electrode 41P of the temperature sensing diode 40P.

The first through interconnect 161 is configured to connect the first interconnect 151 and the first semiconductor region 44P. In the illustrated example, the first through interconnect 161 is disposed to overlap with the first region connector 153 and the first semiconductor region 44P as viewed in the z-direction. As viewed in the z-direction, the first through interconnect 161 is circular. The first through interconnect 161 is disposed at a peripheral portion of the first semiconductor region 44P. In the illustrated example, multiple (two) first through interconnects 161 are provided. The number of first through interconnects 161 may be changed in any manner and may be, for example, one. The first through interconnects 161 are disposed in the first diode cell 40A at a position different from that of the first length measuring pattern 46P.

The second interconnect 152 is configured to be electrically connected to the second semiconductor region 45P of the first diode cell 40A by the second through interconnect 162. The second interconnect 152 is insulated from the first interconnect 151. As viewed in the z-direction, the second interconnect 152 includes a second region connector 155 disposed to overlap the second semiconductor region 45P and a second extension 156 extending from the second region connector 155 toward the outside of the second semiconductor region 45P. The second region connector 155 annularly surrounds a portion of the first region connector 153 and includes a gap to avoid contacting the first extension 154 as viewed in the z-direction. The second extension 156 extends from the second region connector 155 in a direction opposite to the first interconnect 151. The second extension 156 includes the second electrode 42P of the temperature sensing diode 40P.

The second through interconnect 162 is configured to connect the second interconnect 152 and the second semiconductor region 45P. In the illustrated example, the second through interconnect 162 is disposed to overlap with the second region connector 155 and the second semiconductor region 45P as viewed in the z-direction. Multiple second through interconnects 162 may be provided. The second through interconnect 162 is disposed in the first diode cell 40A at a position different from that of the second length measuring pattern 47P.

In each embodiment, the adjacent region 21P is not limited to the region of the emitter electrode 21 surrounded by the double-dashed line in FIG. 2 and may be changed in any manner. The adjacent region 21P may be any region of the emitter electrode 21 located adjacent to the temperature sensing diode 40P. For example, the adjacent region 21P may include a region of the emitter electrode 21 located adjacent to one side of the temperature sensing diode 40P in the x-direction or a region of the emitter electrode 21 located adjacent to one side of the temperature sensing diode 40P in the y-direction. That is, the adjacent region 21P may be any region located adjacent to a portion of the temperature sensing diode 40P.

In each embodiment, the protection diodes 40Q and 110 may be omitted from the semiconductor device 10.

In each embodiment, the current sensing electrode 24 may be omitted. Further, at least one of the current sensing electrode pad 15 and the emitter sensing electrode pad 16 may be omitted.

In each embodiment, the protective insulation film 17 may be omitted.

In each embodiment, the semiconductor device 10 may include a cathode electrode arranged separately from the emitter electrode 21. The cathode electrode is electrically connected to the second electrode 42P (100N) of the temperature sensing diode 40P (100). The cathode electrode is also electrically connected to the first electrode 41Q (110M) of the protection diode 40Q (11).

In each embodiment, the semiconductor device 10 is embodied as an IGBT. Alternatively, the semiconductor device 10 may be a silicon carbide metal-oxide-semiconductor field-effect transistor (SiC MOSFET) or a Si MOSFET.

In the present disclosure, the term "on" includes the meaning of "above" in addition to the meaning of "on" unless otherwise clearly indicated in the context. Thus, the phrase "A is formed on B" is intended to mean that A may be disposed directly on B in contact with B in the present embodiment and also that A may be disposed above B without contacting B in a modified example. In other words, the term "on" does not exclude a structure in which another member is formed between A and B.

The z-direction as referred to in the present disclosure does not necessarily have to be the vertical direction and does not necessarily have to fully conform to the vertical direction. In the structures according to the present disclosure, "upward" and "downward" in the z-direction as referred to in the present description are not limited to "upward" and "downward" in the vertical direction. In an example, the x-direction may conform to the vertical direction. In another example, the y-direction may conform to the vertical direction.

In this specification, "at least one of A and B" should be understood to mean "only A, only B, or both A and B."

CLAUSES

The technical aspects that are understood from the embodiments and the modified examples will be described below. The reference signs of the elements in the embodiments are given to the corresponding elements in clauses with parentheses. The reference signs used as examples to facilitate understanding, and the elements in each clause are not limited to those elements given with the reference signs.

[Clause A1] A semiconductor device, including:
- a semiconductor layer (30);
- a cell (18A) disposed on the semiconductor layer (30);
- an insulation film (38; 39) covering the cell (18A);
- a main electrode portion (21) disposed on the insulation film (38; 39);
- a temperature sensing diode (40P) configured to detect temperature and including a first electrode (41P) and a second electrode (42P); and
- a diode connection electrode (22) configured to externally connect the first electrode (41P), where
- the main electrode portion (21) includes
  - a first bonding region (11) configured to be electrically connected to the second electrode (42P) and bonded to a first conductive member (CB), which is configured to externally connect the main electrode portion (21), and
  - a second bonding region (12) configured to be bonded to a second conductive member (CWA), which is configured to externally connect the second electrode (42P), the second bonding region (12) and the first bonding region (11) being disposed in different regions as viewed in a thickness-wise direction (z-direction) of the semiconductor layer (30), and
- as viewed in the thickness-wise direction (z-direction) of the semiconductor layer (30), the cell (18A) is disposed on a first semiconductor region (RE) of the semiconductor layer (30) overlapping the first bonding region (11) and a second semiconductor region (RK) of the semiconductor layer (30) overlapping the second bonding region (12).

[Clause A2] The semiconductor device according to clause A1, where
- the first bonding region (11) includes an adjacent region (21P) located adjacent to a portion of the temperature sensing diode (40P) as viewed in the thickness-wise direction (z-direction) of the semiconductor layer (30), and
- the semiconductor device further includes a second electrode connection interconnect (72) configured to connect the second electrode (42P) and the adjacent region (21P).

[Clause A3] The semiconductor device according to clause A2, further including:
- an interconnect lead region (21*ba*) located adjacent to the temperature sensing diode (40P) at a position different from the adjacent region (21P), where
- the first electrode (41P) is connected to a first electrode connection interconnect (71), and
- the first electrode connection interconnect (71) is connected to the diode connection electrode (22) through the interconnect lead region (21*ba*).

[Clause A4] The semiconductor device according to any one of clauses A1 to A3, where as viewed in the thickness-wise direction (z-direction) of the semiconductor layer (30), the cell (18A) is excluded from a region of the semiconductor layer (30) that overlaps the diode connection electrode (22).

[Clause A5] The semiconductor device according to any one of clauses A1 to A4, where as viewed in the thickness-wise direction (z-direction) of the semiconductor layer (30), the semiconductor layer (30) is rectangular, and as viewed in the thickness-wise direction (z-direction) of the semiconductor layer (30), the second bonding region (12) and the diode connection electrode (22) are arranged next to each other along a side of the semiconductor layer (30).

[Clause A6] The semiconductor device according to clause A5, where as viewed in the thickness-wise direction (z-direction) of the semiconductor layer (30), the diode connection electrode (22) is disposed closer to the temperature sensing diode (40P) with respect to the second bonding region (12).

[Clause A7] The semiconductor device according to any one of clauses A1 to A6, where the semiconductor device (10) includes a protective insulation film (17) covering the main electrode portion (21), and the protective insulation film (17) includes a first opening (17A) exposing the first bonding region (11), a second opening (17B) exposing the second bonding region (12), and a partition region (17*a*) disposed to separate the first opening (17A) from the second opening (17B).

[Clause A8] The semiconductor device according to any one of clauses A1 to A6, where the semiconductor device (10) includes a protective insulation film (17) covering the main electrode portion (21), and the protective insulation film (17) includes an opening (17G) exposing the first bonding region (11) and the second bonding region (12) that are in communication with each other through the opening (17G).

[Clause A9] The semiconductor device according to any one of clauses A1 to A8, where the cell includes a main cell (18A), the temperature sensing diode (40P) includes a diode cell (40A to 40D) formed on a surface (38*a*) of the insulation film (38), and the diode cell (40A to 40D) includes a first diode semiconductor region (44P) of a first conductive type, and a second diode semiconductor region (45P) of a second conductive type annularly surrounding the first diode semiconductor region (44P).

[Clause A10] The semiconductor device according to clause A9, where the semiconductor device (10) further includes an intermediate insulation film (39) covering the temperature sensing diode (40P); and an interconnect (51 to 55) formed on a surface (39*b*) of the intermediate insulation film (39) and electrically connected to the first diode semiconductor region (44P) and the second diode semiconductor region (45P).

[Clause A11] The semiconductor device according to clause A9 or A10, where the diode cell (40A to 40D) includes multiple diode cells, and the diode cells (40A to 40D) are connected in series to each other.

[Clause A12] The semiconductor device according to clause A11, where the diode cells (40A to 40D) are disposed in a line as viewed in the thickness-wise direction (z-direction) of the semiconductor layer (30).

[Clause A13] The semiconductor device according to any one of clauses A1 to A12, where the semiconductor device (10) further includes a protection diode (40Q) connected in antiparallel to the temperature sensing diode (40P).

[Clause A14] The semiconductor device according to any one of clauses A1 to A13, where the semiconductor device (10) is an IGBT, the main electrode portion is an emitter electrode (21), the first electrode (41P) is an anode electrode, and the second electrode (42P) is a cathode electrode.

[Clause A15] The semiconductor device according to any one of clauses A1 to A13, where the semiconductor device (10) is a SiC MOSFET, the main electrode portion (21) is a source electrode, the first electrode (41P) is an anode electrode, and the second electrode (42P) is a cathode electrode.

[Clause B1] A semiconductor device, including:

a semiconductor layer (30);

an insulation film (38; 39) formed on a surface (30*s*) of the semiconductor layer (30);

a main cell region (18) including a main cell (18A) disposed on the semiconductor layer (30); and a temperature sensing diode (40P) disposed in a region different from the main cell region (18) and configured to detect a temperature, where the temperature sensing diode (40P) includes a diode cell (40A to 40D) including a first semiconductor region (44P) of a first conductive type formed as a thin film on a surface (38*a*) of the insulation film (38) and a second semiconductor region (45P) of a second conductive type formed as a thin film on the surface (38*a*) of the insulation film (38), the second semiconductor region (45P) annularly surrounds the first semiconductor region (44P), and the second semiconductor region (45P) includes an inner surface (45Pa) joined to the first semiconductor region (44P).

[Clause B2] The semiconductor device according to clause B 1, where the first semiconductor region (44P) is circular as viewed in a thickness-wise direction (z-direction) of the semiconductor layer (30), and the second semiconductor region (45P) includes an inner circumferential surface (45Pa) joined to a circumferential surface (44Pa) of the first semiconductor region (44P) along an entire perimeter of the circumferential surface (44Pa) of the first semiconductor region (44P), and an outer surface (45Pb) being quadrangular as viewed in the thickness-wise direction (z-direction) of the semiconductor layer (30).

[Clause B3] The semiconductor device according to clause B1, where the first semiconductor region (44P) is quadrangular as viewed in a thickness-wise direction (z-direction) of the semiconductor layer (30), and the second semiconductor region (45P) includes an inner surface (45Pa) entirely joined to an outer surface (44Pa) of the first semiconductor region (44P), and an outer surface (45Pb) being quadrangular as viewed in the thickness-wise direction (z-direction) of the semiconductor layer (30).

[Clause B4] The semiconductor device according to clause B3, where the first semiconductor region (44P) includes corners (44Pd), each of which is curved as viewed in the thickness-wise direction (z-direction) of the semiconductor layer (30), and the inner surface (45Pa) of the second semiconductor region (45P) includes corners (45Pd) curved in conformance with the corners (44Pd) of the first semiconductor region (44P) so as to contact the corners (44Pd) of the first semiconductor region (44P).

[Clause B5] The semiconductor device according to clause B3, where as viewed in the thickness-wise direction (z-direction) of the semiconductor layer (30), each side of the first semiconductor region (44P) is inclined from each side of the outer surface (45Pb) of the second semiconductor region (45P).

[Clause B6] The semiconductor device according to any one of clauses B1 to B5, where the semiconductor device (10) further includes:

an intermediate insulation film (39) covering the temperature sensing diode (40P);

a first interconnect (51) and a second interconnect (52) formed on a surface (39*b*) of the intermediate insulation film (39);

a first through interconnect (81P) extending through the intermediate insulation film (39) and connecting the first interconnect (51) and the first semiconductor region (44P); and a second through interconnect (82P) extending through the intermediate insulation film (39) and connecting the second interconnect (52) and the second semiconductor region (45P).

[Clause B7] The semiconductor device according to clause B6, where as viewed in the thickness-wise direction (z-direction) of the semiconductor layer (30), the first interconnect (51) includes a first region connector (51A) disposed to overlap the first semiconductor region (44P) and a first extension (51B) extending from the first region connector (51A) toward an outside of the first semiconductor region (44P), and as viewed in the thickness-wise direction (z-direction) of the semiconductor layer (30), the second interconnect (52) includes a second region connector (52A) disposed to overlap the second semiconductor region (45P) and a second extension (52B) extending from the second region connector (52A) toward an outside of the second semiconductor region (45P).

[Clause B8] The semiconductor device according to clause B7, where as viewed in the thickness-wise direction (z-direction) of the semiconductor layer (30), the second region connector (52A) annularly surrounds a portion of the first region connector (51A) and includes a gap to avoid contacting the first extension (51B).

[Clause B9] The semiconductor device according to any one of clauses B1 to B5, where the temperature sensing diode (40P) includes multiple diode cells (40A to 40D) arranged in one direction and connected in series to each other.

[Clause B10] The semiconductor device according to clause B9, where the multiple diode cells (40A to 40D) include a first diode cell (40A) and a second diode cell (40B) that are adjacent to each other in an arrangement direction of the multiple diode cells (40A to 40D), the semiconductor device (10) further includes:

an intermediate insulation film (39) covering the temperature sensing diode (40P);

a first interconnect (51) formed on a surface (39*b*) of the intermediate insulation film (39) and connected to the first semiconductor region (44P) of the first diode cell (40A); and a second interconnect (52) formed on the surface (39*b*) of the intermediate insulation film (39) and insulated from the first interconnect (51), and the second interconnect (52) electrically connects the second semiconductor region (45P) of the first diode cell (40A) and the first semiconductor region (44P) of the second diode cell (40B).

[Clause B11] The semiconductor device according to clause B10, where the second interconnect (52) includes a first part (56) disposed to overlap the second semiconductor region (45P) of the first diode cell (40A) as viewed in the thickness-wise direction (z-direction) of the semiconductor layer (30) and electrically connected to the second semiconductor region (45P) of the first diode cell (40A), a second part (57) disposed to overlap the first semiconductor region (44P) of the second diode cell (40B) as viewed in the thickness-wise direction (z-direction) of the semiconductor layer (30) and electrically connected to the first semiconductor region (44P) of the second diode cell (40B), and a connection part (58) that connects the first part (56) and the second part (57).

[Clause B12] The semiconductor device according to clause B10 or B11, where the temperature sensing diode (40P) is mounted on a diode mount (21*b*), a first interconnect lead region (21*ba*) and a second interconnect lead region (21*bb*) are disposed on opposite end portions of the diode mount (21*b*) in the arrangement direction, the multiple diode cells (40A to 40D) include a first end cell (40A) and a second end cell (40D) disposed at opposite ends in the arrangement direction, the first end cell (40A) is disposed toward the second interconnect lead region (21*bb*), the second end cell (40B) is disposed toward the first interconnect lead region (21*ba*), the semiconductor device (10) further includes:

an intermediate insulation film (39) covering the temperature sensing diode (40P);

a first end interconnect (51) formed on a surface (39*b*) of the intermediate insulation film (39), the first end interconnect (51) including a first end connector (51A) disposed to overlap the first semiconductor region (44P) of the first end cell (40A) and a first end extension (51B) extending from the first end connector (51A) to an outside of the first semiconductor region (44P) of the first end cell (40A) as viewed in the thickness-wise direction (z-direction) of the semiconductor layer (30), the first end extension (51B) including a first electrode (41P) of the temperature sensing diode (40P);

a first connection line (71) connected to the first end extension (51B) and extending through the first interconnect lead region (21*ba*);

a second end interconnect (55) formed on the surface (39*b*) of the intermediate insulation film (39), the second end interconnect (55) including a second end connector (55A) disposed to overlap the first semiconductor region (44P) of the second end cell (40D)

and a second end extension (55B) extending from the second end connector (55A) to an outside of the first semiconductor region (44P) of the second end cell (40D) as viewed in the thickness-wise direction (z-direction) of the semiconductor layer (30), the second end extension (55B) including a second electrode (42P) of the temperature sensing diode (40P); and a second connection line (72) connected to the second end extension (55B) and extending through the second interconnect lead region (21*bb*).

[Clause B13] The semiconductor device according to clause B1, where the diode cell includes a first diode cell (40A), the temperature sensing diode (40P) includes a second diode cell (40B) arranged separately from the first diode cell (40A), the second diode cell (40B) includes a third semiconductor region (103) of the first conductive type formed as a thin film on the surface (38*a*) of the insulation film (38) and a fourth semiconductor region (104) of the second conductive type formed as a thin film on the surface (38*a*) of the insulation film (38), the third semiconductor region (103) annularly surrounds the second semiconductor region (102) and includes an inner surface (103*a*) joined to an outer surface (102*b*) of the second semiconductor region (102), and the fourth semiconductor region (104) annularly surrounds the third semiconductor region (103) and includes an inner surface (104*a*) joined to an outer surface (103*b*) of the third semiconductor region (103).

[Clause B14] The semiconductor device according to clause B13, where the semiconductor device (10) further includes:

an intermediate insulation film (39) covering the temperature sending diode (40P);

a first interconnect (121) formed on a surface (39*b*) of the intermediate insulation film (39) to overlap the first semiconductor region (101);

a second interconnect (122) formed on the surface (39*b*) of the intermediate insulation film (39) to overlap with the second semiconductor region (102) and the third semiconductor region (103);

a third interconnect (103) formed on the surface (39*b*) of the intermediate insulation film (39) to overlap the fourth semiconductor region (104);

a first through interconnect (126A) extending through the intermediate insulation film (39) and connecting the first interconnect (121) and the first semiconductor region (101);

a second through interconnect (126B) extending through the intermediate insulation film (39) and connecting the second interconnect (122) and the second semiconductor region (102);

a third through interconnect (126C) extending through the intermediate insulation film (39) and connecting the second interconnect (122) and the third semiconductor region (103); and a fourth through interconnect (126D) extending through the intermediate insulation film (39) and connecting the third interconnect (123) and the fourth semiconductor region (104).

[Clause B15] The semiconductor device according to clause B14, where the first interconnect (121) includes a first region connector (121A) and a first extension (121B), as viewed in the thickness-wise direction (z-direction) of the semiconductor layer (30), the first region connector (121A) is disposed to overlap the first semiconductor region (101) and connected to the first through interconnect (126A), the first extension (121B) extends from the first region connector (121A) toward an outside of the first semiconductor region (101), as viewed in the thickness-wise direction (z-direction) of the semiconductor layer (30), the second interconnect (122) annularly surrounds a portion of the first region connector (121A) and includes a gap to avoid contacting the first extension (121B), and as viewed in the thickness-wise direction (z-direction) of the semiconductor layer (30), the third interconnect (123) is separated radially outward from the second interconnect (122) and includes a gap to avoid contacting the first extension (121B).

[Clause B16] The semiconductor device according to any one of clauses B13 to B15, where the first semiconductor region (101) is circular as viewed in a thickness-wise direction (z-direction) of the semiconductor layer (30), the second semiconductor region (102) is annular and includes an inner circumferential surface (102*a*) joined to a circumferential surface (101*a*) of the first semiconductor region (101) along an entire perimeter of the circumferential surface (101*a*) of the first semiconductor region (101), the third semiconductor region (103) annularly surrounds the second semiconductor region (102) and includes an inner circumferential surface (103*a*) joined to an outer circumferential surface (102*b*) of the second semiconductor region (102) along an entire perimeter of the outer circumferential surface (102*b*) of the second semiconductor region (102), the fourth semiconductor region (104) annularly surrounds the third semiconductor region (103) and includes an inner circumferential surface (104*a*) joined to an outer circumferential surface (103*b*) of the third semiconductor region (103) along an entire perimeter of the outer circumferential surface (103*b*) of the third semiconductor region (103), and as viewed in the thickness-wise direction (z-direction) of the semiconductor layer (30), the first semiconductor region (101), the second semiconductor region (102), the third semiconductor region (103), and the fourth semiconductor region (104) are concentric with each other.

[Clause B17] The semiconductor device according to any one of clauses B1 to B16, where the semiconductor device (10) further includes:

a protection diode (40Q) connected in antiparallel to the temperature sensing diode (40P).

REFERENCE SIGNS LIST semiconductor device; 10*ce*) end; 11) emitter electrode pad (first bonding region); 12) cathode electrode pad (second bonding region); 17) protective insulation film; 17A) first opening; 17B) second opening; 17G) opening; 17*a*) partition region; 18) main cell region (cell region); 18A) main cell (cell); 21) emitter electrode (main electrode portion); 21P) adjacent region; 21*b*) diode mount; 21*ba*) first interconnect lead region; 21*bb*) second interconnect lead region; 22) anode electrode (diode connection electrode); 30) semiconductor substrate (semiconductor layer); 30*s*)

substrate front surface (surface of semiconductor layer); 38) insulation film; 38A) insulation film; 38Aa) surface; 39) intermediate insulation film; 39*b*) surface; 40P) temperature sensing diode; 40A) first diode cell (first end cell); 40B) second diode cell; 40C) third diode cell; 40D) fourth diode cell (second end cell); 40Q) protection diode; 41P) first electrode; 42P) second electrode; 44P) first semiconductor region; 44Pa) circumferential surface; 44Pc) outer surface; 44Pd) corner; 45P) second semiconductor region; 45Pa) inner circumferential surface; 45Pb) outer surface; 45Pc) inner surface; 50); 51) first interconnect; 51A) first region connector (first end connector); 51B) first extension (first end extension); 52) second interconnect; 53) third interconnect; 55) fifth interconnect; 55A) fifth region connector (second end connector); 55B) fifth extension (second end extension); 56) first part; 57) second part; 58) connection part; 71) first connection line (first electrode connection interconnect); 72) second connection line (second electrode connection interconnect); 81P) first through interconnect; 82P) second through interconnect; 83P) third through interconnect; 84P) fourth through interconnect; 100) temperature sensing diode; 100A) first diode cell (diode cell); 100B) second diode cell; 100M) first electrode; 100N) second electrode; 101) first semiconductor region; 101*a*) circumferential surface; 102) second semiconductor region; 102*a*) inner circumferential surface; 102*b*) outer circumferential surface; 103) third semiconductor region; 103*a*) inner circumferential surface; 103*b*) outer circumferential surface; 104) fourth semiconductor region; 104*a*) inner circumferential surface; 104*b*) outer circumferential surface; 110) protection diode; 121) first interconnect; 121A) first region connector; 121B) first extension; 122) second interconnect; 123) third interconnect; 124) fourth interconnect; 125) fifth interconnect; 125A) fifth region connector; 125B) fifth extension; 126A) first through interconnect; 126B) second through interconnect; 126C) third through interconnect; 126D) fourth through interconnect; 141) first connection line; 142) second connection line; 151) first interconnect; 152) second interconnect; 153) first region connector; 154) first extension; 155) second region connector; 156) second extension; 161) first through interconnect; 162) second through interconnect; CB) first conductive member; CWA) second conductive member; RA) first bonding region; RB) second bonding region; RE) region (first semiconductor region); RK) region (second semiconductor region)

The invention claimed is:

1. A semiconductor device, comprising:

a semiconductor layer;

an insulation film formed on a surface of the semiconductor layer;

a main cell region including a main cell disposed on the semiconductor layer; and a temperature sensing diode disposed in a region different from the main cell region and configured to detect a temperature, wherein the temperature sensing diode includes a diode cell including a first semiconductor region of a first conductive type formed as a thin film on a surface of the insulation film and a second semiconductor region of a second conductive type formed as a thin film on the surface of the insulation film, the second semiconductor region annularly surrounds the first semiconductor region, the second semiconductor region includes an inner surface joined to the first semiconductor region, the temperature sensing diode includes multiple diode cells arranged in one direction and connected in series to each other, the multiple diode cells include a first diode cell and a second diode cell that are adjacent to each other in an arrangement direction of the multiple diode cells, the semiconductor device further comprises:

an intermediate insulation film covering the temperature sensing diode;

a first interconnect formed on a surface of the intermediate insulation film and connected to the first semiconductor region of the first diode cell; and a second interconnect formed on the surface of the intermediate insulation film and insulated from the first interconnect, the second interconnect electrically connects the second semiconductor region of the first diode cell and the first semiconductor region of the second diode cell, the temperature sensing diode is mounted on a diode mount, a first interconnect lead region and a second interconnect lead region are disposed on opposite end portions of the diode mount in the arrangement direction, the multiple diode cells include a first end cell and a second end cell disposed at opposite ends in the arrangement direction, the first end cell is disposed toward the second interconnect lead region, the second end cell is disposed toward the first interconnect lead region, the semiconductor device further comprises:

a first end interconnect formed on a surface of the intermediate insulation film, the first end interconnect including a first end connector disposed to overlap the first semiconductor region of the first end cell and a first end extension extending from the first end connector to an outside of the first semiconductor region of the first end cell as viewed in the thickness-wise direction of the semiconductor layer, the first end extension including a first electrode of the temperature sensing diode;

a first connection line connected to the first end extension and extending through the first interconnect lead region;

a second end interconnect formed on the surface of the intermediate insulation film, the second end interconnect including a second end connector disposed to overlap the first semiconductor region of the second end cell and a second end extension extending from the second end connector to an outside of the first semiconductor region of the second end cell as viewed in the thickness-wise direction of the semiconductor layer, the second end extension including a second electrode of the temperature sensing diode; and a second connection line connected to the second end extension and extending through the second interconnect lead region.

2. The semiconductor device according to claim 1, wherein the first semiconductor region is circular as viewed in a thickness-wise direction of the semiconductor layer, and the second semiconductor region includes an inner circumferential surface joined to a circumferential surface of the first semiconductor region along an entire perimeter of the circumferential surface of the first semiconductor region, and an outer surface being quadrangular as viewed in the thickness-wise direction of the semiconductor layer.

3. The semiconductor device according to claim 1, further comprising:

a first through interconnect extending through the intermediate insulation film and connecting the first interconnect and the first semiconductor region; and a second through interconnect extending through the intermediate insulation film and connecting the second interconnect and the second semiconductor region.

4. The semiconductor device according to claim 3, wherein as viewed in the thickness-wise direction of the semiconductor layer, the first interconnect includes a first region connector disposed to overlap the first semiconductor region and a first extension extending from the first region connector toward an outside of the first semiconductor region, and as viewed in the thickness-wise direction of the semiconductor layer, the second interconnect includes a second region connector disposed to overlap the second semiconductor region and a second extension extending from the second region connector toward an outside of the second semiconductor region.

5. The semiconductor device according to claim 4, wherein as viewed in the thickness-wise direction of the semiconductor layer, the second region connector annularly surrounds a portion of the first region connector and includes a gap to avoid contacting the first extension.

6. The semiconductor device according to claim 1, wherein the second interconnect includes a first part disposed to overlap the second semiconductor region of the first diode cell as viewed in the thickness-wise direction of the semiconductor layer and electrically connected to the second semiconductor region of the first diode cell, a second part disposed to overlap the first semiconductor region of the second diode cell as viewed in the thickness-wise direction of the semiconductor layer and electrically connected to the first semiconductor region of the second diode cell, and a connection part that connects the first part and the second part.

7. The semiconductor device according to claim 1, wherein the second diode cell includes a third semiconductor region of the first conductive type formed as a thin film on the surface of the insulation film and a fourth semiconductor region of the second conductive type formed as a thin film on the surface of the insulation film, the third semiconductor region annularly surrounds the second semiconductor region and includes an inner surface joined to an outer surface of the second semiconductor region, and the fourth semiconductor region annularly surrounds the third semiconductor region and includes an inner surface joined to an outer surface of the third semiconductor region.

8. The semiconductor device according to claim 7, further comprising:

a third interconnect formed on the surface of the intermediate insulation film to overlap the fourth semiconductor region;

a first through interconnect extending through the intermediate insulation film and connecting the first interconnect and the first semiconductor region;

a second through interconnect extending through the intermediate insulation film and connecting the second interconnect and the second semiconductor region;

a third through interconnect extending through the intermediate insulation film and connecting the second interconnect and the third semiconductor region; and a fourth through interconnect extending through the intermediate insulation film and connecting the third interconnect and the fourth semiconductor region, wherein the first interconnect overlaps the first semiconductor region, and the second interconnect overlaps with the second semiconductor region and the third semiconductor region.

9. The semiconductor device according to claim 8, wherein the first interconnect includes a first region connector and a first extension, as viewed in the thickness-wise direction of the semiconductor layer, the first region connector is disposed to overlap the first semiconductor region and connected to the first through interconnect, the first extension extends from the first region connector toward an outside of the first semiconductor region, as viewed in the thickness-wise direction of the semiconductor layer, the second interconnect annularly surrounds a portion of the first region connector and includes a gap to avoid contacting the first extension, and as viewed in the thickness-wise direction of the semiconductor layer, the third interconnect is separated radially outward from the second interconnect and includes a gap to avoid contacting the first extension.

10. The semiconductor device according to claim 7, wherein the first semiconductor region is circular as viewed in a thickness-wise direction of the semiconductor layer, the second semiconductor region is annular and includes an inner circumferential surface joined to a circumferential surface of the first semiconductor region along an entire perimeter of the circumferential surface of the first semiconductor region, the third semiconductor region annularly surrounds the second semiconductor region and includes an inner circumferential surface joined to an outer circumferential surface of the second semiconductor region along an entire perimeter of the outer circumferential surface of the second semiconductor region, the fourth semiconductor region annularly surrounds the third semiconductor region and includes an inner circumferential surface joined to an outer circumferential surface of the third semiconductor region along an entire perimeter of the outer circumferential surface of the third semiconductor region, and as viewed in the thickness-wise direction of the semiconductor layer, the first semiconductor region, the second semiconductor region, the third semiconductor region, and the fourth semiconductor region are concentric with each other.

11. The semiconductor device according to claim 1, further comprising:

a protection diode connected in antiparallel to the temperature sensing diode.

12. A semiconductor device, comprising:

a semiconductor layer;

an insulation film formed on a surface of the semiconductor layer;

a main cell region including a main cell disposed on the semiconductor layer; and a temperature sensing diode disposed in a region different from the main cell region and configured to detect a temperature, wherein the temperature sensing diode includes a diode cell including a first semiconductor region of a first conductive type formed as a thin film on a surface of the insulation film and a second semiconductor region of a second conductive type formed as a thin film on the surface of the insulation film, the second semiconductor region annularly surrounds the first semiconductor region, the second semiconductor region includes an inner surface joined to the first semiconductor region, the temperature sensing diode includes multiple diode cells arranged in one direction and connected in series to each other, the multiple diode cells include a first diode cell and a second diode cell that are adjacent to each other in an arrangement direction of the multiple diode cells, the semiconductor device further comprises:

an intermediate insulation film covering the temperature sensing diode;

a first interconnect formed on a surface of the intermediate insulation film and connected to the first semiconductor region of the first diode cell; and a second interconnect formed on the surface of the intermediate insulation film and insulated from the first interconnect, the second interconnect electrically connects the second semiconductor region of the first diode cell and the first semiconductor region of the second diode cell, the second interconnect includes a first part disposed to overlap the second semiconductor region of the first diode cell as viewed in the thickness-wise direction of the semiconductor layer and electrically connected to the second semiconductor region of the first diode cell, a second part disposed to overlap the first semiconductor region of the second diode cell as viewed in the thickness-wise direction of the semiconductor layer and electrically connected to the first semiconductor region of the second diode cell, and a connection part that connects the first part and the second part.

13. The semiconductor device according to claim 12, wherein the first semiconductor region is circular as viewed in a thickness-wise direction of the semiconductor layer, and the second semiconductor region includes an inner circumferential surface joined to a circumferential surface of the first semiconductor region along an entire perimeter of the circumferential surface of the first semiconductor region, and an outer surface being quadrangular as viewed in the thickness-wise direction of the semiconductor layer.

14. The semiconductor device according to claim 12, further comprising:

a first through interconnect extending through the intermediate insulation film and connecting the first interconnect and the first semiconductor region; and a second through interconnect extending through the intermediate insulation film and connecting the second interconnect and the second semiconductor region.

15. The semiconductor device according to claim 14, wherein as viewed in the thickness-wise direction of the semiconductor layer, the first interconnect includes a first region connector disposed to overlap the first semiconductor region and a first extension extending from the first region connector toward an outside of the first semiconductor region, and as viewed in the thickness-wise direction of the semiconductor layer, the second interconnect includes a second region connector disposed to overlap the second semiconductor region and a second extension extending from the second region connector toward an outside of the second semiconductor region.

16. The semiconductor device according to claim 15, wherein as viewed in the thickness-wise direction of the semiconductor layer, the second region connector annularly surrounds a portion of the first region connector and includes a gap to avoid contacting the first extension.

17. A semiconductor device, comprising:

a semiconductor layer;

an insulation film formed on a surface of the semiconductor layer;

a main cell region including a main cell disposed on the semiconductor layer; and a temperature sensing diode disposed in a region different from the main cell region and configured to detect a temperature, wherein the temperature sensing diode includes a diode cell including a first semiconductor region of a first conductive type formed as a thin film on a surface of the insulation film and a second semiconductor region of a second conductive type formed as a thin film on the surface of the insulation film, the second semiconductor region annularly surrounds the first semiconductor region, the second semiconductor region includes an inner surface joined to the first semiconductor region the semiconductor device further comprises:

an intermediate insulation film covering the temperature sensing diode;

a first interconnect and a second interconnect formed on a surface of the intermediate insulation film;

a first through interconnect extending through the intermediate insulation film and connecting the first interconnect and the first semiconductor region; and a second through interconnect extending through the intermediate insulation film and connecting the second interconnect and the second semiconductor region, as viewed in the thickness-wise direction of the semiconductor layer, the first interconnect includes a first region connector disposed to overlap the first semiconductor region and a first extension extending from the first region connector toward an outside of the first semiconductor region, and as viewed in the thickness-wise direction of the semiconductor layer, the second interconnect includes a second region connector disposed to overlap the second semiconductor region and a second extension extending from the second region connector toward an outside of the second semiconductor region.

18. The semiconductor device according to claim 17, wherein as viewed in the thickness-wise direction of the semiconductor layer, the second region connector annularly surrounds a portion of the first region connector and includes a gap to avoid contacting the first extension.

19. The semiconductor device according to claim 17, wherein the temperature sensing diode includes multiple diode cells arranged in one direction and connected in series to each other.

20. The semiconductor device according to claim 19, wherein the multiple diode cells include a first diode cell and a second diode cell that are adjacent to each other in an arrangement direction of the multiple diode cells, the first interconnect is connected to the first semiconductor region of the first diode cell, the second interconnect is insulated from the first interconnect, and the second interconnect electrically connects the second semiconductor region of the first diode cell and the first semiconductor region of the second diode cell.

* * * * *